(12) United States Patent
Shibazaki

(10) Patent No.: US 8,264,669 B2
(45) Date of Patent: Sep. 11, 2012

(54) MOVABLE BODY DRIVE METHOD, PATTERN FORMATION METHOD, EXPOSURE METHOD, AND DEVICE MANUFACTURING METHOD FOR MAINTAINING POSITION COORDINATE BEFORE AND AFTER SWITCHING ENCODER HEAD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 543 days.

(21) Appl. No.: 12/179,144

(22) Filed: Jul. 24, 2008

(65) Prior Publication Data

US 2009/0040488 A1 Feb. 12, 2009

Related U.S. Application Data

(60) Provisional application No. 60/935,385, filed on Aug. 9, 2007, provisional application No. 61/006,795, filed on Jan. 31, 2008.

(30) Foreign Application Priority Data

Jul. 24, 2007 (JP) ................................. 2007-192657
Dec. 28, 2007 (JP) ................................. 2007-341385

(51) Int. Cl.
  *G03B 27/58* (2006.01)
(52) U.S. Cl. ........................................................ 355/72
(58) Field of Classification Search .................... 355/72, 355/73–76, 52, 53; 356/616
See application file for complete search history.

(56) References Cited

U.S. PATENT DOCUMENTS

| | | | |
|---|---|---|---|
| 4,465,368 | A | 8/1984 | Matsuura et al. |
| 5,003,342 | A | 3/1991 | Nishi |
| 5,448,332 | A | 9/1995 | Sakakibara et al. |
| 5,610,715 | A | 3/1997 | Yoshii et al. |
| 5,969,441 | A | 10/1999 | Loopstra et al. |

(Continued)

FOREIGN PATENT DOCUMENTS

EP 0 482 553 A2 10/1991

(Continued)

OTHER PUBLICATIONS

Written Opinion issued in corresponding Application No. PCT/JP2008/001974 mailed on Apr. 11, 2008. (with Translation).

(Continued)

*Primary Examiner* — Peter B Kim
*Assistant Examiner* — Chia-how Michael Liu
(74) *Attorney, Agent, or Firm* — Oliff & Berridge, PLC

(57) ABSTRACT

Positional information of a stage within a movement plane is measured, using three encoders which include at least one each of an X encoder and a Y encoder. Based on position measurement values of the stage, the encoder used in position measurement is switched from an encoder (Enc1, Enc2 and Enc3) to an encoder (Enc4, Enc2 and Enc3). On the switching, a coordinate linkage method or a phase linkage method is applied to set an initial value of an encoder (Enc4) which is to be newly used. Accordingly, position measurement values of the stage before and after the switching are stored even though the encoder used in position measurement of the stage is sequentially switched, and the stage can be driven accurately two-dimensionally.

14 Claims, 19 Drawing Sheets

U.S. PATENT DOCUMENTS

| | | | |
|---|---|---|---|
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,819,433 B2 | 11/2004 | Takai et al. | |
| 6,897,963 B1 | 5/2005 | Taniguchi | |
| 6,952,253 B2 | 10/2005 | Lof et al. | |
| 7,023,610 B2 | 4/2006 | Ohtsuki et al. | |
| 2002/0041377 A1 | 4/2002 | Hagiwara et al. | |
| 2002/0061469 A1 | 5/2002 | Tanaka | |
| 2003/0025890 A1 | 2/2003 | Nishinaga | |
| 2005/0248856 A1 | 11/2005 | Omura et al. | |
| 2005/0280791 A1 | 12/2005 | Nagasaka et al. | |
| 2006/0023194 A1* | 2/2006 | Loopstra et al. | 355/72 |
| 2006/0227309 A1 | 10/2006 | Loopstra et al. | |
| 2006/0231206 A1 | 10/2006 | Nagasaka et al. | |
| 2006/0238731 A1 | 10/2006 | Beems et al. | |
| 2007/0051160 A1 | 3/2007 | Pril et al. | |
| 2007/0052976 A1 | 3/2007 | Pril et al. | |
| 2007/0195296 A1 | 8/2007 | Van Der Pasch et al. | |
| 2007/0256471 A1 | 11/2007 | Loopstra et al. | |
| 2007/0263191 A1 | 11/2007 | Shibazaki | |
| 2008/0043212 A1 | 2/2008 | Shibazaki | |
| 2008/0088843 A1 | 4/2008 | Shibazaki | |
| 2008/0094592 A1 | 4/2008 | Shibazaki | |

FOREIGN PATENT DOCUMENTS

| | | |
|---|---|---|
| EP | 1 079 223 A1 | 2/2001 |
| EP | 1 420 298 A2 | 5/2004 |
| EP | 1 582 933 A2 | 10/2005 |
| EP | 1 630 585 A1 | 1/2006 |
| EP | 2 065 920 A1 | 6/2009 |
| JP | A-57-117238 | 7/1982 |
| JP | A 5-129184 | 5/1993 |
| JP | A-6-283403 | 10/1994 |
| JP | A 7-270122 | 10/1995 |
| JP | A-07-270122 | 10/1995 |
| JP | A-10-163099 | 6/1998 |
| JP | A-10-214783 | 8/1998 |
| JP | A-11-016816 | 1/1999 |
| JP | A-2000-505958 | 5/2000 |
| JP | A 2001-242269 | 9/2001 |
| JP | A-2001-313250 | 11/2001 |
| JP | A-2002-014005 | 1/2002 |
| JP | A-2002-151405 | 5/2002 |
| JP | A-2004-519850 | 7/2004 |
| JP | A-2004-289126 | 10/2004 |
| JP | A-2005-308592 | 11/2005 |
| JP | A 2006-54452 | 2/2006 |
| JP | 2007-71874 | 3/2007 |
| JP | A 2007-71874 | 3/2007 |
| JP | A 2007-266581 | 10/2007 |
| WO | WO 99/46835 A1 | 9/1999 |
| WO | WO 99/49504 A1 | 9/1999 |
| WO | WO 99/60361 A1 | 11/1999 |
| WO | WO 01/35168 A1 | 5/2001 |
| WO | WO/03/065428 A1 | 8/2003 |
| WO | WO 03/065428 A1 | 8/2003 |
| WO | WO 2004/019128 A2 | 3/2004 |
| WO | WO 2004/053955 A1 | 6/2004 |
| WO | WO/2004/053955 A1 | 6/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |
| WO | WO 2006/038952 A2 | 4/2006 |
| WO | WO 2008/026742 A1 | 3/2008 |
| WO | WO/2008/026742 A1 | 3/2008 |

OTHER PUBLICATIONS

Jan. 6, 2012 extended European Search Report in European Patent Application No. 08 79 0263.1.

* cited by examiner

MOVABLE BODY DRIVE METHOD, PATTERN FORMATION METHOD, EXPOSURE METHOD, AND DEVICE MANUFACTURING METHOD FOR MAINTAINING POSITION COORDINATE BEFORE AND AFTER SWITCHING ENCODER HEAD

CROSS-REFERENCE TO RELATED APPLICATIONS

This non-provisional application claims the benefit of Provisional Application No. 60/935,385 filed Aug. 9, 2007, and Provisional Application No. 61/006,795 filed Jan. 31, 2008, the disclosures of which are hereby incorporated herein by reference in its entirety.

BACKGROUND OF THE INVENTION

1. Field of the Invention

The present invention relates to movable body drive methods and movable body drive systems, pattern formation methods and apparatuses, exposure methods and apparatuses, and device manufacturing methods, and more particularly, to a movable body drive method and a movable body drive system that drives a movable body along a predetermined plane, a pattern formation method using the movable body drive method and a pattern formation apparatus equipped with the movable body drive system, an exposure method using the movable body drive method, and an exposure apparatus equipped with the movable body drive system, and a device manufacturing method using the pattern formation method.

2. Description of the Background Art

Conventionally, in a lithography process for manufacturing microdevices (electron devices and the like) such as semiconductor devices and liquid crystal display devices, exposure apparatuses such as a reduction projection exposure apparatus by a step-and-repeat method (a so-called stepper), a scanning projection exposure apparatus by a step-and-scan method (a so-called scanning stepper (which is also called a scanner), and the like are relatively frequently used.

In these kinds of exposure apparatuses, in order to transfer a pattern of a reticle (or a mask) on a plurality of shot areas on a substrate such as a wafer or a glass plate (hereinafter, generally referred to as a wafer), a wafer stage holding the wafer is driven in a two-dimensional direction, for example, by linear motors and the like. Position measurement of the wafer stage and the like was generally performed using a laser interferometer whose stability of measurement values was good for over a long time and had a high resolution.

However, requirements for a stage position control with higher precision are increasing due to finer patterns that accompany higher integration of semiconductor devices, and now, short-term variation of measurement values due to temperature fluctuation of the atmosphere on the beam path of the laser interferometer or the influence of temperature gradient has come to occupy a large percentage in the overlay budget.

Meanwhile, as a measurement device besides the laser interferometer used for position measurement of the stage, an encoder can be used, however, because the encoder uses a scale, which lacks in mechanical long-term stability (drift of grating pitch, fixed position drift, thermal expansion and the like), it makes the encoder have a drawback of lacking measurement value linearity and being inferior in long-term stability when compared with the laser interferometer.

In view of the drawbacks of the laser interferometer and the encoder described above, various proposals are being made (refer to Kokai (Japanese Patent Unexamined Application Publication) No. 2002-151405) of a device that measures the position of a stage using both a laser interferometer and an encoder (a position detection sensor which uses a diffraction grating) together.

Further, the measurement resolution of the conventional encoder was inferior when compared with an interferometer, however, recently, an encoder which has a nearly equal or a better measurement resolution than a laser interferometer has appeared (for example, refer to Kokai (Japanese Patent Unexamined Application Publication) No. 2005-308592), and the technology to put the laser interferometer and the encoder described above together is beginning to gather attention.

For example, in the exposure apparatus, in the case of performing position measurement of a wafer stage on which a scale (a grating) has been arranged using an encoder, in order to cover a broad movement range of the wafer stage, it is conceivable that a plurality of heads are placed at a predetermined interval within a two-dimensional plane.

However, in the case of using the plurality of heads having such a placement, it is important to perform the switching of the head used for control without disturbing the smooth operation of the wafer stage.

SUMMARY OF THE INVENTION

According to a first aspect of the present invention, there is provided a first movable body drive method in which a movable body is driven along a predetermined plane including a first axis and a second axis orthogonal to each other, the method comprising: a first process in which a position coordinate of the movable body is obtained, based on measurement values of three encoder heads among a plurality of first encoder heads whose position in a direction parallel to the second axis is different and a plurality of second encoder heads whose position in a direction parallel to the first axis is different, with the three encoder heads respectively facing three gratings selected from a pair of first gratings whose periodic direction is in a direction parallel to the first axis and a pair of second gratings whose periodic direction is in a direction parallel to the second axis that are arranged on a surface parallel to the predetermined plane of the movable body; and a second process in which a measurement value of an encoder head to be newly used is set again so that the position coordinate is maintained before and after the switching of the encoder head.

According to this method, on the switching of the encoder head, the position coordinate of the movable body is maintained before and after the switching.

According to a second aspect of the present invention, there is provided a second movable body drive method in which a movable body is driven along a predetermined plane including a first axis and a second axis orthogonal to each other, the method comprising: a first process in which a position coordinate of the movable body is obtained, based on measurement values of three encoder heads among a plurality of first encoder heads whose position in a direction parallel to the second axis is different and a plurality of second encoder heads whose position in a direction parallel to the first axis is different, with the three encoder heads respectively facing three gratings selected from a pair of first gratings whose periodic direction is in a direction parallel to the first axis and a pair of second gratings whose periodic direction is in a direction parallel to the second axis that are arranged on a surface parallel to the predetermined plane of the movable body; and a second process in which only a measurement value by a measurement unit of an encoder head to be newly used after the switching is to be set again, based on a position coordinate of the movable body.

According to this method, even in the case when the encoder head used in position control (position measurement) of the movable body is switched in succession with the movement of the movable body, errors do not accumulate on each switching.

According to a third aspect of the present invention, there is provided a third movable body drive method in which a movable body is driven along a predetermined plane including a first axis and a second axis orthogonal to each other, the method comprising: a first process in which a position of the movable body within the predetermined plane is controlled, based on measurement values of a set of heads of an encoder including three heads among a plurality of first heads whose position in a direction parallel to the second axis is different and a plurality of second heads whose position in a direction parallel to the first axis is different, with the three heads respectively facing three gratings selected from a pair of first gratings whose periodic direction is in a direction parallel to the first axis and a pair of second gratings whose periodic direction is in a direction parallel to the second axis that are arranged on a surface parallel to the predetermined plane of the movable body; and a second process in which a set of heads used in position control of the movable body is switched to a different set of heads including three heads that have at least one head which is different from the set of heads so that the position of the movable body within the plane becomes successive before and after the switching.

According to this method, the position (including rotation within the predetermined plane) of the movable body is maintained (the position coordinate is stored) before and after the switching of the set of heads.

According to a fourth aspect of the present invention, there is provided a fourth movable body drive method in which a movable body is driven along a predetermined plane including a first axis and a second axis orthogonal to each other, the method comprising: a first process in which a position of the movable body within the predetermined plane is controlled, based on measurement values of a set of heads of an encoder including three heads among a plurality of first heads whose position in a direction parallel to the second axis is different and a plurality of second heads whose position in a direction parallel to the first axis is different, with the three heads respectively facing three gratings selected from a pair of first gratings whose periodic direction is in a direction parallel to the first axis and a pair of second gratings whose periodic direction is in a direction parallel to the second axis that are arranged on a surface parallel to the predetermined plane of the movable body; and a second process in which a set of heads used in position control of the movable body is switched to a different set of heads including three heads that have at least one head which is different from the set of heads, using the offset by the measurement unit computed based on the position of the movable body and the offset equal to or less than the measurement unit set for each head.

According to this method, even in the case when the set of heads used in position control of the movable body is switched in succession with the movement of the movable body, errors do not accumulate on each switching.

According to a fifth aspect of the present invention, there is provided a fifth movable body drive method in which a movable body is driven along a predetermined plane including a first axis and a second axis orthogonal to each other, the method comprising: a first process in which a position of the movable body within the predetermined plane is controlled, based on measurement values of a set of heads of an encoder including three heads among a plurality of first heads whose position in a direction parallel to the second axis is different and a plurality of second heads whose position in a direction parallel to the first axis is different, with the three heads respectively facing three gratings selected from a pair of first gratings whose periodic direction is in a direction parallel to the first axis and a pair of second gratings whose periodic direction is in a direction parallel to the second axis that are arranged on a surface parallel to the predetermined plane of the movable body; a second process in which a set of heads used in position control of the movable body is switched to a different set of heads including three heads that have at least one head which is different from the set of heads so that the position of the movable body within the predetermined plane becomes successive before and after the switching, and also on the switching, a processing in which an offset by the measurement unit of a specific head used only after the switching is decided based on the position of the movable body, and an offset equal to or less than the measurement unit of the specific head is decided so that the position of the movable body is coincident before and after the switching, with the plurality of first heads and/or the plurality of second heads serving as the specific head; and a third process in which until the offset equal to or less than the measurement unit is updated, a set of heads used in position control of the movable body is switched at every timing when switching of the set of heads occurring with the movement of the movable body becomes required to a different set of heads including three heads that have at least one head which is different from the set of heads, using the offset by the measurement unit computed based on the position of the movable body and the offset equal to or less than the measurement unit kept for each head.

According to this method, until the offset by the measurement unit and the offset by the measurement unit is decided so that the position of the movable body is coincident before and after the switching and the offset equal to or less than the measurement unit is updated, the offset by the measurement unit computed based on the position of the movable body and the offset equal to or less than the measurement unit stored for each head are used on the switching of the set of heads. Accordingly, even in the case when the set of heads used in position control of the movable body is switched in succession with the movement of the movable body, errors do not accumulate on each switching, and position control of the movable body with high precision is also possible.

According to a sixth aspect of the present invention, there is provided a pattern formation method, comprising: a process in which an object is mounted on a movable body that can move in a movement plane; and a process in which the movable body is driven by the movable body drive method according to any one of the first to fifth movable body drive methods of the present invention, to form a pattern to the object.

According to this method, by forming a pattern on the object mounted on the movable body which is driven with good accuracy using any one of the first to fifth movable body drive methods of the present invention, it becomes possible to form a pattern on the object with good accuracy.

According to a seventh aspect of the present invention, there is provided a device manufacturing method including a pattern formation process, wherein in the pattern formation process, a pattern is formed on an object using the pattern formation method of the present invention.

According to an eighth aspect of the present invention, there is provided an exposure method in which a pattern is formed on an object by an irradiation of an energy beam wherein for relative movement of the energy beam and the object, a movable body on which the object is mounted is driven, using any one of the first to fifth movable body drive methods of the present invention.

According to this method, for relative movement of the energy beam irradiated on the object and the object, the movable body on which the object is mounted is driven with good precision, using any one of the first to fourth movable body drive methods of the present invention. Accordingly, it becomes possible to form a pattern on the object with good precision by scanning exposure.

According to a ninth aspect of the present invention, there is provided a first movable body drive system in which a movable body is driven along a predetermined plane including a first axis and a second axis orthogonal to each other, the system comprising: a pair of first gratings whose periodic direction is in a direction parallel to the first axis and a pair of second gratings whose periodic direction is in a direction parallel to the second axis that are arranged on a surface parallel to the predetermined plane of the movable body; a first encoder system which has a plurality of first heads whose positions are different in a direction parallel to the second axis and measures positional information of the movable body in a direction parallel to the first axis, based on measurement values of the first heads respectively facing the pair of first gratings; a second encoder system which has a plurality of second heads whose positions are different in a direction parallel to the first axis and measures positional information of the movable body in a direction parallel to the second axis, based on measurement values of the second heads respectively facing the pair of second gratings; and a controller which obtains a position coordinate of the movable body within the predetermined plane based on measurement values of a set of heads including three heads respectively facing three gratings selected from the pair of first gratings and the pair of second gratings, and sets a measurement value again of a head which is to be newly used so that the position coordinate is maintained before and after the switching when switching the head to be used in position measurement of the movable body.

According to this system, on the switching of the encoder head, the position coordinate of the movable body is maintained before and after the switching.

According to a tenth aspect of the present invention, there is provided a second movable body drive system in which a movable body is driven along a predetermined plane including a first axis and a second axis orthogonal to each other, the system comprising: a pair of first gratings whose periodic direction is in a direction parallel to the first axis and a pair of second gratings whose periodic direction is in a direction parallel to the second axis that are arranged on a surface parallel to the predetermined plane of the movable body; a first encoder system which has a plurality of first heads whose positions are different in a direction parallel to the second axis and measures positional information of the movable body in a direction parallel to the first axis, based on measurement values of the first heads respectively facing the pair of first gratings; a second encoder system which has a plurality of second heads whose positions are different in a direction parallel to the first axis and measures positional information of the movable body in a direction parallel to the second axis, based on measurement values of the second heads respectively facing the pair of second gratings; and a controller which obtains a position coordinate of the movable body in the predetermined plane, based on the measurement values of the set of heads including the three heads respectively facing the three gratings selected from the pair of first gratings and the pair of second gratings, and sets only a measurement value by a measurement unit according to a head to be newly used after the switching again, based on the position coordinate when switching the head to be used for position measurement of the movable body.

According to this system, even in the case when the head used in position control (position measurement) of the movable body is switched in succession with the movement of the movable body, errors do not accumulate on each switching.

According to an eleventh aspect of the present invention, there is provided a third movable body drive system in which a movable body is driven along a predetermined plane including a first axis and a second axis orthogonal to each other, the system comprising: a pair of first gratings whose periodic direction is in a direction parallel to the first axis and a pair of second gratings whose periodic direction is in a direction parallel to the second axis that are arranged on a surface parallel to the predetermined plane of the movable body; a first encoder system which has a plurality of first heads whose positions are different in a direction parallel to the second axis and measures positional information of the movable body in a direction parallel to the first axis, based on measurement values of the first heads respectively facing the pair of first gratings; a second encoder system which has a plurality of second heads whose positions are different in a direction parallel to the first axis and measures positional information of the movable body in a direction parallel to the second axis, based on measurement values of the second heads respectively facing the pair of second gratings; and a controller which controls the position of the movable body in the predetermined plane, based on the measurement values of the set of heads including the three heads respectively facing the three gratings selected from the pair of first gratings and the pair of second gratings, and also switches a set of heads used in position control of the movable body to a different set of heads including three heads that have at least one head which is different from the set of heads so that the position of the movable body within the predetermined plane becomes successive before and after the switching.

According to this system, the position (including the position of the rotational direction within the predetermined plane) of the movable body becomes continuous (is maintained) before and after the switching of the set of heads.

According to a twelfth aspect of the present invention, there is provided a fourth movable body drive system in which a movable body is driven along a predetermined plane including a first axis and a second axis orthogonal to each other, the system comprising: a pair of first gratings whose periodic direction is in a direction parallel to the first axis and a pair of second gratings whose periodic direction is in a direction parallel to the second axis that are arranged on a surface parallel to the predetermined plane of the movable body; a first encoder system which has a plurality of first heads whose positions are different in a direction parallel to the second axis and measures positional information of the movable body in a direction parallel to the first axis, based on measurement values of the first heads respectively facing the pair of first gratings; a second encoder system which has a plurality of second heads whose positions are different in a direction parallel to the first axis and measures positional information of the movable body in a direction parallel to the second axis, based on measurement values of the second heads respectively facing the pair of second gratings; and a controller which controls the position of the movable body in the predetermined plane, based on the measurement values of the set of heads including the three heads respectively facing the three gratings selected from the pair of first gratings and the pair of second gratings, and also switches a set of heads used in position control of the movable body to a different set of heads including three heads that have at least one head which is different from the set of heads, using the offset by the measurement unit computed based on the position of the movable body and the offset equal to or less than the measurement unit kept for each head.

According to this system, even in the case when the set of heads used in position control of the movable body is switched in succession with the movement of the movable body, errors do not accumulate on each switching.

According to a thirteenth aspect of the present invention, there is provided a pattern formation apparatus, the apparatus comprising: a movable body on which an object is mounted that can move in a movement plane holding the object; a patterning device which generates a pattern on the object; and a movable body drive system according to any one of the first to fourth movable body drive systems which drives the movable body for pattern formation to the object.

According to this apparatus, by generating a pattern with a patterning device on the object on the movable body driven with good precision by any one of the first to fourth movable body drive systems of the present invention, it becomes possible to form a pattern on the object with good precision.

According to a fourteenth aspect of the present invention, there is provided an exposure apparatus that forms a pattern on an object by an irradiation of an energy beam, the apparatus comprising: a patterning device that irradiates the energy beam on the object; and any one of the first to fourth movable body drive systems according to the present invention, whereby the movable body drive system drives the movable body on which the object is mounted for relative movement of the energy beam and the object.

According to this apparatus, for relative movement of the energy beam irradiated on the object from the patterning device and the object, the movable body on which the object is mounted is driven with good precision by any one of the first to fourth movable body drive systems of the present invention. Accordingly, it becomes possible to form a pattern on the object with good precision by scanning exposure.

BRIEF DESCRIPTION OF THE DRAWINGS

In the accompanying drawings.

DESCRIPTION OF THE EMBODIMENTS

Hereinafter, an embodiment of the present invention will be described, referring to FIGS. 1 to 20.

Figure 1:
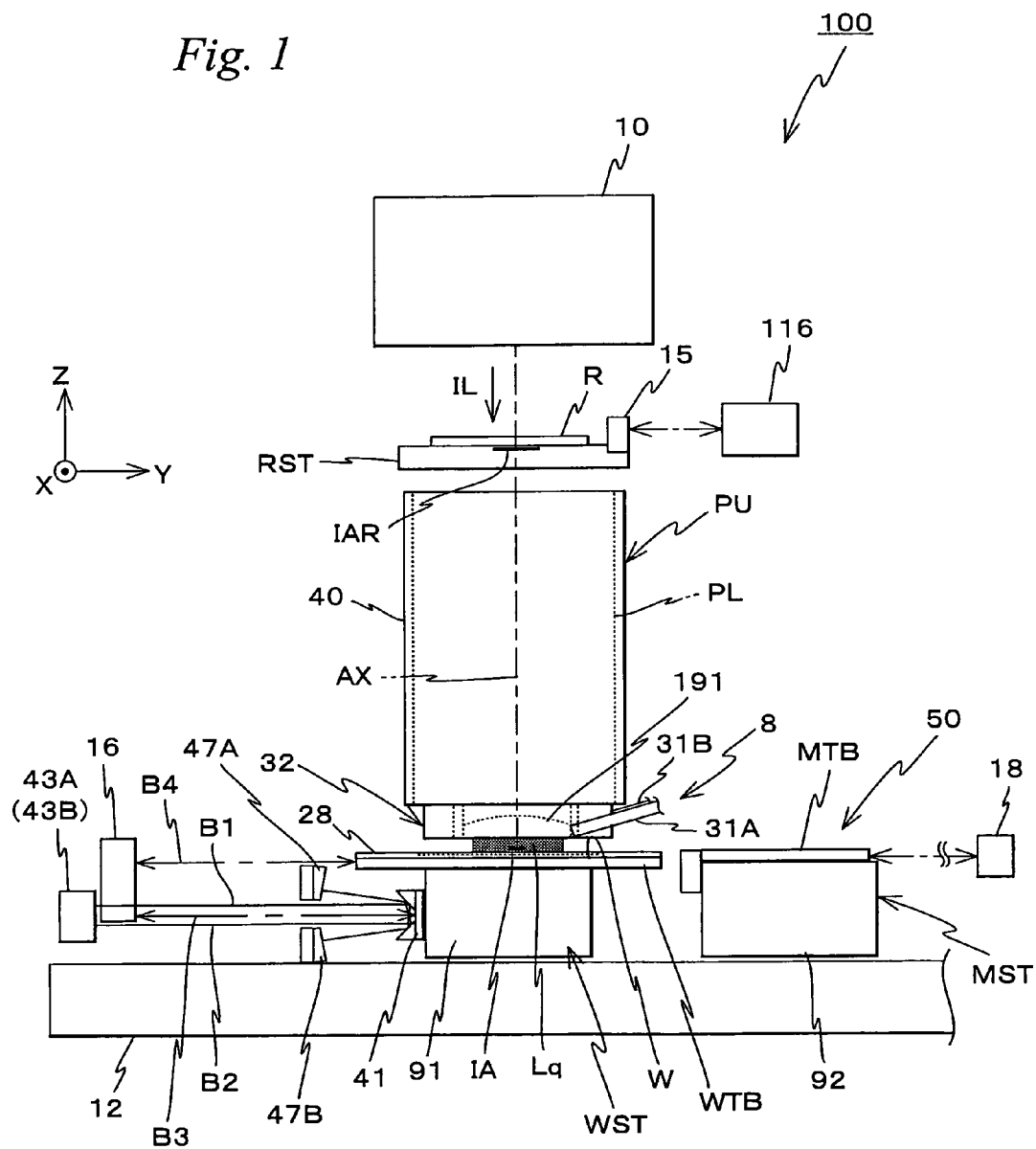
FIG. 1 is a view schematically showing the configuration of an exposure apparatus related to an embodiment.

FIG. 1 shows a schematic configuration of an exposure apparatus 100 in the embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST that holds a reticle R that is illuminated by an illumination light for exposure (hereinafter, referred to as illumination light, or exposure light) IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Illumination system 10 includes a light source, an illuminance uniformity optical system, which includes an optical integrator and the like, and an illumination optical system that has a reticle blind and the like (none of which are shown), as is disclosed in, for example, Kokai (Japanese Patent Unexamined Application Publication) No. 2001-313250 (the corresponding U.S. Patent Application Publication No. 2003/0025890) and the like. Illumination system 10 illuminates a slit-shaped illumination area IAR which is set on reticle R with a reticle blind (a masking system) by illumination light (exposure light) IL with a substantially uniform illuminance. In this case, as illumination light IL, for example, an ArF excimer laser beam (wavelength 193 nm) is used. Further, as the optical integrator, for example, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, for example, by vacuum chucking. Reticle stage RST is finely drivable or movable within an XY plane by a reticle stage drive system 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a designated scanning speed.

The positional information (including rotation information in the θz direction) of reticle stage RST in the XY plane (movement plane) is constantly detected, for example, at a resolution of around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 1, refer to FIG. 6). Main controller 20 computes the position of reticle stage RST in the X-axis direction, Y-axis direction, and the θz direction based on the measurement values of reticle interferometer 116, and also controls the position (and velocity) of reticle stage RST by controlling reticle stage drive system 11 based on the computation results. Incidentally, instead of movable mirror 15, the edge surface of reticle stage RST can be mirror polished so as to form a reflection surface (corresponding to the reflection surface of movable mirror 15). Further, reticle interferometer 116 can measure positional information of reticle stage RST related to at least one of the Z-axis, θx, and θy directions.

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, a reduced image of the circuit pattern (a reduced image of a part of the circuit pattern) within illumination area IAR of reticle R is formed, with illumination light IL that has passed through reticle R which is placed so that its pattern surface substantially coincides with a first plane (an object plane) of projection optical system PL, in an area (hereinafter, also referred to as an exposure area) IA conjugate to illumination area IAR on wafer W (exposure area) whose surface is coated with a resist (a sensitive agent) and is placed on a second plane (an image plane) side, via projection optical system PL (projection unit PU). And by reticle stage RST and wafer stage WST being synchronously driven, the reticle is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W.

Incidentally, although it is not shown, projection unit PU is installed in a barrel platform supported by three struts via a vibration isolation mechanism. However, as well as such a structure, as is disclosed in, for example, the pamphlet of International Publication 2006/038952 and the like, projection unit PU can be supported by suspension with respect to a mainframe member (not shown) placed above projection unit PU or with respect to a base member on which reticle stage RST is placed.

Incidentally, in exposure apparatus 100 of the embodiment, because exposure is performed applying a liquid immersion method, an opening on the reticle side becomes larger with the substantial increase of the numerical aperture NA. Therefore, in order to satisfy Petzval's condition and to avoid an increase in size of the projection optical system, a reflection/refraction system (a catodioptric system) which is configured including a mirror and a lens can be employed as a projection optical system. Further, in wafer W, in addition to a sensitive layer, for example, a protection film (a topcoat film) which protects the wafer or the sensitive layer can also be formed.

Figure 3:
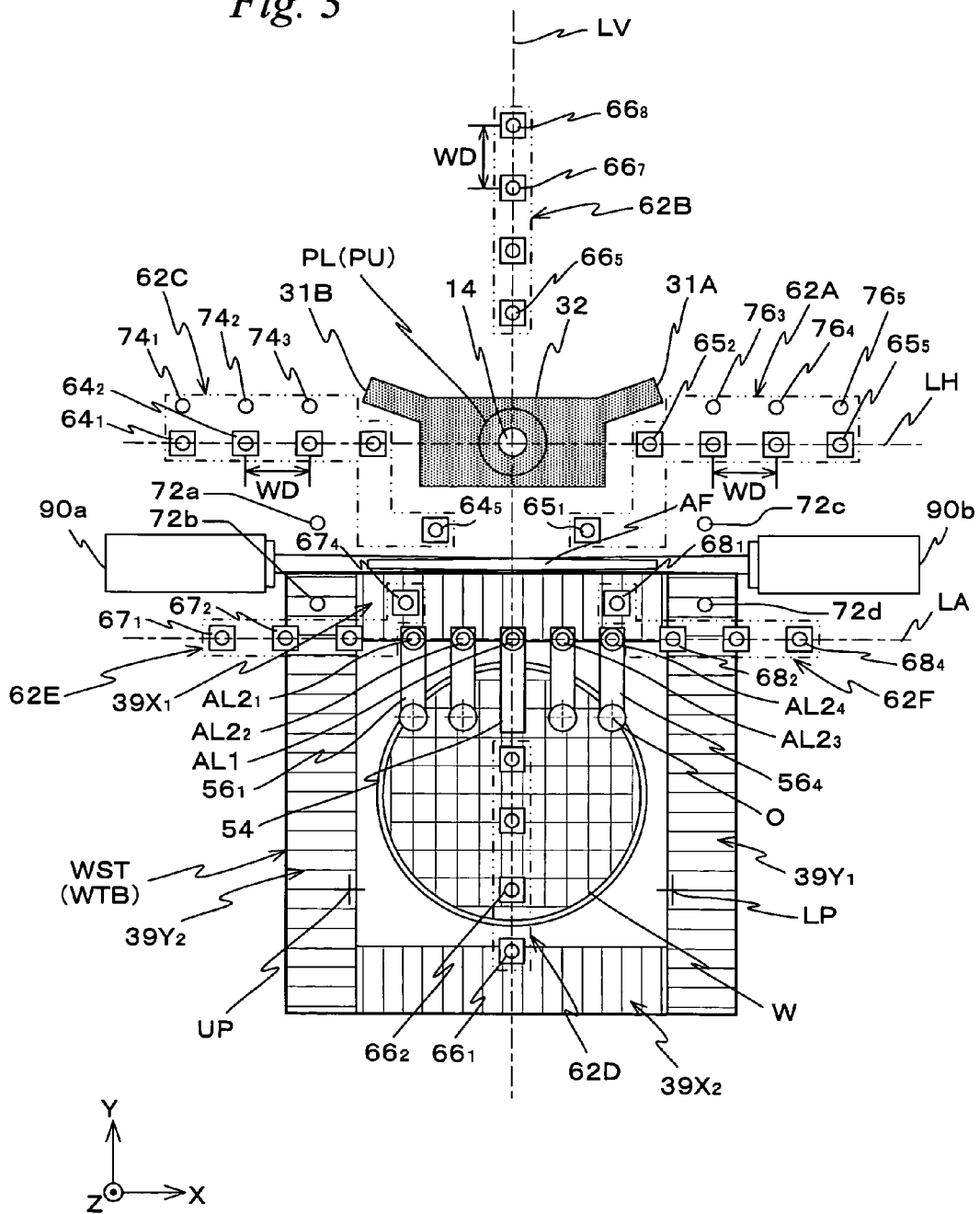
FIG. 3 is planar view showing placement of various measurement devices (an encoder, an alignment system, a multipoint AF system, a Z head) which exposure apparatus of FIG. 1 comprises.

Further, in exposure apparatus 100 of the embodiment, in order to perform exposure applying the liquid immersion method, a nozzle unit 32 that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as shown in FIG. 1, the lower end surface of nozzle unit 32 is set to be on a substantially flush surface with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Liquid supply pipe 31A and liquid recovery pipe 31B are slanted by around 45 degrees relative to the X-axis direction and Y-axis direction in a planar view (when viewed from above) as shown in FIG. 3, and are placed symmetric to a straight line (a reference axis) LV which passes through the center (optical axis AX of projection optical system PL, coinciding with the center of exposure area IA previously described in the embodiment) of projection unit PU and is also parallel to the Y-axis.

Figure 6:
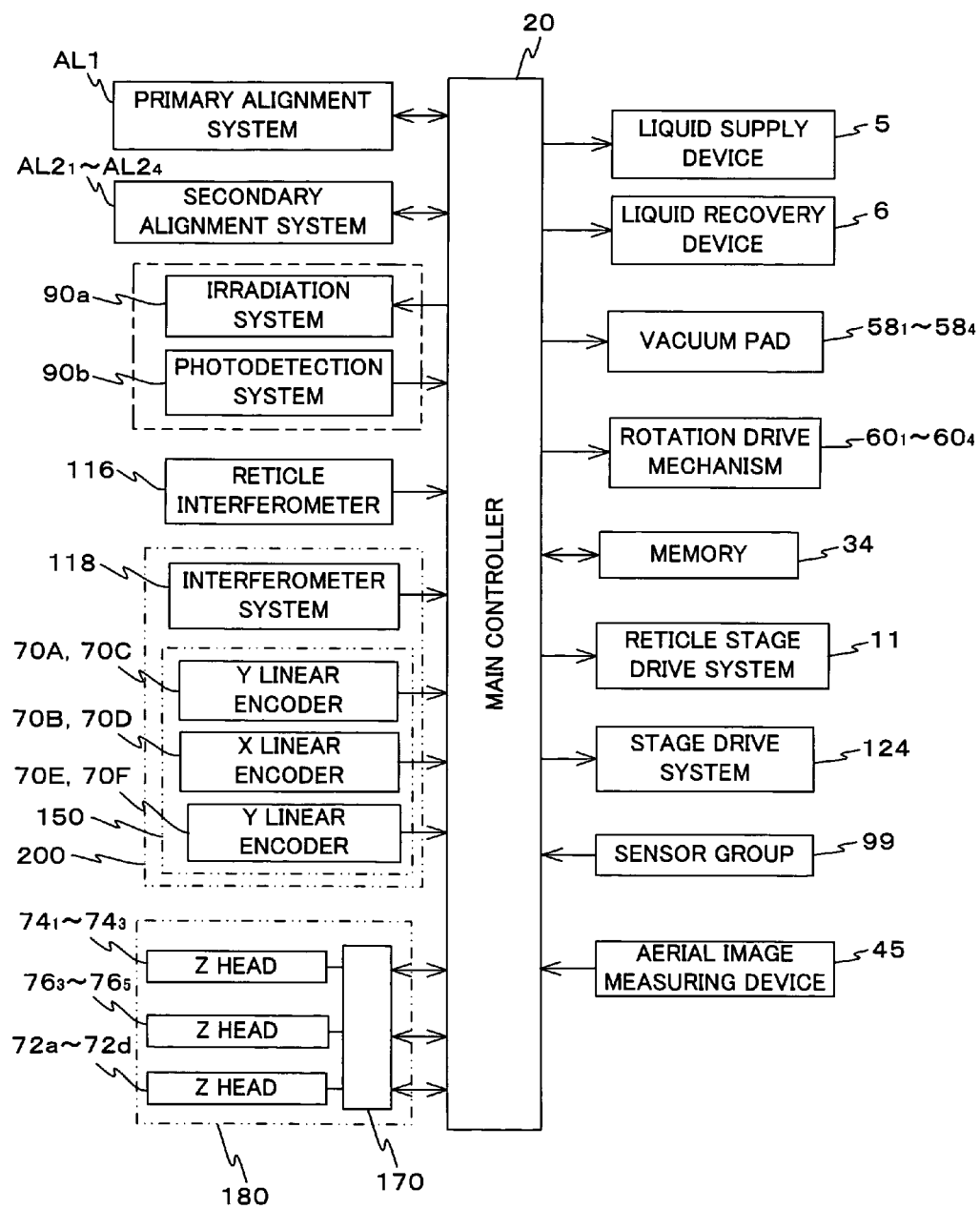
FIG. 6 is a block diagram showing a configuration of a control system of the exposure apparatus related to an embodiment.

One end of a supply pipe (not shown) is connected to liquid supply pipe 31A while the other end of the supply pipe is connected to a liquid supply device 5 (not shown in FIG. 1, refer to FIG. 6), and one end of a recovery pipe (not shown) is connected to liquid recovery pipe 31B while the other end of the recovery pipe is connected to a liquid recovery device 6 (not shown in FIG. 1, refer to FIG. 6).

Liquid supply device 5 includes a tank for supplying liquid, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the tank, for example, to nearly the same temperature as the temperature within the chamber (not shown) where the exposure apparatus is housed. Incidentally, the tank, the compression pump, the temperature controller, the valve, and the like do not all have to be equipped in exposure apparatus 100, and at least part of them can also be substituted by the equipment or the like available in the plant where exposure apparatus 100 is installed.

Liquid recovery device 6 includes a liquid tank for collecting liquid, a suction pump, a valve for controlling recovery/stop of the liquid via liquid recovery pipe 31B, and the like. As the valve, it is desirable to use a flow control valve similar to the valve of liquid supply device 5. Incidentally, the tank, the suction pump, the valve, and the like do not all have to be equipped in exposure apparatus 100, and at least part of them can also be substituted by the equipment or the like available in the plant where exposure apparatus 100 is installed.

In the embodiment, as the liquid described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shortened to around 134 nm.

Liquid supply device 5 and liquid recovery device 6 each have a controller, and the respective controllers are controlled by main controller 20 (refer to FIG. 6). According to instructions from main controller 20, the controller of liquid supply device 5 opens the valve connected to liquid supply pipe 31A to a predetermined degree to supply liquid (water) to the space between tip lens 191 and wafer W via liquid supply pipe 31A, the supply flow channel and the supply opening. Further, when the water is supplied, according to instructions from main controller 20, the controller of liquid recovery device 6 opens the valve connected to liquid recovery pipe 31B to a predetermined degree to recover the liquid (water) from the space between tip lens 191 and wafer W into liquid recovery device 6 (the liquid tank) via the recovery opening, the recovery flow channel and liquid recovery pipe 31B. During the supply and recovery operations, main controller 20 gives commands to the controllers of liquid supply device 5 and liquid recovery device 6 so that the quantity of water supplied to the space between tip lens 191 and wafer W constantly equals the quantity of water recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced.

As is obvious from the above description, in the embodiment, local liquid immersion device 8 is configured including nozzle unit 32, liquid supply device 5, liquid recovery device 6, liquid supply pipe 31A and liquid recovery pipe 31B, and the like. Incidentally, part of local liquid immersion device 8, for example, at least nozzle unit 32 may also be supported in a suspended state by a main frame (including the barrel platform described previously) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, but in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be filled with water in the similar manner to the manner described above.

Incidentally, in the description above, one liquid supply pipe (nozzle) and one liquid recovery pipe (nozzle) were arranged as an example, however, the present invention is not limited to this, and a configuration having multiple nozzles as is disclosed in, for example, the pamphlet of International Publication No. 99/49504, may also be employed, in the case such an arrangement is possible taking into consideration a relation with adjacent members. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. 2004/053955, or the liquid immersion mechanism disclosed in the EP Patent Application Publication No. 1 420 298 can also be applied to the exposure apparatus of the embodiment.

Figure 2:
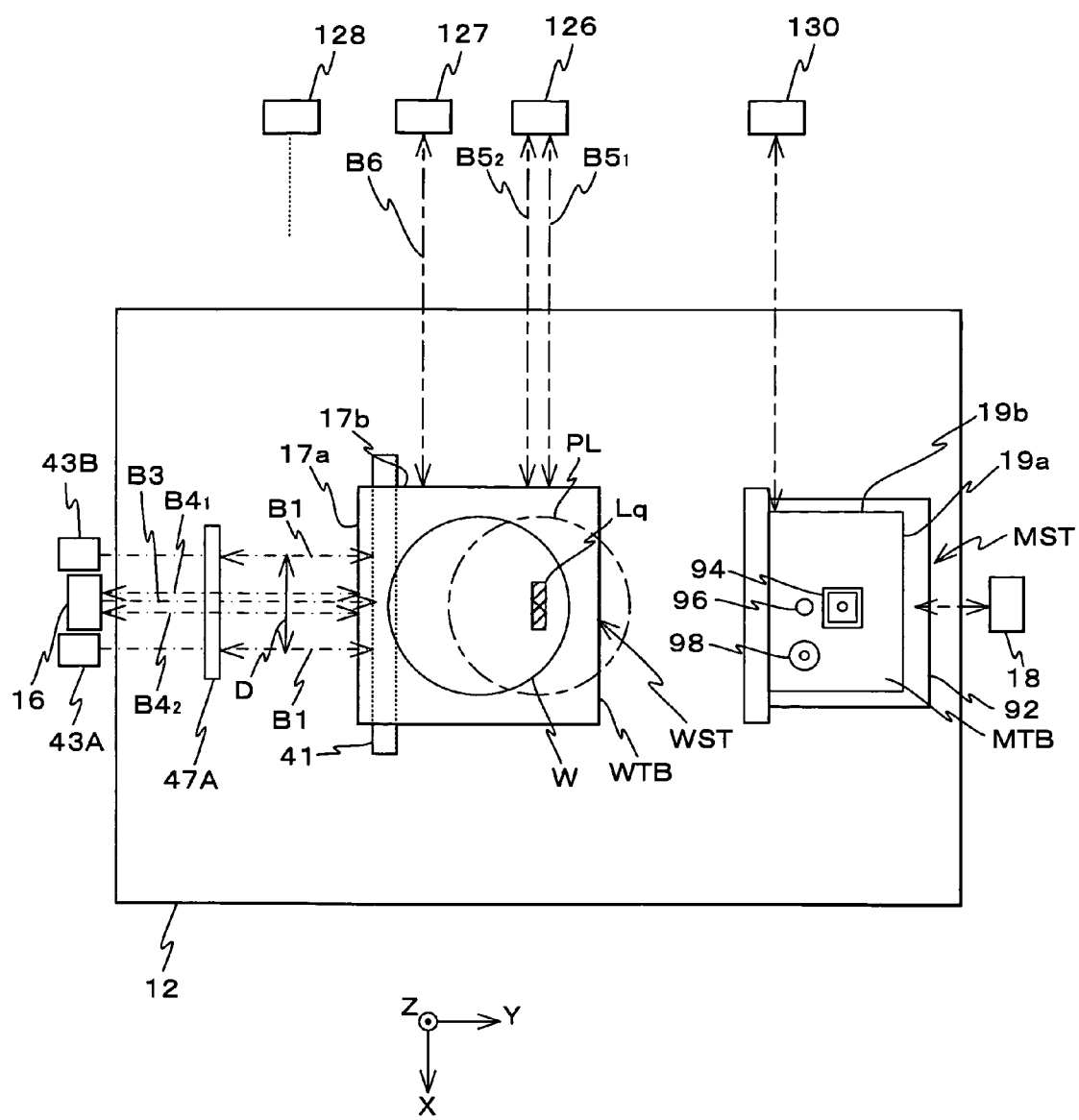
FIG. 2 is a planar view showing a stage device in FIG. 1.

Referring back to FIG. 1, stage device 50 is equipped with wafer stage WST and measurement stage MST placed above a base board 12, a measurement system 200 (refer to FIG. 6) which measures positional information of the stages WST and MST, a stage drive system 124 (refer to FIG. 6) which drives both stages WST and MST and the like. Measurement system 200 includes an interferometer system 118 and an encoder system 150, as shown in FIG. 6. Interferometer system 118 includes a Y interferometer 16, X interferometers 126, 127, and 128, and Z interferometers 43A and 43B for position measurement of wafer stage WST, and a Y interferometer 18 and an X interferometer 130 for position measurement of measurement stage MST, and the like, as shown in FIG. 2. Incidentally, the configuration and the like of the interferometer system will be described in detail later on.

Referring back to FIG. 1, on the bottom surface of each of wafer stage WST and measurement stage MST, a noncontact bearing (not shown), for example, a vacuum preload type hydrostatic air bearing (hereinafter, referred to as an "air pad") is arranged at a plurality of points, and wafer stage WST and measurement stage MST are supported in a noncontact manner via a clearance of around several μm above base board 12, by static pressure of pressurized air that is blown out from the air pad toward the upper surface of base board 12. Further, both stages WST and MST are independently drivable in the Y-axis direction (a horizontal direction of the page surface of FIG. 1) and the X-axis direction (an orthogonal direction to the page surface of FIG. 1), by stage drive system 124 (refer to FIG. 6) which includes a linear motor and the like.

Wafer stage WST includes a stage main section 91 and a wafer table WTB that is mounted on stage main section 91. Wafer table WTB and stage main section 91 are configured drivable in directions of six degrees of freedom (X, Y, Z, θx, θy, and θz) with respect to base board 12 by a drive system including a linear motor and a Z leveling mechanism (e.g., including a voice coil motor and the like).

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has a surface (liquid repellent surface) on a substantially flush surface with the surface of wafer W mounted on the wafer holder to which liquid repellent processing with respect to liquid Lq is performed, has a rectangular outer shape (contour), and also has a circular opening slightly larger than the wafer holder (a mounting area of the wafer) which is formed in the center portion. Plate 28 is made of materials with a low coefficient of thermal expansion, such as glass or ceramics (e.g., such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Further, as shown in a planar view of wafer table WTB (wafer stage WST) in FIG. 4A, plate 28 has a first liquid repellent area 28a whose outer shape (contour) is rectangular enclosing a circular opening, and a second liquid repellent area 28b that has a rectangular frame (annular) shape placed around the first liquid repellent area 28a. On first liquid repellent area 28a, for example, at the time of an exposure operation, at least part of a liquid immersion area 14 (refer to FIG. 8) that is protruded from the surface of the wafer is formed, and on second liquid repellent area 28b, scales for an encoder system (to be described later) are formed. Incidentally, at least part of the surface of plate 28 does not have to be on a flush surface with the surface of the wafer, that is, may have a different height from that of the surface of the wafer. Further, plate 28 may be a single plate, but in the embodiment, plate 28 is configured by combining a plurality of plates, for example, the first and second liquid repellent plates that correspond to the first liquid repellent area 28a and the second liquid repellent area 28b respectively. In the embodiment, water is used as liquid Lq as is described above, and therefore, hereinafter the first liquid repellent area 28a and the second liquid repellent area 28b are also referred to as a first water repellent plate 28a and a second water repellent plate 28b.

In this case, exposure light IL is irradiated to the first water repellent plate 28a on the inner side, while exposure light IL is hardly irradiated to the second water repellent plate 28b on the outer side. Taking this fact into consideration, in the embodiment, a first liquid repellent area to which water repellent coat having sufficient resistance to exposure light IL (light in a vacuum ultraviolet region, in this case) is applied is formed on the surface of the first water repellent plate 28a, and a second liquid repellent area to which water repellent coat having resistance to exposure light IL inferior to the first liquid repellent area is applied is formed on the surface of the second water repellent plate 28b. In general, since it is difficult to apply water repellent coat having sufficient resistance to exposure light IL (in this case, light in a vacuum ultraviolet region) to a glass plate, it is effective to separate the water repellent plate into two sections, the first water repellent plate 28a and the second water repellent plate 28b which is the periphery of the first water repellent plate, in the manner described above. Incidentally, the present invention is not limited to this, and two types of water repellent coat that have different resistance to exposure light IL may also be applied on the upper surface of the same plate in order to form the first liquid repellent area and the second liquid repellent area. Further, the same kind of water repellent coat may be applied to the first and second liquid repellent areas. For example, only one liquid repellent area may also be formed on the same plate.

Figure 4A:
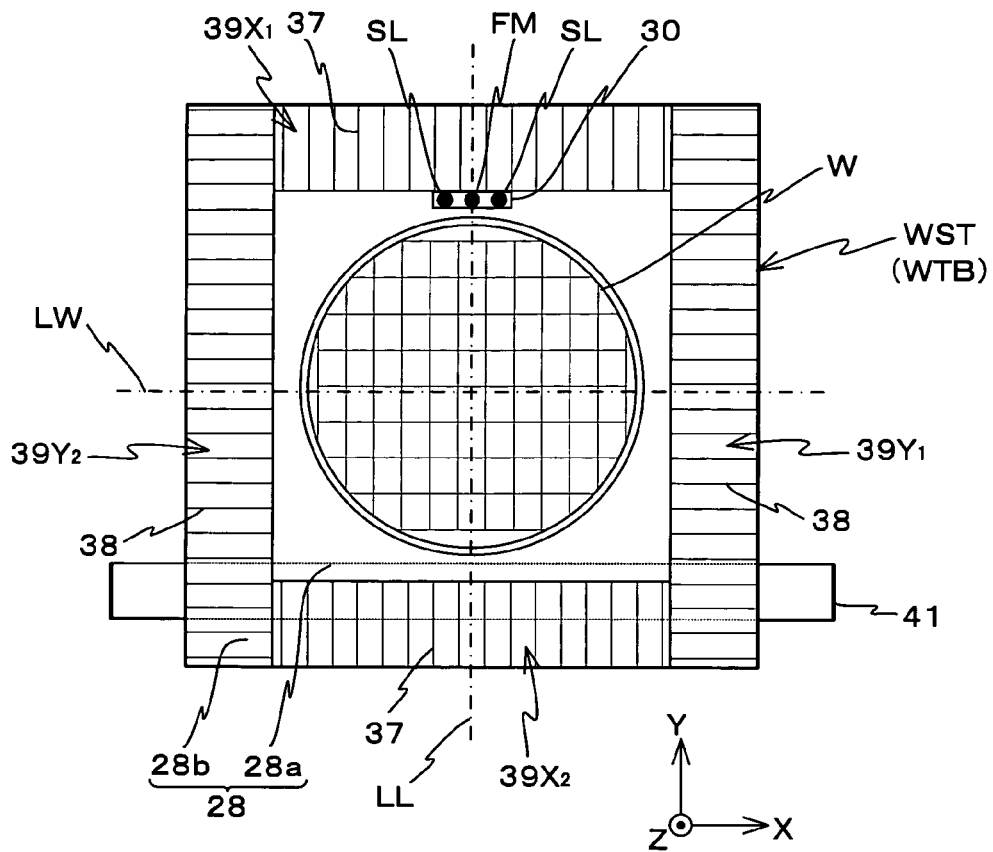
FIG. 4A is a planar view showing a wafer stage.

Further, as is obvious from FIG. 4A, at the end portion on the +Y side of the first water repellent plate 28a, a rectangular cutout is formed in the center portion in the X-axis direction, and a measurement plate 30 is embedded inside the rectangular space (inside the cutout) that is enclosed by the cutout and the second water repellent plate 28b. A fiducial mark FM is formed in the center in the longitudinal direction of measurement plate 30 (on a centerline LL of wafer table WTB), and a pair of aerial image measurement slit patterns (slit-shaped measurement patterns) SL are formed in the symmetrical placement with respect to the center of fiducial mark FM on one side and the other side in the X-axis direction of fiducial mark FM. As each of aerial image measurement slit patterns SL, an L-shaped slit pattern having sides along the Y-axis direction and X-axis direction, or two linear slit patterns extending in the X-axis and Y-axis directions respectively can be used, as an example.

Figure 4B:
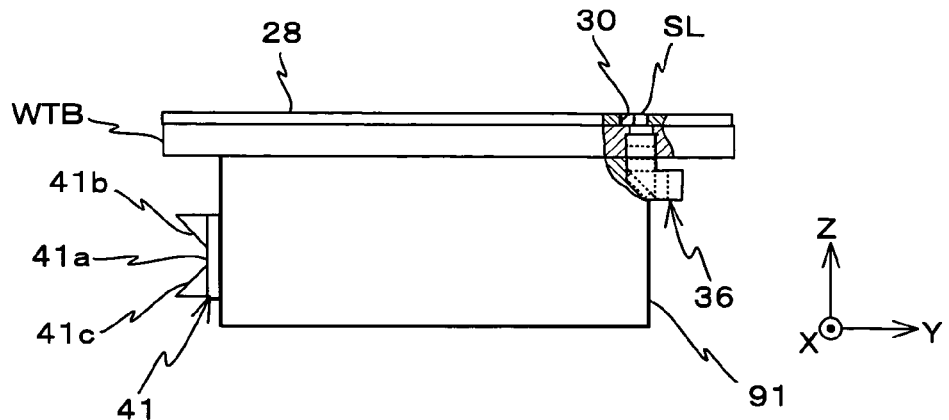
FIG. 4B is a schematic side view of a partially sectioned wafer stage WST.

Further, as is shown in FIG. 4B, inside wafer stage WST below each of aerial image measurement slit patterns SL, an L-shaped housing 36 in which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of the second water repellent plate 28b, multiple grid lines are directly formed in a predetermined pitch along each of four sides. More specifically, in areas on one side and the other side in the X-axis direction of second water repellent plate 28b (both sides in the horizontal direction in FIG. 4A), Y scales $39Y_1$ and $39Y_2$ are formed respectively, and Y scales $39Y_1$ and $39Y_2$ are each composed of a reflective grating (for example, a diffraction grating) having a periodic direction in the Y-axis direction in which grid lines 38 having the longitudinal direction in the X-axis direction are formed in a predetermined pitch along a direction parallel to the Y-axis (the Y-axis direction).

Similarly, in areas on one side and the other side in the Y-axis direction of second water repellent plate 28b (both sides in the vertical direction in FIG. 4A), X scales $39X_1$ and $39X_2$ are formed respectively in a state where the scales are placed between Y scales $39Y_1$ and $39Y_2$, and X scales $39X_1$ and $39X_2$ are each composed of a reflective grating (for example, a diffraction grating) having a periodic direction in the X-axis direction in which grid lines 37 having the longitudinal direction in the Y-axis direction are formed in a predetermined pitch along a direction parallel to the X-axis (the X-axis direction). As each of the scales, the scale made up of a reflective diffraction grating RG (refer to FIG. 7A) that is created by, for example, hologram or the like on the surface of the second water repellent plate 28b is used. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since the second water repellent plate 28b itself constitutes the scales, a glass plate with a low coefficient of thermal expansion is to be used as the second water repellent plate 28b. However, the present invention is not limited to this, and a scale member made up of a glass plate or the like with a low coefficient of thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Incidentally, in order to protect the diffraction grating, it is also effective to cover the grating with a glass plate with a low coefficient of thermal expansion that has water repellency (liquid repellency). In this case, as the glass plate, a plate whose thickness is the same level as the wafer, such as for example, a plate 1 mm thick, can be used, and the plate is set on the upper surface of wafer table WST so that the surface of the glass plate becomes the same height (a flush surface) as the wafer surface.

Incidentally, a layout pattern is arranged for deciding the relative position between an encoder head and a scale near the edge of each scale (to be described later). The layout pattern is configured, for example, from grid lines that have different reflectivity, and when the encoder head scans the layout pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

Measurement stage MST includes stage main section 92, and measurement table MTB mounted on stage main section 92. Measurement stage MST is configured drivable in directions of six degrees of freedom (X, Y, Z, θx, θy, and θz) with respect to base board 12 by a drive system (not shown), similar to wafer stage WST. However, the present invention is not limited to this, and for example, measurement stage MST can employ the so-called coarse and fine movement structure in which measurement table MTB can be finely driven in the X-axis direction, the Y-axis direction, and the θz direction with respect to stage main section 92, or measurement table MTB can be configured drivable in directions of three degrees of freedom, which are Z, θx, and θy, on stage main section 92.

Incidentally, the drive system of wafer stage WST and the drive system of measurement stage MST are included in FIG. 6, and are shown as stage drive system 124.

Figure 5A:
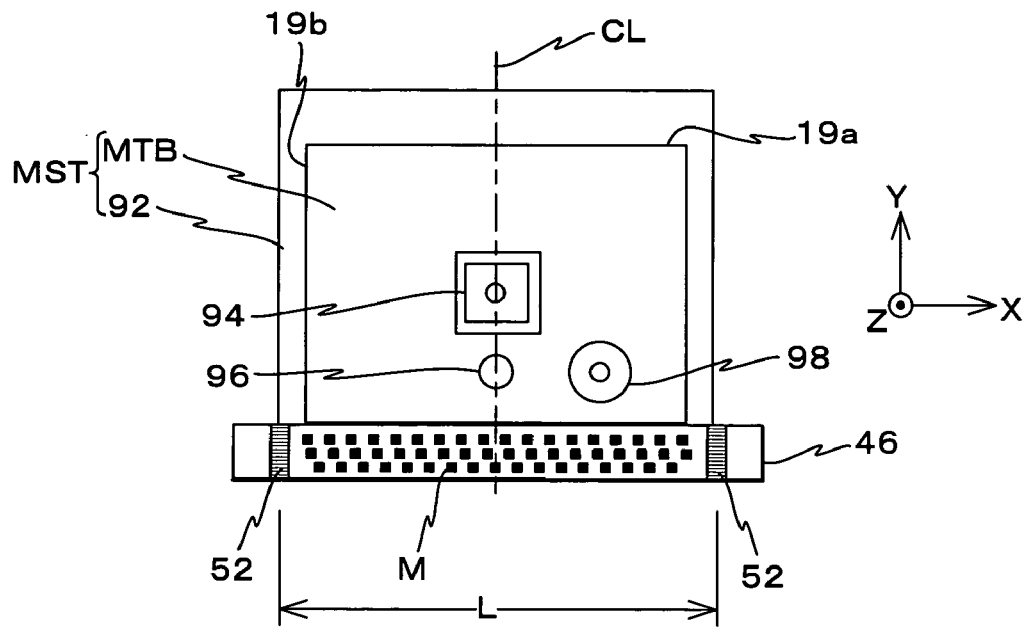
FIG. 5A is a planar view showing a measurement stage.

Various measurement members are arranged at measurement table MTB (and stage main section 92). As such measurement members, for example, as shown in FIGS. 2 and 5A, members such as an uneven illuminance measuring sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, the pamphlet of International Publication No. 03/065428 and the like are employed. As wavefront aberration measuring instrument 98, the one disclosed in, for example, the pamphlet of International Publication No. 99/60361 (the corresponding EP Patent Application No. 1 079 223) can also be used.

As uneven illuminance measuring sensor 94, the configuration similar to the one that is disclosed in, for example, Kokai (Japanese Unexamined Patent Application Publication) No. 57-117238 (the corresponding U.S. Pat. No. 4,465, 368) and the like can be used. Further, as aerial image measuring instrument 96, the configuration similar to the one that is disclosed in, for example, Kokai (Japanese Unexamined Patent Application Publication) No. 2002-014005 (the corresponding U.S. Patent Application Publication No. 2002/0041377) and the like can be used. Incidentally, in the embodiment, three measurement members (94, 96 and 98) were to be arranged at measurement stage MST, however, the type of the measurement member and/or the number is not limited to them. As the measurement members, for example, measurement members such as a transmittance measuring instrument that measures a transmittance of projection optical system PL, and/or a measuring instrument that observes local liquid immersion device 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as can be seen from FIG. 5A, the sensors that are frequently used such as uneven illuminance measuring sensor 94 and aerial image measuring instrument 96 are placed on a centerline CL (Y-axis passing through the center) of measurement stage MST. Therefore, in the embodiment, measurement using these sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly uneven illuminance measuring sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor such as the optical system may be mounted on measurement table MTB (and stage main section 92), or the entire sensor may be placed on measurement table MTB (and stage main section 92).

Figure 5B:
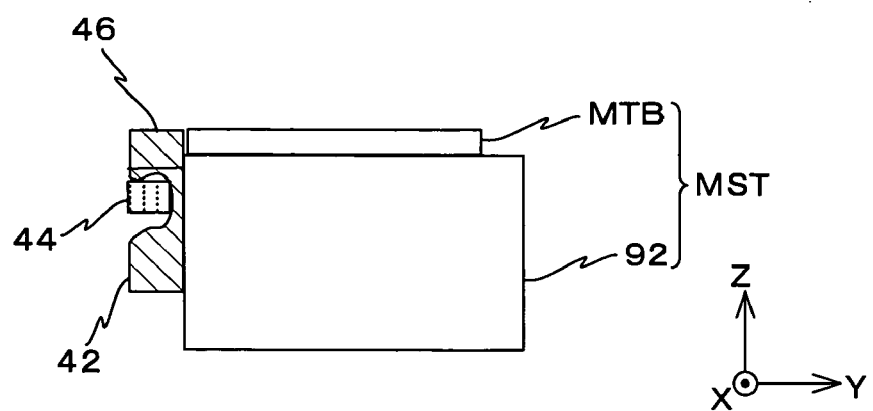
FIG. 5B is a schematic side view showing a partial cross section of the measurement stage.

As shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light receiving element such as a photomultiplier tube, and a housing that houses them. As is obvious from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element of each photodetection system 44. That is, measurement plate 30, light-transmitting systems 36 and photodetection systems 44 constitute an aerial image measuring device 45 (refer to FIG. 6), which is similar to the one disclosed in Kokai (Japanese Unexamined Patent Application Publication) No. 2002-014005 (the corresponding U.S. Patent Application Publication No. 2002/0041377) referred to previously, and the like.

On attachment member 42, a fiducial bar (hereinafter, shortly referred to as an "FD bar") which is made up of a bar-shaped member having a rectangular sectional shape is arranged extending in the X-axis direction. FD bar 46 is kinematically supported on measurement stage MST by a full-kinematic mount structure.

Since FD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of FD bar 46 is set high to be around the same level as a so-called datum plane plate. Further, as shown in FIG. 5A, a reference grating (for example, a diffraction grating) 52 whose periodic direction is in the Y-axis direction is respectively formed in the vicinity of the end portions on one side and the other side in the longitudinal direction of FD bar 46. The pair of reference gratings 52 is formed placed apart from each other at a predetermined distance L, symmetric to the center in the X-axis direction of FD bar 46, or more specifically, formed in a symmetric placement to centerline CL previously described.

Further, on the upper surface of FD bar 46, a plurality of reference marks M are formed in a placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark of wafer W. Incidentally, in the embodiment, the surface of FD bar 46 and the surface of measurement table MTB (which may include the measurement members described above) are also covered with a liquid repellent film (water repellent film) severally.

In exposure apparatus 100 of the embodiment, although it is omitted in FIG. 1 from the viewpoint of avoiding intricacy of the drawing, as shown in FIG. 3, a primary alignment system AL1 having a detection center at a position spaced apart from optical axis AX of the projection optical system at a predetermined distance on the −Y side is actually placed on reference axis LV. Primary alignment system AL1 is fixed to the lower surface of a main frame (not shown) via a support member 54. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are severally arranged. That is, five alignment systems $AL_1$ and $AL2_1$ to $AL2_4$ are placed so that their detection centers are placed at different positions in the X-axis direction, that is, placed along the X-axis direction.

As is representatively shown by secondary alignment system $AL2_4$, each secondary alignment system $AL2_n$ (n=1 to 4) is fixed to a tip (turning end) of an arm $56_n$ (n=1 to 4) that can turn around a rotation center O as the center in a predetermined angle range in clockwise and anticlockwise directions in FIG. 3. In the embodiment, a part of each secondary alignment system $AL2_n$ (e.g. including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment systems $AL2_1$ to $AL2_4$ are severally adjusted by rotating around rotation center O as the center. In other words, the detection areas (or the detection centers) of secondary alignment systems $AL2_1$ to $AL2_4$ are independently movable in the X-axis direction. Accordingly, the relative positions of the detection areas of primary alignment system AL1 and secondary alignment systems $AL2_1$ to $AL2_4$ are adjustable in the X-axis direction. Incidentally, in the embodiment, the X-positions of secondary alignment systems $AL2_1$ to $AL2_4$ are to be adjusted by the rotation of the arms. However, the present invention is not limited to this, and a drive mechanism that drives secondary alignment systems $AL2_1$ to $AL2_4$ back and forth in the X-axis direction may also be arranged. Further, at least one of secondary alignment systems $AL2_1$ to $AL2_4$ can be moved not only in the X-axis direction but also in the Y-axis direction. Incidentally, since part of each secondary alignment system $AL2_n$ is moved by arm $56_n$, positional information of the part that is fixed to arm $56_n$ is measurable by a sensor (not shown) such as, for example, an interferometer or an encoder. The sensor may only measure positional information in the X-axis direction of secondary alignment system $AL2_n$, or may be capable of measuring positional information in another direction, for example, the Y-axis direction and/or the rotational direction (including at least one of the θx and θy directions).

On the upper surface of each arm $56_n$, a vacuum pad $58_n$ (n=1 to 4, not shown in FIG. 3, refer to FIG. 6) that is composed of a differential evacuation type air bearing is arranged. Further, arm $56_n$ can be turned by a rotation drive mechanism $60_n$ (n=1 to 4, not shown in FIG. 3, refer to FIG. 6) that includes, for example, a motor or the like, in response to instructions of main controller 20. Main controller 20 activates each vacuum pad $58_n$ to fix each arm $56_n$ to a main frame (not shown) by suction after rotation adjustment of arm $56_n$. Thus, the state of each arm $56_n$ after rotation angle adjustment, that is, a desired positional relation between primary alignment system AL1 and four secondary alignment systems $AL2_1$ to $AL2_4$ is maintained.

Incidentally, in the case a portion of the main frame facing arm $56_n$ is a magnetic body, an electromagnet may also be employed instead of vacuum pad 58.

In the embodiment, as each of primary alignment system AL1 and four secondary alignment systems $AL2_1$ to $AL2_4$, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 6, via an alignment signal processing system (not shown).

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, in the embodiment, five alignment systems AL1 and $AL2_1$ to $AL2_4$ are to be fixed to the lower surface of the main frame that holds projection unit PU, via support member 54 or arm $56_n$. However, the present invention is not limited to this, and for example, the five alignment systems may also be arranged on the measurement frame described earlier.

Next, a configuration and the like of interferometer system 118 which measures the positional information of wafer stage WST and measurement stage MST will be described.

To the −Y edge surface and the −X edge surface of wafer table WTB, mirror-polishing is applied, respectively, and a reflection surface 17a and a reflection surface 17b shown in FIG. 2 are formed. By severally projecting a measurement beam to reflection surface 17a and reflection surface 17b and receiving a reflected light of each beam, Y interferometer 16 and X interferometers 126, 127, and 128 (X interferometers 126 to 128 are not shown in FIG. 1, refer to FIG. 2) constituting a part of interferometer system 118 (refer to FIG. 6) measure a displacement of each reflection surface from a datum position (for example, a fixed mirror is placed on the side surface of projection unit PU, and the surface is used as a reference surface), that is, positional information of wafer stage WST within the XY plane, and the measured positional information is supplied to main controller 20. In the embodiment, as it will be described later on, as each interferometer a multiaxial interferometer that has a plurality of measurement axes is used with an exception for a part of the interferometers.

Meanwhile, to the side surface on the −Y side of stage main section 91, a movable mirror 41 having the longitudinal direction in the X-axis direction is attached via a kinematic support mechanism (not shown), as shown in FIGS. 4A and 4B. Movable mirror 41 is made of a member which is like a rectangular solid member integrated with a pair of triangular prisms adhered to a surface (the surface on the −Y side) of the rectangular solid member. As it can be seen from FIG. 2, movable mirror 41 is designed so that the length in the X-axis direction is longer than reflection surface 17a of wafer table WTB by at least the spacing between the two Z interferometers which will be described later.

To the surface on the −Y side of movable mirror 41, mirror-polishing is applied, and three reflection surfaces 41b, 41a, and 41c are formed, as shown in FIG. 4B. Reflection surface 41a configures a part of the edge surface on the −Y side of movable mirror 41, and reflection surface 41a is parallel with the XZ plane and also extends in the X-axis direction. Reflection surface 41b configures a surface adjacent to reflection surface 41a on the +Z side, forming an obtuse angle to reflection surface 41a, and spreading in the X-axis direction. Reflection surface 41c configures a surface adjacent to the −Z side of reflection surface 41a, and is arranged symmetrically with reflection surface 41b, with reflection surface 41b in between.

A pair of Z interferometers 43A and 43B (refer to FIGS. 1 and 2) that configures a part of interferometer system 118 (refer to FIG. 6) and irradiates measurement beams on movable mirror 41 is arranged facing movable mirror 41.

As it can be seen when viewing FIGS. 1 and 2 together, Z interferometers 43A and 43B are placed apart on one side and the other side of Y interferometer 16 in the X-axis direction at a substantially equal distance and at positions slightly lower than Y interferometer 16, respectively.

From each of the Z interferometers 43A and 43B, as shown in FIG. 1, measurement beam B1 along the Y-axis direction is projected toward reflection surface 41b, and measurement beam B2 along the Y-axis direction is projected toward reflection surface 41c (refer to FIG. 4B). In the embodiment, fixed mirror 47B having a reflection surface orthogonal to measurement beam B1 sequentially reflected off reflection surface 41b and reflection surface 41c and a fixed mirror 47A having a reflection surface orthogonal to measurement beam B2 sequentially reflected off reflection surface 41c and reflection surface 41b are arranged, each extending in the X-axis direction at a position distanced apart from movable mirror 41 in the −Y direction by a predetermined distance in a state where the fixed mirrors do not interfere with measurement beams B1 and B2.

Fixed mirrors 47A and 47B are supported, for example, by the same support body (not shown) arranged in the frame (not shown) which supports projection unit PU.

Figure 8:
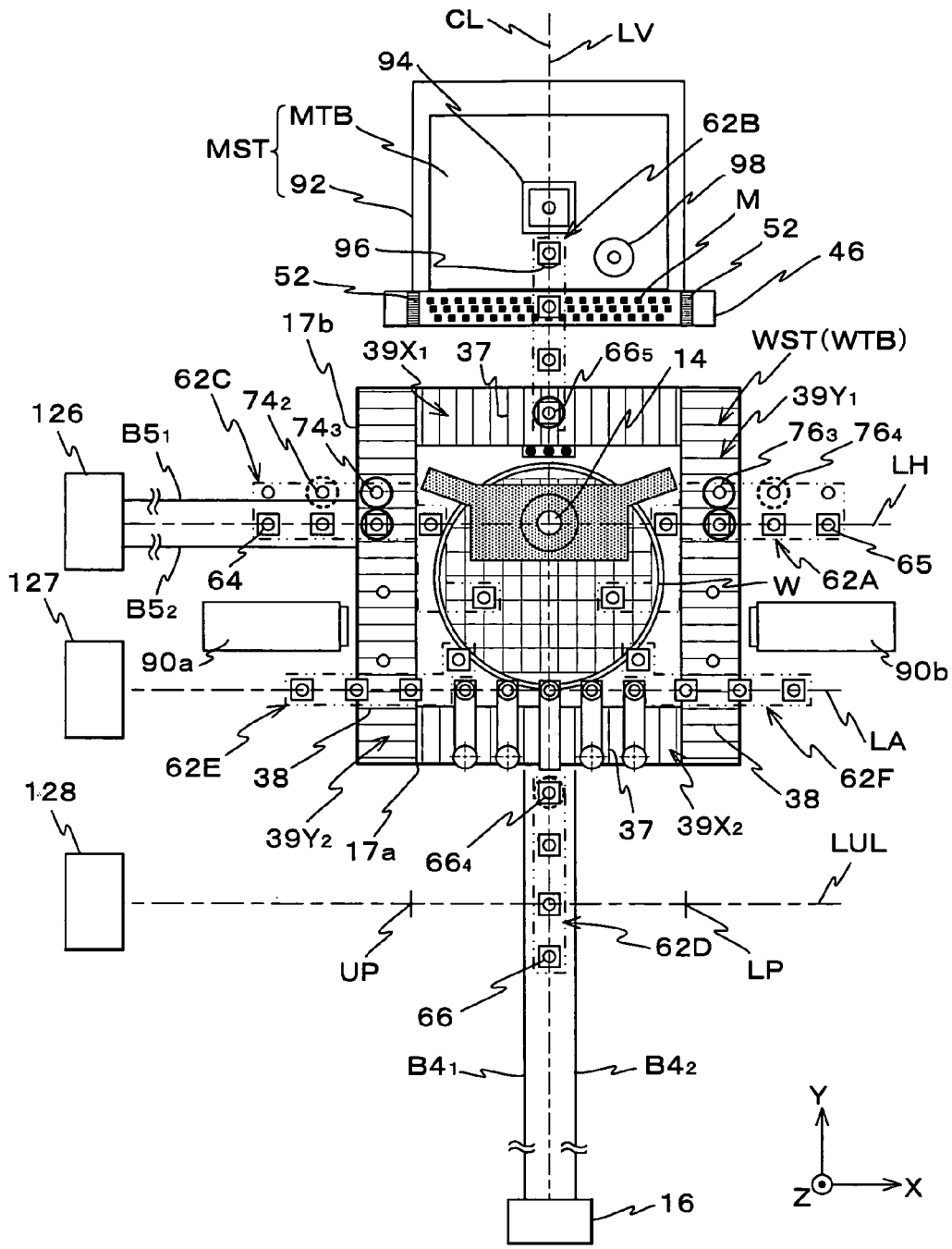
FIG. 8 is a view showing a state of the wafer stage and the measurement stage when exposure to a wafer is performed by a step-and-scan method.

Y interferometer 16, as shown in FIG. 8 (and FIG. 2), projects measurement beams $B4_1$ and $B4_2$ on reflection surface 17a of wafer table WTB along a measurement axis in the Y-axis direction spaced apart by an equal distance to the −X side and the +X side from reference axis LV previously described, and by receiving each reflected light, detects the position of wafer table WTB in the Y-axis direction (a Y position) at the irradiation point of measurement beams $B4_1$ and $B4_2$. Incidentally, in FIG. 1, measurement beams $B4_1$ and $B4_2$ are representatively shown as measurement beam B4.

Further, Y interferometer 16 projects a measurement beam B3 toward reflection surface 41a along measurement axes in the Y-axis direction with a predetermined distance in the Z-axis direction spaced between measurement beams $B4_1$ and $B4_2$, and by receiving measurement beam B3 reflected off reflection surface 41a, detects the Y position of reflection surface 41a (more specifically wafer stage WST) of movable mirror 41.

Main controller 20 computes the Y position (or to be more precise, displacement ΔY in the Y-axis direction) of reflection surface 17a, or more specifically, wafer table WTB (wafer stage WST), based on an average value of the measurement values of the measurement axes corresponding to measurement beams $B4_1$ and $B4_2$ of Y interferometer 16. Further, main controller 20 computes displacement (yawing amount) $\Delta\theta z^{(Y)}$ in the rotational direction around the Z-axis (the $\theta z$ direction) of wafer table WTB, based on a difference of the measurement values of the measurement axes corresponding to measurement beams $B4_1$ and $B4_2$. Further, main controller 20 computes displacement (pitching amount) $\Delta\theta x$ in the $\theta x$ direction of wafer stage WST, based on the Y position (displacement $\Delta Y$ in the Y-axis direction) of reflection surface 17a and reflection surface 41a.

Further, as shown in FIGS. 8 and 2, X interferometer 126 projects measurement beams $B5_1$ and $B5_2$ on wafer table WTB along the dual measurement axes spaced apart from a straight line (a reference axis) LH in the X-axis direction that passes the optical axis of projection optical system PL by the same distance. And, based on the measurement values of the measurement axes corresponding to measurement beams $B5_1$ and $B5_2$, main controller 20 computes a position in the X-axis direction (an X position, or to be more precise, displacement $\Delta X$ in the X-axis direction) of wafer table WTB. Further, main controller 20 computes displacement (yawing amount) $\Delta\theta z^{(X)}$ of wafer table WTB in the $\theta z$ direction from a difference of the measurement values of the measurement axes corresponding to measurement beams $B5_1$ and $B5_2$. Incidentally, $\Delta\theta z^{(X)}$ obtained from X interferometer 126 and $\Delta\theta z^{(Y)}$ obtained from Y interferometer 16 are equal to each other, and represents displacement (yawing amount) $\Delta\theta z$ of wafer table WTB in the $\theta z$ direction.

Figure 9:
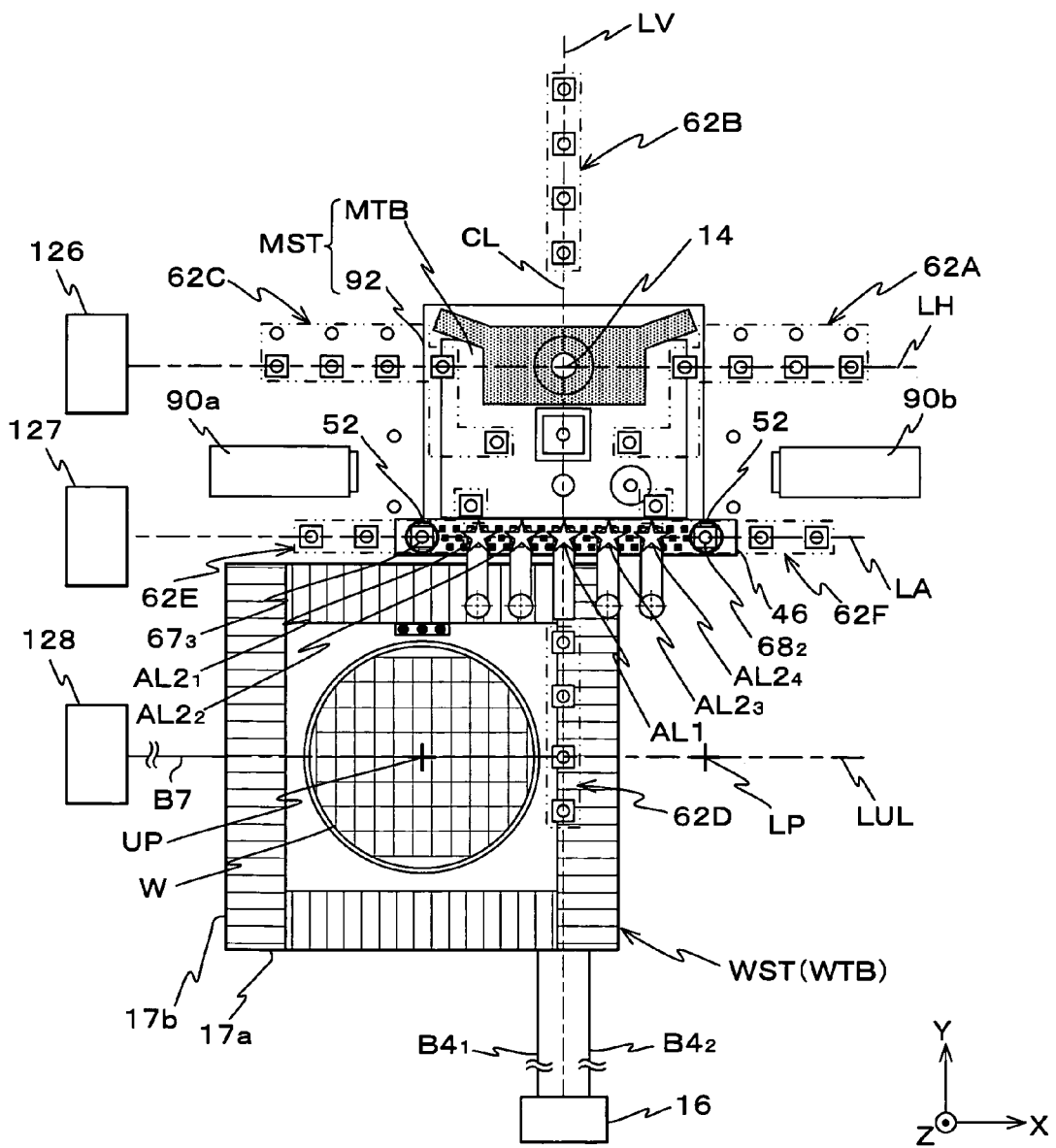
FIG. 9 is a view showing a state of the wafer stage and the measurement stage at the time of unloading of the wafer.
Figure 10:
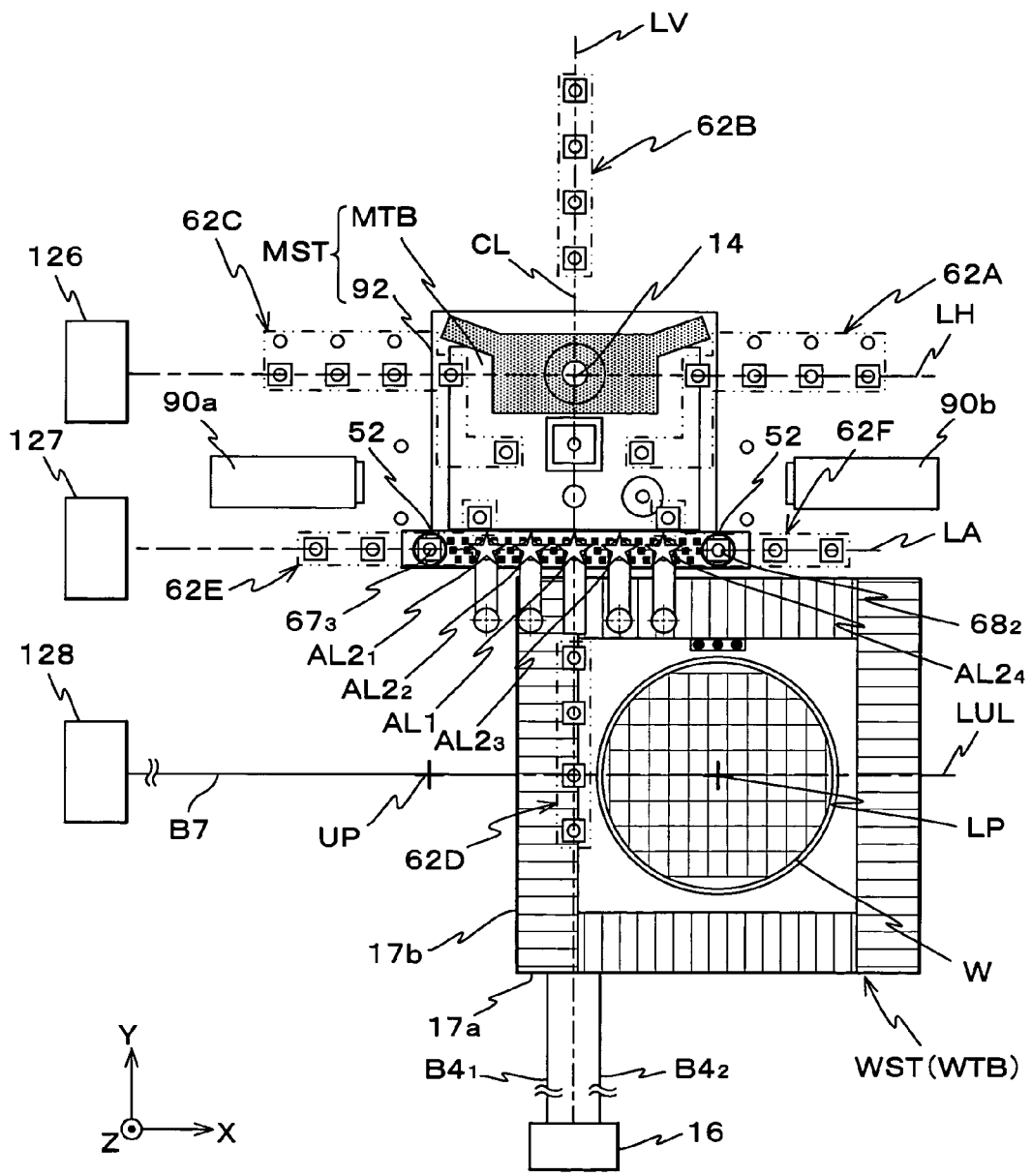
FIG. 10 is a view showing a state of the wafer stage and the measurement stage at the time of loading of the wafer.

Further, as shown in the drawings such as FIGS. 9 and 10, a measurement beam B7 from X interferometer 128 is projected on reflection surface 17b of wafer table WTB along a straight line LUL, which is a line connecting an unloading position UP where unloading of the wafer on wafer table WTB is performed and a loading position LP where loading of the wafer onto wafer table WTB is performed and is parallel to the X-axis. Further, as shown in the drawings such as FIGS. 11 and 12, a measurement beam B6 from X interferometer 127 is projected on reflection surface 17b of wafer table WTB along a straight line (a reference axis) LA, which passes through the detection center of primary alignment system AL1 and is parallel to the X-axis.

Figure 12:
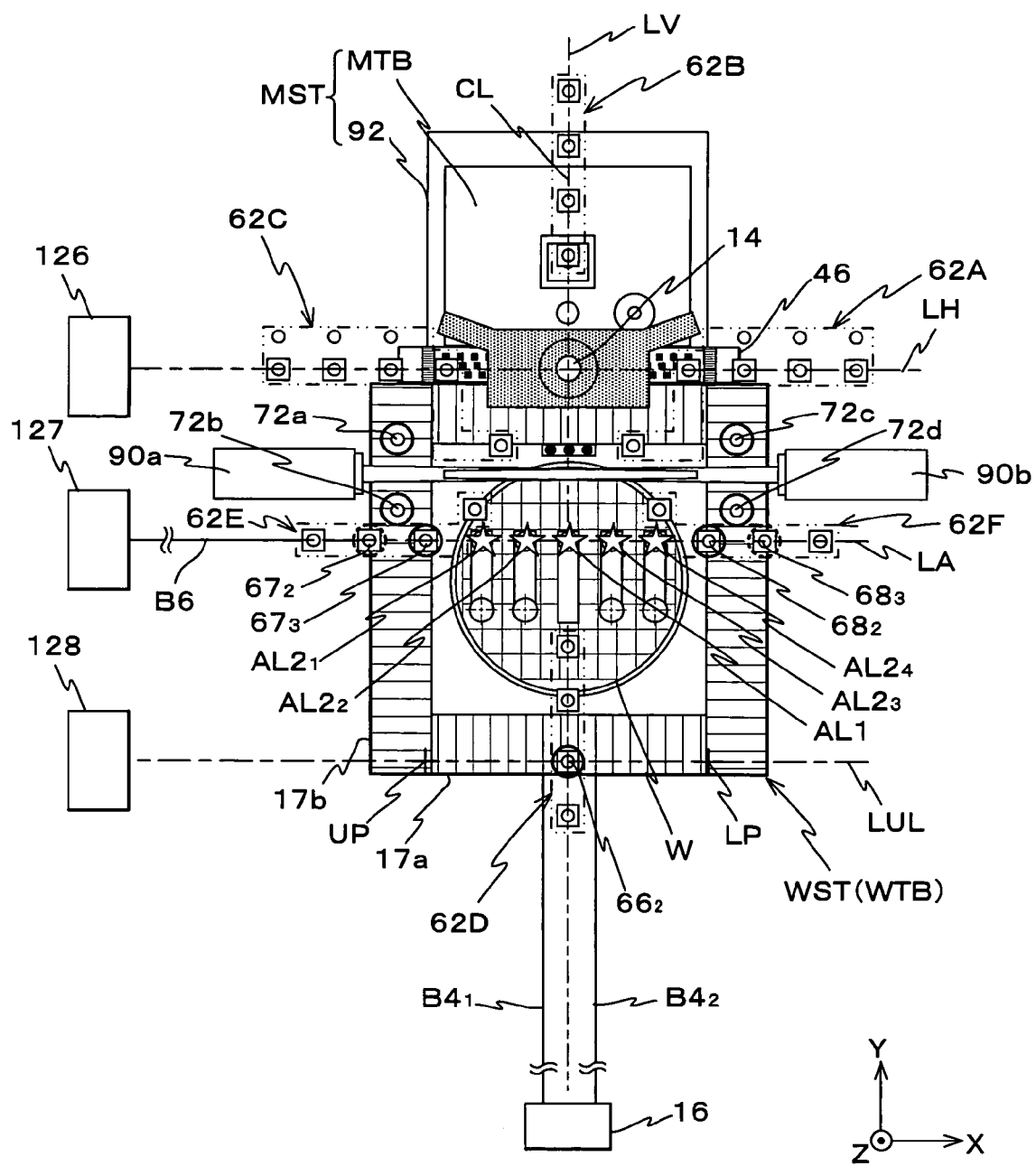
FIG. 12 is a view for explaining a state of the wafer stage and the measurement stage at the time of the wafer alignment.

Main controller 20 can obtain displacement $\Delta X$ of wafer table WTB in the X-axis direction from the measurement values of X interferometer 127 and the measurement values of X interferometer 128. However, the three X interferometers 126, 127, and 128 are placed differently regarding the Y-axis direction, and X interferometer 126 is used at the time of exposure as shown in FIG. 8, X interferometer 127 is used at the time of wafer alignment as shown in FIG. 12, and X interferometer 128 is used at the time of wafer unloading shown in FIG. 9 and wafer loading shown in FIG. 10.

From Z interferometers 43A and 43B previously described, measurement beams B1 and B2 that proceed along the Y-axis are projected toward movable mirror 41, respectively, as shown in FIG. 1. These measurement beams B1 and B2 are incident on reflection surfaces 41b and 41c of movable mirror 41, respectively, at a predetermined angle of incidence (the angle is to be $\theta/2$). Then, measurement beam B1 is sequentially reflected by reflection surfaces 41b and 41c, and then is incident perpendicularly on the reflection surface of fixed mirror 47B, whereas measurement beam B2 is sequentially reflected by reflection surfaces 41c and 41b and is incident perpendicularly on the reflection surface of fixed mirror 47A. Then, measurement beams B2 and B1 reflected off the reflection surface of fixed mirrors 47A and 47B are sequentially reflected by reflection surfaces 41b and 41c again, or are sequentially reflected by reflection surfaces 41c and 41b again (returning the optical path at the time of incidence oppositely), and then are received by Z interferometers 43A and 43B.

In this case, when displacement of movable mirror 41 (more specifically, wafer stage WST) in the Z-axis direction is $\Delta Z o$ and displacement in the Y-axis direction is $\Delta Y o$, an optical path length change $\Delta L1$ of measurement beam B1 and an optical path length change $\Delta L2$ of measurement beam B2 can respectively be expressed as in formulas (1) and (2) below.

$$\Delta L1 = \Delta Yo \times (1+\cos\theta) + \Delta Zo \times \sin\theta \tag{1}$$

$$\Delta L2 = \Delta Yo \times (1+\cos\theta) - \Delta Zo \times \sin\theta \tag{2}$$

Accordingly, from formulas (1) and (2), $\Delta Zo$ and $\Delta Yo$ can be obtained using the following formulas (3) and (4).

$$\Delta Zo = (\Delta L1 - \Delta L2)/2\sin\theta \tag{3}$$

$$\Delta Yo = (\Delta L1 + \Delta L2)/\{2(1+\cos\theta)\} \tag{4}$$

Displacements $\Delta Zo$ and $\Delta Yo$ above can be obtained with Z interferometers 43A and 43B. Therefore, displacement which is obtained using Z interferometer 43A is to be $\Delta ZoR$ and $\Delta YoR$, and displacement which is obtained using Z interferometer 43B is to be $\Delta ZoL$ and $\Delta YoL$. And the distance between measurement beams B1 and B2 projected by Z interferometers 43A and 43B, respectively, in the X-axis direction is to be a distance D (refer to FIG. 2). Under such premises, displacement (yawing amount) $\Delta\theta z$ of movable mirror 41 (more specifically, wafer stage WST) in the $\theta z$ direction and displacement (rolling amount) $\Delta\theta y$ in the $\theta y$ direction can be obtained by the following formulas (5) and (6).

$$\Delta\theta z = \tan^{-1}\{(\Delta YoR - \Delta YoL)/D\} \tag{5}$$

$$\Delta\theta y = \tan^{-1}\{(\Delta ZoL - \Delta ZoR)/D\} \tag{6}$$

Accordingly, by using the formulas (3) to (6) above, main controller 20 can compute displacement of wafer stage WST in four degrees of freedom, $\Delta Zo$, $\Delta Yo$, $\Delta\theta z$, and $\Delta\theta y$, based on the measurement results of Z interferometers 43A and 43B.

In the manner described above, from the measurement results of interferometer system 118, main controller 20 can obtain displacement of wafer stage WST in directions of six degrees of freedom (Z, X, Y, $\theta z$, $\theta x$, and $\theta y$ directions).

Incidentally, in the embodiment, the case has been described where wafer stage WST is configured of a single stage that can move in six degrees of freedom which includes stage main section 91 and wafer table WTB mounted on stage main section 91, however, the present invention is not limited to this, and wafer stage WST can be configured including stage main section 91 which can move freely in the XY plane, and wafer table WTB that can be finely driven relative to the stage main section at least in the Z-axis direction, the $\theta x$ direction, and the $\theta y$ direction. Further, instead of reflection surface 17a and reflection surface 17b, a movable mirror consisting of a plane mirror can be arranged in wafer table WTB. Furthermore, positional information of wafer stage WST was to be measured with a reflection surface of a fixed mirror arranged in projection unit PU serving as a reference surface, however, the position to place the reference surface at is not limited to projection unit PU, and the fixed mirror does not always have to be used to measure the positional information of wafer stage WST.

In the embodiment, however, position information within the XY plane (including the rotation information in the $\theta z$ direction) of wafer stage WST (wafer table WTB) is mainly measured by an encoder system (to be described later), and the measurement values of interferometers 16, 126, and 127 are secondarily used in cases such as when long-term fluctuation (for example, by temporal deformation or the like of the scales) of the measurement values of the encoder system is corrected (calibrated).

Incidentally, at least part of interferometer system 118 (such as an optical system) may be arranged at the main frame that holds projection unit PU, or may also be arranged integrally with projection unit PU that is supported in a suspended state as is described above, however, in the embodiment, interferometer system 118 is to be arranged at the measurement frame described above.

Further, in the embodiment, positional information of wafer stage WST measured by interferometer system 118 is not used in operations such as the exposure operation and the alignment operation which will be described later on, and was mainly to be used in calibration operations (more specifically, calibration of measurement values) of the encoder system, however, the measurement information (more specifically, at least one of the positional information in directions of six degrees of freedom) of interferometer system 118 can be used in operations such as the exposure operation and/or the alignment operation. In the embodiment, the encoder system measures positional information of wafer stage WST in directions of three degrees of freedom, or more specifically, the X-axis, the Y-axis, and the θz directions. Therefore, in the exposure operation and the like, of the measurement information of interferometer system 118, positional information related to a direction that is different from the measurement direction (the X-axis, the Y-axis, and the θz direction) of wafer stage WST by the encoder system, such as, for example, only the positional information related to at least one direction among the Z-axis direction, the θx direction, and the θy direction can be used, or in addition to the positional information in the different direction, positional information related to the same direction (more specifically, at least one of the X-axis, the Y-axis, and the θz directions) as the measurement direction of the encoder system can also be used. Further, in the exposure operation and the like, the positional information of wafer stage WST in the Z-axis direction measured using interferometer system 118 can be used.

In addition, interferometer system 118 (refer to FIG. 6) includes a Y interferometer 18 and an X interferometer 130 for measuring the two-dimensional position coordinates of measurement table MTB. Also on the +Y end surface and the −X end surface of measurement table MTB, reflection surfaces 19a and 19b are formed similar to wafer table WTB as is described above (refer to FIGS. 2 and 5A). Y interferometer 18 and X interferometer 130 (X interferometer 130 is not shown in FIG. 1, refer to FIG. 2) of interferometer system 118 project measurement beams on reflection surfaces 19a and 19b as shown in FIG. 2, and measure the displacement from a reference position of each reflection surface by receiving the respective reflected lights. Main controller 20 receives the measurement values of Y interferometer 18 and X interferometer 130, and computes the positional information (for example, including at least the positional information in the X-axis and the Y-axis directions and rotation information in the θz direction) of measurement stage MST.

Incidentally, as the Y interferometer used for measuring measurement table MTB, a multiaxial interferometer which is similar to Y interferometer 16 used for measuring wafer table WTB can be used. Further, as the X interferometer used for measuring measurement table MTB, a two-axis interferometer which is similar to X interferometer 126 used for measuring wafer table WTB can be used. Further, in order to measure Z displacement, Y displacement, yawing amount, and rolling amount of measurement stage MST, interferometers similar to Z interferometers 43A and 43B used for measuring wafer table WTB can be introduced.

Next, the structure and the like of the encoder system which measures positional information (including rotation information in the θz direction) of wafer table WTB in the XY plane will be described.

In exposure apparatus 100 of the embodiment, as shown in FIG. 3, four head units 62A to 62D of the encoder system are placed in a state of surrounding nozzle unit 32 on all four sides. In actual practice, head units 62A to 62D are fixed to the foregoing main frame that holds projection unit PU in a suspended state via a support member, although omitted in the drawings such as FIG. 3 from the viewpoint of avoiding intricacy of the drawings.

As shown in FIG. 3, head units 62A and 62C are placed on the +X side and the −X side of projection unit PU, with the X-axis direction serving as a longitudinal direction. Head units 62A and 62C are respectively equipped with a plurality of (five, in this case) Y heads $65_1$ to $65_5$ and $64_1$ to $64_5$ that are placed at a distance WD in the X-axis direction. More particularly, head units 62A and 62C are each equipped with a plurality of (four, in this case) Y heads ($64_1$ to $64_4$ or $65_2$ to $65_5$) that are placed on straight line (reference axis) LH which passes through optical axis AX of projection optical system PL and is also parallel to the X-axis at distance WD except for the periphery of projection unit PU, and a Y head ($64_5$ or $65_1$) which is placed at a position a predetermined distance away in the −Y-direction from reference axis LH in the periphery of projection unit PU, or more specifically, on the −Y side of nozzle unit 32. Head units 62A and 62C are each also equipped with three Z heads which will be described later on. Hereinafter, Y heads $65_1$ to $65_5$ and $64_1$ to $64_5$ will also be described as Y heads 65 and 64, respectively, as necessary.

Head unit 62A constitutes a multiple-lens (five-lens, in this case) Y linear encoder (hereinafter appropriately shortened to a "Y encoder" or an "encoder") 70A (refer to FIG. 6) that measures the position of wafer stage WST (wafer table WTB) in the Y-axis direction (the Y-position) using Y scale $39Y_1$ previously described. Similarly, head unit 62C constitutes a multiple-lens (five-lens, in this case) Y linear encoder 70C (refer to FIG. 6) that measures the Y-position of wafer stage WST (wafer table WTB) using Y scale $39Y_2$ described above. In this case, distance WD in the X-axis direction of the five Y heads (64 or 65) (more specifically, measurement beams) that head units 62A and 62C are each equipped with, is set slightly narrower than the width (to be more precise, the length of grid line 38) of Y scales $39Y_1$ and $39Y_2$ in the X-axis direction.

As shown in FIG. 3, head unit 62B is placed on the +Y side of nozzle unit 32 (projection unit PU), and is equipped with a plurality of, in this case, four X heads $66_5$ to $66_8$ that are placed on reference axis LV previously described along Y-axis direction at distance WD. Further, head unit 62D is placed on the −Y side of primary alignment system AU, on the opposite side of head unit 62B via nozzle unit 32 (projection unit PU), and is equipped with a plurality of, in this case, four X heads $66_1$ to $66_4$ that are placed on reference axis LV at distance WD. Hereinafter, X heads $66_1$ to $66_8$ will also be described as X head 66, as necessary.

Head unit 62B constitutes a multiple-lens (four-lens, in this case) X linear encoder (hereinafter, shortly referred to as an "X encoder" or an "encoder" as needed) 70B (refer to FIG. 6) that measures the position in the X-axis direction (the X-position) of wafer stage WST (wafer table WTB) using X scale $39X_1$ described above. Further, head unit 62D constitutes a multiple-lens (four-lens, in this case) X linear encoder 70D (refer to FIG. 6) that measures the X-position of wafer stage WST (wafer table WTB) using X scale $39X_2$ previously described.

Here, the distance between adjacent X heads 66 (measurement beams) that are equipped in each of head units 62B and 62D is set shorter than a width in the Y-axis direction of X scales $39X_1$ and $39X_2$ (to be more accurate, the length of grid line 37). Further, the distance between X head $66_5$ of head unit 62B farthest to the −Y side and X head $66_4$ of head unit 62D farthest to the +Y side is set slightly narrower than the width of wafer stage WST in the Y-axis direction so that switching (linkage described below) becomes possible between the two X heads by the movement of wafer stage WST in the Y-axis direction.

In the embodiment, furthermore, head units 62F and 62E are respectively arranged a predetermined distance away on the −Y side of head units 62A and 62C. Although illustration of head units 62E and 62F is omitted in FIG. 3 and the like from the viewpoint of avoiding intricacy of the drawings, in actual practice, head units 62E and 62F are fixed to the foregoing main frame that holds projection unit PU in a suspended state via a support member. Incidentally, for example, in the case projection unit PU is supported in a suspended state, head units 62E and 62F, and head units 62A to 62D which are previously described can be supported in a suspended state integrally with projection unit PU, or can be arranged at the measurement frame described above.

Head unit 62E is equipped with four Y heads $67_1$ to $67_4$ whose positions in the X-axis direction are different. More particularly, head unit 62E is equipped with three Y heads $67_1$ to $67_3$ placed on the −X side of secondary alignment system $AL2_1$ on reference axis LA previously described at substantially the same distance as distance WD previously described, and one Y head $67_4$ which is placed at a position a predetermined distance (a distance slightly shorter than WD) away on the +X side from the innermost (the +X side) Y head $67_3$ and is also on the +Y side of the secondary alignment system $AL2_1$ a predetermined distance away to the +Y side of reference axis LA.

Head unit 62F is symmetrical to head unit 62E with respect to reference axis LV, and is equipped with four Y heads $68_1$ to $68_4$ which are placed in symmetry to the four Y heads $67_4$ to $67_1$ described above with respect to reference axis LV. Hereinafter, Y heads $67_1$ to $67_4$ and $68_1$ to $68_4$ will also be described as Y heads 67 and 68, respectively, as necessary. In the case of an alignment operation and the like which will be described later on, at least one each of Y heads 67 and 68 faces Y scale $39Y_2$ and $39Y_1$, respectively, and by such Y heads 67 and 68 (more specifically, Y encoders 70E and 70F which are configured by these Y heads 67 and 68), the Y position (and the θz rotation) of wafer stage WST is measured.

Further, in the embodiment, at the time of baseline measurement (Sec-BCHK (interval)) and the like of the secondary alignment systems which will be described later on, Y head $67_3$ and $68_2$ which are adjacent to secondary alignment systems $AL2_1$ and $AL2_4$ in the X-axis direction face the pair of reference gratings 52 of FD bar 46, respectively, and by Y heads $67_3$ and $68_2$ that face the pair of reference gratings 52, the Y position of FD bar 46 is measured at the position of each reference grating 52. In the description below, the encoders configured by Y heads $67_3$ and $68_2$ which face a pair of reference gratings 52, respectively, are referred to as Y linear encoders (also shortly referred to as a "Y encoder" or an "encoder" as needed) $70E_2$ and $70F_2$ (refer to FIG. 6). Further, for identification, Y encoders 70E and 70F configured by Y heads 67 and 68 that face Y scales $39Y_2$ and $39Y_1$ described above, respectively, will be referred to as Y encoders $70E_1$ and $70F_1$.

The six linear encoders 70A to 70F described above measure the position coordinates of wafer stage WST at a resolution of, for example, around 0.1 nm, and the measurement values are supplied to main controller 20. Main controller 20 controls the position within the XY plane of wafer table WTB based on the measurement values of three of linear encoders 70A to 70D or on the measurement values of three of encoders 70B, 70D, $70E_1$, and $70F_1$, and also controls the rotation in the θz direction of FD bar 46 based on the measurement values of linear encoders $70E_2$ and $70F_2$. Incidentally, the configuration and the like of the linear encoder will be described further later in the description.

In exposure apparatus 100 of the embodiment, as shown in FIG. 3, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, Kokai (Japanese Unexamined Patent Application Publication) No. 06-283403 (the corresponding U.S. Pat. No. 5,448,332) and the like. In the embodiment, as an example, irradiation system 90a is placed on the +Y side of the −X end portion of head unit 62E previously described, and photodetection system 90b is placed on the +Y side of the +X end portion of head unit 62F previously described in a state of opposing irradiation system 90a.

A plurality of detection points of the multipoint AF system (90a, 90b) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set to around the same as the diameter of wafer W, by only scanning wafer W in the Y-axis direction once, positional information (surface position information) in the Z-axis direction across substantially the entire surface of wafer W can be measured. Further, since detection area AF is placed between liquid immersion area 14 (exposure area IA) and the detection areas of the alignment systems (AL1, $AL2_1$ to $AL2_4$) in the Y-axis direction, the detection operations of the multipoint AF system and the alignment systems can be performed in parallel. The multipoint AF system may also be arranged on the main frame that holds projection unit PU or the like, however, in the embodiment, the system will be arranged on the measurement frame previously described.

Incidentally, the plurality of detection points are to be placed in one row and M columns, or two rows and N columns, but the number(s) of rows and/or columns is/are not limited to these numbers. However, in the case the number of rows is two or more, the positions in the X-axis direction of detection points are preferably made to be different between the different rows. Moreover, the plurality of detection points is to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the vicinity of detection points located at both ends out of a plurality of detection points of the multipoint AF system (90a, 90b), that is, in the vicinity of both end portions of detection area AF, heads 72a and 72b, and 72c and 72d of surface position sensors for Z position measurement (hereinafter, shortly referred to as "Z heads") are arranged each in a pair, in symmetrical placement with respect to reference axis LV. Z heads 72a to 72d are fixed to the lower surface of a main frame (not shown). Incidentally, Z heads 72a to 72d may also be arranged on the measurement frame described above or the like.

As Z heads 72a to 72d, a sensor head that irradiates a light to wafer table WTB from above, receives the reflected light and measures positional information of the wafer table WTB surface in the Z-axis direction orthogonal to the XY plane at the irradiation point of the light, as an example, a head of an optical displacement sensor (a sensor head by an optical pickup method), which has a configuration like an optical pickup used in a CD drive device, is used.

In the embodiment, as each Z head, a configuration is employed where the diffraction grating surfaces of Y scales $39Y_1$ and $39Y_2$ are observed from above (the +Z direction) as in the encoder. Accordingly, by measuring the surface position information of the upper surface of wafer table WTB at different positions with the plurality of Z heads, the position of wafer table WTB in the Z-axis direction and the $\theta y$ rotation (rolling) can be measured.

Furthermore, head units 62A and 62C previously described are equipped with Z heads $76_j$ (j=3 to 5) and $74_i$ (i=1 to 3), which are three heads each, respectively, at the same X position as Y heads $65_j$ (j=3 to 5) and $64_i$ (i=1 to 3) that head units 62A and 62C are respectively equipped with, with the Y position shifted. In this case, Z heads $76_j$ and $74_i$, which are three heads each, belonging to head units 62A and 62C, respectively, are placed parallel to reference axis LH a predetermined distance away in the +Y direction from reference axis LH and also symmetric to each other with respect to reference axis LV. Incidentally, as each of the Z heads $76_j$ and $74_i$, an optical displacement sensor head similar to Z heads 72a to 72d described above is employed.

In this case, Z head $74_3$ is on a straight line parallel to the Y-axis, the same as is with Z heads 72a and 72b previously described. Similarly, Z head $76_3$ is on a straight line parallel to the Y-axis, the same as is with Z heads 72c and 72d previously described.

Z heads 72a to 72d, Z heads $74_1$ to $74_3$, and Z heads $76_3$ to $76_5$ connect to main controller 20 via a signal processing/selection device 170 as shown in FIG. 6, and main controller 20 selects an arbitrary Z head from Z heads 72a to 72d, Z heads $74_1$ to $74_3$, and Z heads $76_3$ to $76_5$ via signal processing/selection device 170 and makes the head move into an operating state, and then receives the surface position information detected by the Z head which is in an operating state via signal processing/selection device 170. In the embodiment, a surface position measurement system 180 that measures positional information of wafer table WTB in the Z-axis direction and the direction of inclination with respect to the XY plane is configured, including Z heads 72a to 72d, Z heads $74_1$ to $74_3$, and Z heads $76_3$ to $76_5$, and signal processing/selection device 170.

Incidentally, in FIG. 3, measurement stage MST is omitted and a liquid immersion area that is formed by water Lq held in the space between measurement stage MST and tip lens 191 is shown by a reference code 14. Further, as shown in FIG. 3, in the embodiment, unloading position UP and loading position LP are set symmetrically with respect to reference axis LV. However, as well as this, unloading position UP and loading position LP can be at the same position.

FIG. 6 shows the main configuration of the control system of exposure apparatus 100. The control system is mainly configured of main controller 20 composed of a microcomputer (or workstation) that performs overall control of the entire apparatus. In memory 34 which is an external memory connected to main controller 20, correction information is stored of measurement instrument systems such as interferometer system 118, encoder system 150 (encoders 70A to 70F), Z heads 72a to 72d, $74_1$ to $74_3$, $76_3$ to $76_5$ and the like. Incidentally, in FIG. 6, various sensors such as uneven illuminance measuring sensor 94, aerial image measuring instrument 96 and wavefront aberration measuring instrument 98 that are arranged at measurement stage MST are collectively shown as a sensor group 99.

Figure 7A:
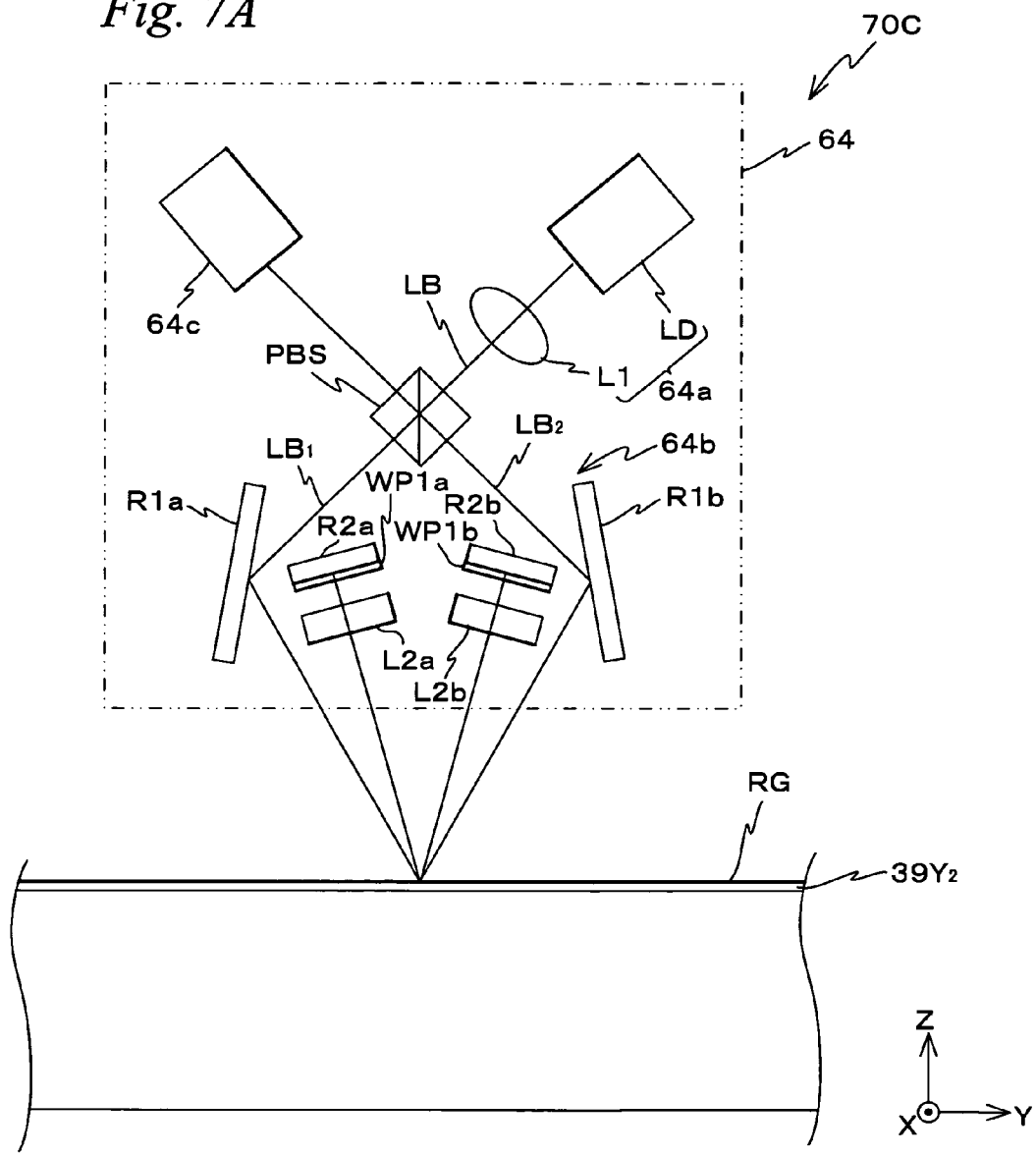
FIG. 7A is a view showing an example of a configuration of an encoder.

Next, the configuration and the like of encoders 70A to 70F will be described, focusing on Y encoder 70C that is shown enlarged in FIG. 7A as a representative. FIG. 7A shows one Y head 64 of head unit 62C that irradiates a detection light (measurement beam) to Y scale $39Y_2$.

Y head 64 is mainly composed of three sections, which are an irradiation system 64a, an optical system 64b and a photodetection system 64c.

Irradiation system 64a includes a light source that emits a laser beam LB in a direction inclined at an angle of 45 degrees with respect to the Y-axis and Z-axis, for example, a semiconductor laser LD, and a lens L1 that is placed on the optical path of laser beam LB emitted from semiconductor laser LD.

Optical system 64b is equipped with a polarization beam splitter PBS whose separation plane is parallel to an XZ plane, a pair of reflection mirrors R1a and R1b, lenses L2a and L2b, quarter wavelength plates (hereinafter, referred to as a $\lambda/4$ plate) WP1a and WP1b, reflection mirrors R2a and R2b, and the like. In this case, reflection mirror R1b is placed at position symmetric to reflection mirror R1a, with a separation plane of polarization beam splitter PBS serving as a reference. Similarly, converging lens L2a and L2b, $\lambda/4$ plates WP1a and WP1b, and reflection mirrors R2a and R2b are also placed at positions symmetric to each other, with the separation plane of polarization beam splitter PBS serving as a reference.

Photodetection system 64c includes a polarizer (analyzer), a photodetector, and the like. Photodetection system 64c is placed on a return optical path of the reflection diffraction light of laser beam LB via the separation plane of polarization beam splitter PBS.

In Y encoder 70C, laser beam LB emitted from semiconductor laser LD is incident on polarization beam splitter PBS via lens L1, and is split by polarization into two beams $LB_1$ and $LB_2$. In this case, a P-polarization component of laser beam LB passes through polarization beam splitter PBS and forms beam $LB_1$, and an S-polarization component is reflected off the separation plane of polarization beam splitter PBS and forms beam $LB_2$. Beam $LB_1$ and $LB_2$ are reflected off reflection mirrors R1a and R1b, respectively, and are incident on reflection grating RG.

Diffraction light is generated by beams $LB_1$ and $LB_2$ being irradiated on reflection grating RG. Of diffraction lights equal to or less than the −1st order generated by the irradiation of beam $LB_1$, for example, a diffraction light of the −1st order passes through converging lens L2a and λ/4 plate WP1a, and reaches reflection mirror R2a. However, the sign of the order of the diffraction light is defined so that the diffraction light diffracting in the +Y direction (−Y direction) is positive (negative), with a zero-order diffraction light reflected by the same angle as the incoming light serving as a reference, as it will be described later on. Then, the diffraction light is reflected by reflecting mirror R2a, and by tracing the same optical path as the outward path in the opposite direction, the light reaches reflection grating RG. In this case, by passing through λ/4 plate WP1a twice in the outward path and the return path, the polarization direction of the diffraction light rotates by 90 degrees, and the diffraction light is converted into S-polarization. Meanwhile, of the diffraction light equal to or more than the +1st order generated by the irradiation of beam $LB_2$, for example, a diffraction light of the +1st order passes through converging lens L2b and λ/4 plate WP1b, and reaches reflection mirror R2b. Then, the diffraction light is reflected by reflecting mirror R2b, and by tracing the same optical path as the outward path in the opposite direction, the light reaches reflection grating RG. In this case, by passing through λ/4 plate WP1b twice in the outward path and the return path, the polarization direction of the diffraction light rotates by 90 degrees, and the diffraction light is converted into P-polarization.

By the irradiation of the return diffraction light from reflection mirrors R2a and R2b on reflection grating RG, a diffraction light is generated again. Of the diffraction lights deriving from the return light from reflection mirror R2a, diffraction light of the same order as the return light is reflected by reflection mirror R1a and then reaches polarization beam splitter PBS. Meanwhile, of the diffraction lights deriving from the return light from reflection mirror R2b, diffraction light of the same order as the return light is reflected by reflection mirror R1b and then reaches polarization beam splitter PBS.

Return beams $LB_1$ and $LB_2$ that reach polarization beam splitter PBS are converted into S-polarization and P-polarization, respectively. Therefore, return beam $LB_1$ is reflected by the separation plane of polarization beam splitter PBS, and return beam $LB_2$ passes through polarization beam splitter PBS. Accordingly, return beams $LB_1$ and $LB_2$ are synthesized coaxially, and are incident on photodetection system 64c.

In the inside of photodetection system 64c, an analyzer arranges the polarization direction of return beams $LB_1$ and $LB_2$ and makes the beams overlap so as to form an interference light. This interference light is detected by the photodetector. In this case, when Y scale $39Y_2$ (more specifically wafer stage WST) moves in the measurement direction (in this case, the Y-axis direction), phase difference between the two beams $LB_1$ and $LB_2$ changes as it will be described later on, which causes the intensity of the interference light to change. From this intensity change of the interference light, the positional relation between Y head 64 and Y scale $39Y_2$, or more specifically, the Y-coordinate of wafer stage WST is computed and is output as a measurement value of Y encoder 70A.

Incidentally, other Y heads 64 of head unit 62C, and each of the Y heads 65 belonging to head unit 62A are configured similarly as in the description above, and the heads face Y scale $39Y_2$ or $39Y_1$ and make up Y encoder 70C or 70A.

Further each of the X heads 66 belonging to head units 62B and 62D, respectively, are configured similarly to Y head 64 described above, and the heads face X scale $39X_1$ or $39X_2$ and make up X encoder 70B or 70D.

Further, each of the Y heads 67 and 68 belonging to head units 62E and 62F, respectively, are configured similarly to Y head 64 described above, and the heads face Y scale $39Y_2$ or $39Y_1$ and make up Y encoder $70E_1$ or $70F_1$. Further, Y heads $67_3$ and $68_2$ face the pair of reference gratings 52 on measurement stage MST, respectively, and make up Y encoders $70E_2$ and $70F_2$.

Figure 7B:
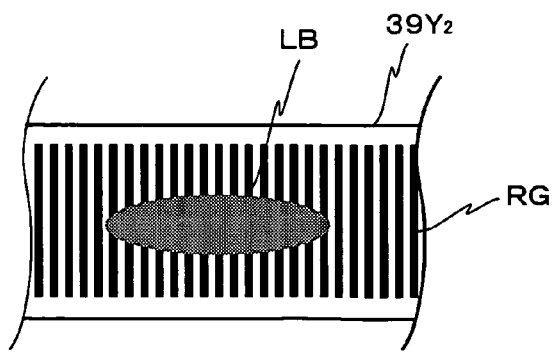
FIG. 7B is a view showing the case when a laser beam LB having a sectional shape extending narrowly in the periodic direction of diffraction grating RG is used as a detection light.

As each encoder, an encoder having a resolution of, for example, around 0.1 nm is used. Incidentally, in the encoders of the embodiment, as shown in FIG. 7B, laser beam LB having a sectional shape that is elongated in the periodic direction of diffraction grating RG may also be used, as a detection light. In FIG. 7B, beam LB is overdrawn largely compared to grating RG.

Incidentally, as another form of the encoder head, there is a type in which only optical system 64b is included in the encoder head and irradiation system 64a and photodetection system 64c are physically separate from optical system 64b. In the case of such a type, the laser beam is guided between these three sections via an optical fiber.

Next, a parallel processing operation that uses wafer stage WST and measurement stage MST in exposure apparatus 100 of the embodiment will be described based on FIGS. 8 to 11. Incidentally, during the operation below, main controller 20 performs the open/close control of each valve of liquid supply device 5 of local liquid immersion device 8 and liquid recovery device 6 in the manner previously described, and water is constantly filled on the outgoing surface side of tip lens 191 of projection optical system PL. However, in the description below, for the sake of simplicity, the explanation related to the control of liquid supply device 5 and liquid recovery device 6 will be omitted. Further, many drawings are used in the operation description hereinafter; however, reference codes may or may not be given to the same member for each drawing. More specifically, the reference codes written are different for each drawing; however, such members have the same configuration, regardless of the indication of the reference codes. The same can be said for each drawing used in the description so far.

FIG. 8 shows a state in which an exposure by the step-and-scan method of wafer W mounted on wafer stage WST is performed. This exposure is performed by alternately repeating a movement between shots in which wafer stage WST is moved to a scanning starting position (acceleration staring position) to expose each shot area on wafer W and scanning exposure in which the pattern formed on reticle R is transferred onto each shot area by the scanning exposure method, based on results of wafer alignment (e.g., Enhanced Global Alignment (EGA)) and the like which has been performed prior to the beginning of exposure. Further, exposure is performed in the following order, from the shot area located on the −Y side on wafer W to the shot area located on the +Y side. Incidentally, exposure is performed in a state where liquid immersion area 14 is formed in between projection unit PU and wafer W.

During the exposure described above, the position (including rotation in the θz direction) of wafer stage WST (wafer table WTB) in the XY plane is controlled by main controller 20, based on measurement results of a total of three encoders which are the two Y encoders 70A and 70C, and one of the two X encoders 70B and 70D. In this case, the two X encoders 70B and 70D are made up of two X heads 66 that face X scale $39X_1$ and $39X_2$, respectively, and the two Y encoders 70A and 70C are made up of Y heads 65 and 64 that face Y scales $39Y_1$ and $39Y_2$, respectively. Further, the Z position and rotation (rolling) in the θy direction of wafer stage WST are controlled, based on measurement results of a pair of Z heads $74_i$ and $76_j$ that respectively faces the end section on one side and the other side of the surface of wafer table WTB in the X-axis direction. The θx rotation (pitching) of wafer stage WST is controlled, based on measurement results of Y interferometer 16. Incidentally, the control of the position of wafer table WTB in the Z-axis direction, the rotation in the θy direction, and the rotation in the θx direction (more specifically, the focus leveling control of wafer W) is performed, based on results of a focus mapping performed beforehand.

At the position of wafer stage WST shown in FIG. 8, while X head $66_5$ (shown circled in FIG. 8) faces X scale $39X_1$, there are no X heads 66 that face X scale $39X_2$. Therefore, main controller 20 uses one X encoder 70B and two Y encoders 70A and 70C so as to perform position (X, Y, θz) control of wafer stage WST. In this case, when wafer stage WST moves from the position shown in FIG. 8 to the −Y direction, X head $66_5$ moves off of (no longer faces) X scale $39X_1$, and X head $66_4$ (shown circled in a broken line in FIG. 8) faces X scale $39X_2$ instead. Therefore, main controller 20 switches the stage control to a control that uses one X encoder 70D and two Y encoders 70A and 70C.

In this manner, main controller 20 performs stage control by consistently switching the encoder to use depending on the position coordinate of wafer stage WST.

Incidentally, independent from the position measurement of wafer stage WST described above using the encoders, position (X, Y, Z, θx, θy, θz) measurement of wafer stage WST using interferometer system 118 is constantly performed. In this case, the X position and θz rotation (yawing) of wafer stage WST are measured using X interferometers 126, 127, or 128, the Y position, the θx rotation, and the θz rotation are measured using Y interferometer 16, and the Y position, the Z position, the θy rotation, and the θz rotation are measured using Z interferometers 43A and 43B (not shown in FIG. 8, refer to FIG. 1 or 2) that constitute interferometer system 118. Of X interferometers 126, 127, and 128, one interferometer is used according to the Y position of wafer stage WST. As indicated in FIG. 8, X interferometer 126 is used during exposure. The measurement results of interferometer system 118 regarding the directions of three degrees of freedom in the X, Y, and θz directions are used secondarily for position control of wafer stage WST.

When exposure of wafer W has been completed, main controller 20 drives wafer stage WST toward unload position UP. On this drive, wafer stage WST and measurement stage MST which were apart during exposure come into contact or move close to each other with a clearance of around 300 μm in between, and shift to a scrum state. In this case, the −Y side surface of CD bar 46 on measurement table MTB and the +Y side surface of wafer table WTB come into contact or move close together. And by moving both stages WST and MST in the −Y direction while maintaining the scrum condition, liquid immersion area 14 formed under projection unit PU moves to an area on measurement stage MST. For example, FIGS. 9 and 10 show the state after the movement.

When wafer stage WST moves further to the −Y direction and moves off from the effective stroke area (the area in which wafer stage WST moves at the time of exposure and wafer alignment), all the X heads and Y heads, and all the Z heads that constitute encoder 70A to 70D move off from the corresponding scales on wafer table WTB. Therefore, stage control based on the measurement results of encoders 70A to 70D and the Z heads is no longer possible. Just before this, main controller 20 switches the stage control to a control based on the measurement results of interferometer system 118. In this case, of the three X interferometers 126, 127, and 128, X interferometer 128 is used.

Then, as shown in FIG. 9, wafer stage WST releases the scrum state with measurement stage MST, and then moves to unload position UP. After the movement, main controller 20 unloads wafer W on wafer table WTB. And then, as shown in FIG. 10, wafer stage WST is driven in the +X direction to loading position LP, and the next wafer W is loaded on wafer table WTB.

In parallel with these operations, main controller 20 performs Sec-BCHK (a secondary base line check) in which position adjustment of FD bar 46 supported by measurement stage MST in the XY plane and baseline measurement of the four secondary alignment system $AL2_1$ to $AL2_4$ are performed. Sec-BCHK is performed on an interval basis for every wafer exchange. In this case, in order to measure the position (the θz rotation) in the XY plane, Y encoders $70E_2$ and $70F_2$ previously described are used.

Figure 11:
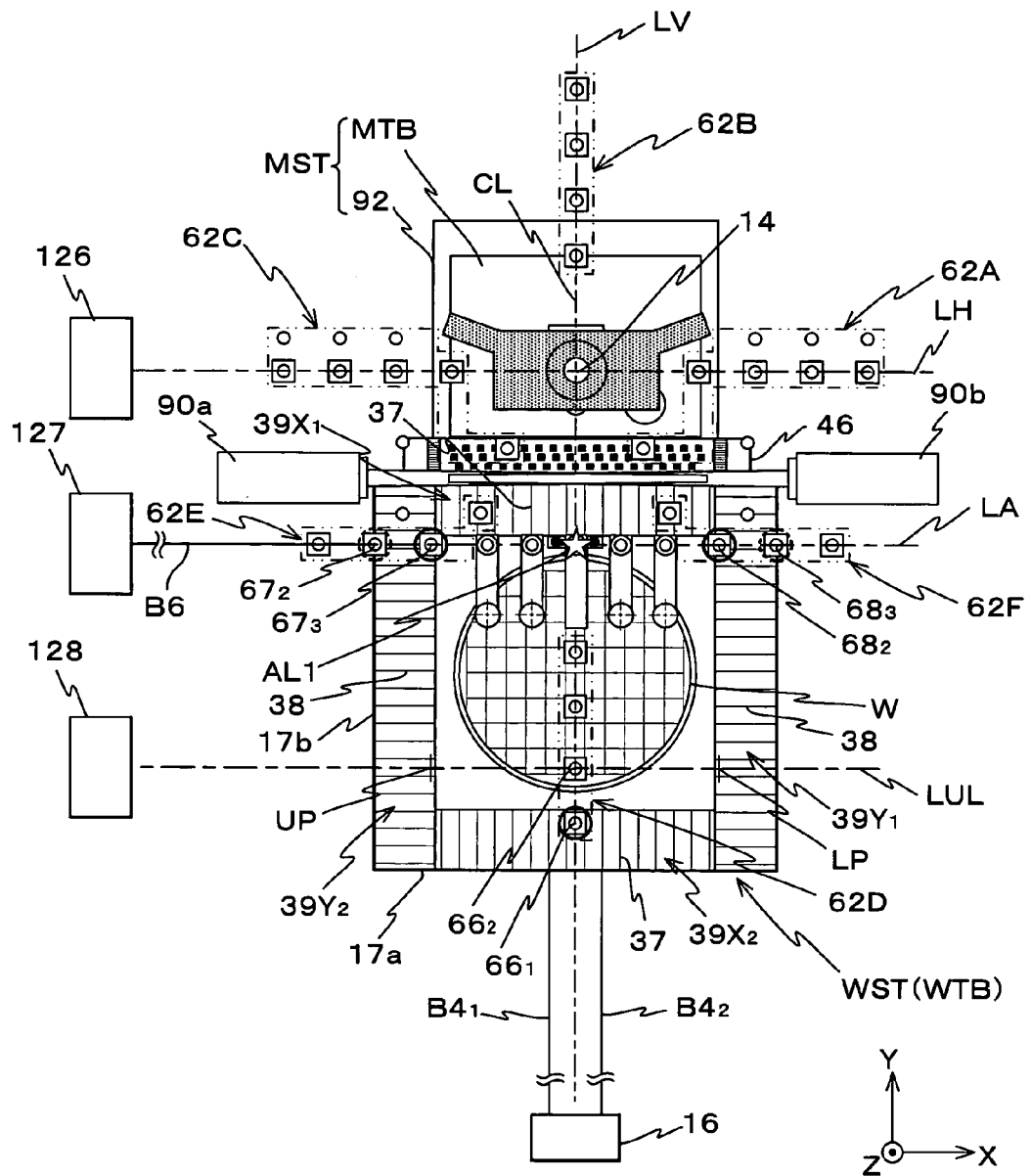
FIG. 11 is a view showing a state of the wafer stage and the measurement stage, and the placement of encoder heads at the time of switching from stage servo control by an interferometer to stage servo control by an encoder.

Next, as shown in FIG. 11, main controller 20 drives wafer stage WST and positions fiducial mark FM on measurement plate 30 within a detection field of primary alignment system AL1, and performs the former process of Pri-BCHK (a primary baseline check) in which the reference position is decided for baseline measurement of alignment system AL1, and $AL2_1$ to $AL2_4$.

On this process, as shown in FIG. 11, two Y heads $68_2$ and $67_3$ and one X head $66_1$ (shown circled in the drawing) come to face Y scales $39Y_1$ and $39Y_2$, and X scale $39X_2$, respectively. Then, main controller 20 switches the stage control from a control using interferometer system 118, to a control using encoder system 150 (encoders 70A, 70C, and 70D). Interferometer system 118 is used secondarily again. Incidentally, of the three X interferometers 126, 127, and 128, X interferometer 127 is used.

Then, main controller 20 performs wafer alignment (EGA), using primary alignment system AL1 and secondary alignment systems $AL2_1$ to $AL2_4$ (refer to the star mark in FIG. 12).

Incidentally, in the embodiment, as shown in FIG. 12, wafer stage WST and measurement stage MST are to be shifted to the scrum state by the time wafer alignment begins. Main controller 20 drives both stages WST and MST in the +Y direction, while maintaining the scrum state. Then, the water of liquid immersion area 14 is moved from above measurement table MTB to an area on wafer table WTB.

In parallel with a wafer alignment (EGA), main controller 20 performs focus calibration and focus mapping using the Z heads (70a to 70d) and the multipoint AF system (90a, 90b), and furthermore performs the latter process of Pri-BCHK in which intensity distribution of a projection image of wafer table WTB with respect to the XY position is measured using aerial image measuring device 45.

When the operation described above has been completed, main controller 20 releases the scrum state of both stages WST and MST. And, as shown in FIG. 8, exposure by the step-and-scan method is performed, and a reticle pattern is transferred onto a new wafer W. Hereinafter, a similar operation is executed repeatedly.

Next, a measurement principle of an encoder will be explained in detail, with Y encoder 70C shown in FIG. 7A serving as an example. First of all, a relation between the intensity of interference light that is synthesized from two return beams $LB_1$ and $LB_2$ and displacement (relative displacement with Y head 64) of Y scale $39Y_2$ is derived.

Figure 13A:
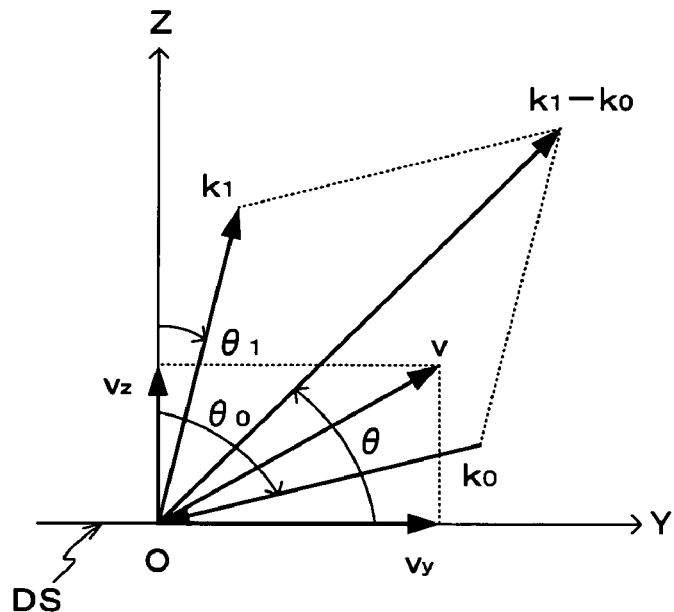
FIG. 13A is a view showing a Doppler effect that the light scattered by a movement plane receives.

When the two beams $LB_1$ and $LB_2$ are scattered by reflection grating RG that moves, the beams are subject to a frequency shift by a Doppler effect, or in other words, undergo a Doppler shift. FIG. 13A shows a scatter of light by the moving reflection surface DS. However, vectors $k_0$ and $k_1$ in the drawing are to be parallel with a YZ plane, and reflection surface DS is to be parallel to the Y-axis and perpendicular to the Z-axis.

Supposing that reflection surface DS moves at a velocity vector v=vy+vz, or more specifically, moves in the +Y direction at a speed Vy (=|vy|) and also in the +Z direction at a speed Vz (=|vz|). To this reflection surface, the light of wave number vector $k_0$ is incident at an angle $\theta_0$, and the light of wave number vector $k_1$ is scattered at an angle $\theta_1$. However, $|k_0|=|k_1|=K$. Doppler shift (frequency difference of scattered light $k_1$ and incident light $k_0$) $f_D$ that incident light $k_0$ undergoes is given in the next formula (7).

$$2\pi f_D = (k_1 - k_0) \cdot v \quad (7)$$
$$= 2KVy\cos[(\theta_1 - \theta_0)/2]\cos\theta$$
$$= 2KVz\cos[(\theta_1 - \theta_0)/2]\sin\theta$$

In this case, since $\theta=\pi/2-(\theta_1+\theta_0)/2$, formula (7) above is transformed so as to obtain the following formula (8).

$$2\pi f_D=KVy(\sin\theta_1+\sin\theta_0)+KVz(\cos\theta_1+\cos\theta_0) \quad (8)$$

Reflection surface DS is displaced during time Δt by displacement vector vΔt, or more specifically, displaced in the +Y direction by a distance ΔY=VyΔt and in the +Z direction by a distance ΔZ=VzΔt. And with this displacement, the phase of scattered light $k_1$ shifts by $\phi=2\pi f_D\Delta t$. Phase shift φ can be obtained from the following formula (9) when formula (8) is substituted.

$$\phi=K\Delta Y(\sin\theta_1+\sin\theta_0)+K\Delta Z(\cos\theta_1+\cos\theta_0) \quad (9)$$

In this case, a relation (a diffraction condition) expressed as in formula (10) below is valid between incident angle $\theta_0$ and scattering angle $\theta_1$.

$$\sin\theta_1+\sin\theta_0=n\lambda/p \quad (10)$$

However, λ is the wavelength of the light, p is the pitch of the diffraction grating, and n is the order of diffraction. Incidentally, order of diffraction n becomes positive to a diffraction light scattered in the +Y direction, and becomes negative to a diffraction light scattered in the −Y direction, with a zero order diffraction light of scattering angle −$\theta_0$ serving as a reference. Phase shift φ can be rewritten as in formula (11) below when formula (10) is substituted in formula (9).

$$\phi=2\pi n\Delta Y/p+K\Delta Z(\cos\theta_1+\cos\theta_0) \quad (11)$$

As is obvious from formula (11) above, if reflection surface DS stops, or more specifically, ΔY=ΔZ=0, phase shift φ also becomes zero.

Figure 13B:
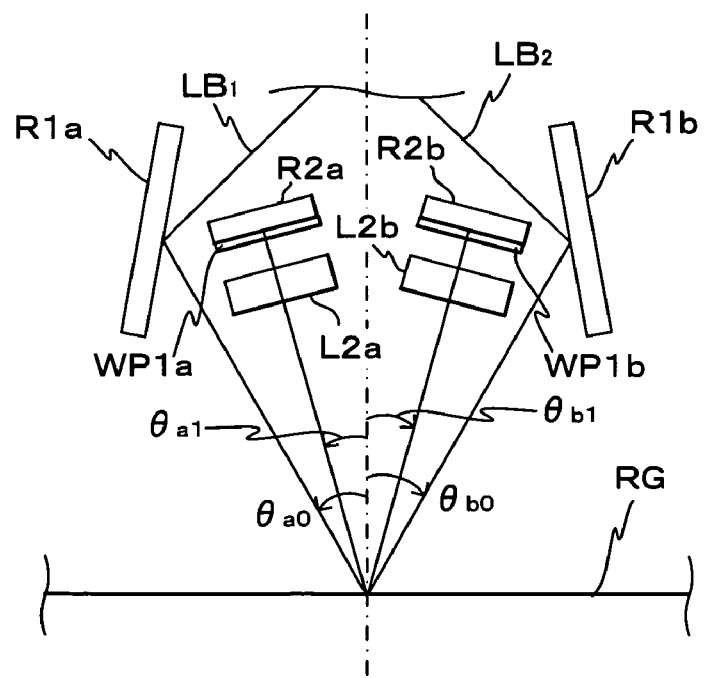
FIG. 13B is a view showing a configuration of an encoder head section.

Using formula (11), phase shift of the two beams $LB_1$ and $LB_2$ is obtained. First of all, phase shift of beam $LB_1$ will be considered. In FIG. 13B, supposing that beam $LB_1$, which was reflected off reflection mirror R1a, is incident on reflection grating RG at an angle $\theta_{a0}$, and a $n_a$ order diffraction light is to be scattered at an angle $\theta_{a1}$. When the diffraction light is generated, the phase shift that the diffraction light undergoes becomes the same form as the right-hand side of formula (11). And the return beam, which is reflected off reflection mirror R2a and follows the return path, is incident on reflection grating RG at angle $\theta_{a1}$. Then, a diffraction light is generated again. In this case, the diffraction light that is scattered at angle $\theta_{a0}$ and moves toward reflection mirror R1a following the original optical path is an $n_a$ order diffraction light, which is a diffraction light of the same order as the diffraction light generated on the outward path. Accordingly, the phase shift which beam $LB_1$ undergoes on the return path is equal to the phase shift which beam $LB_1$ undergoes on the outward path. Accordingly, the total phase shift which beam $LB_1$ undergoes is obtained as in the following formula (12).

$$\phi_1=4\pi n_a\Delta Y/p+2K\Delta Z(\cos\theta_{a1}+\cos\theta_{a0}) \quad (12)$$

However, a diffraction condition was given as in the next formula (13).

$$\sin\theta_{a1}+\sin\theta_{a0}=n_a\lambda/p \quad (13)$$

Meanwhile, beam $LB_2$ is incident on reflection grating RG at an angle $\theta_{b0}$, and an $n_b$ order diffraction light is scattered at an angle $\theta_{b1}$. Supposing that this diffraction light is reflected off reflection mirror R2b and returns to reflection mirror R1b following the same optical path. The total phase shift which beam $LB_2$ undergoes can be obtained as in the next formula (14), similar to formula (12).

$$\phi_2=4\pi n_b\Delta Y/p+2K\Delta Z(\cos\theta_{b1}+\cos\theta_{b0}) \quad (14)$$

However, a diffraction condition was given as in the next formula (15).

$$\sin\theta_{b1}+\sin\theta_{b0}=n_b\lambda/p \quad (15)$$

Intensity I of the interference light synthesized by the two return beams $LB_1$ and $LB_2$ is dependent on a phase difference φ between the two return beams $LB_1$ and $LB_2$ in the light receiving position of the photodetector, by I∝1+cos φ. However, the intensity of the two beams $LB_1$ and $LB_2$ was to be equal to each other. In this case, phase difference φ can be obtained as a sum of a difference (more specifically φ2−φ1) of phase shifts due to Y and Z displacements of each reflection grating RG of the two beams $LB_1$ and $LB_2$ and a phase difference (KΔL) due to optical path difference ΔL of the two beams $LB_1$ and $LB_2$, as in formula (16) below.

$$\phi=K\Delta L+4\pi(n_b-n_a)\Delta Y/p+2K\Delta Zf(\theta_{a0},\theta_{a1},\theta_{b0},\theta_{b1})+\phi_0 \quad (16)$$

Here, formulas (12) and (14) were used. Incidentally, a geometric factor, which is to be decided from the placement of reflection mirrors R1a, R1b, R2a, and R2b and the diffraction conditions, was expressed as in formula (17) below.

$$f(\theta_{a0},\theta_{a1},\theta_{b0},\theta_{b1})=\cos\theta_{b1}+\cos\theta_{b0}-\cos\theta_{a1}-\cos\theta_{a0} \quad (17)$$

Further, a constant phase term, which is to be decided by other factors (e.g., a definition of the reference position of displacements ΔL, ΔY, and ΔZ), was expressed as φ0.

In this case, the encoder is to be configured so as to satisfy optical path difference ΔL=0 and a symmetry shown in the following formula (18).

$$\theta_{a0}=\theta_{b0}, \theta_{a1}=\theta_{b1} \quad (18)$$

In such a case, inside the parenthesis of the third term on the right-hand side of formula (16) becomes zero, and also at the same time $n_b=-n_a$ (=n), therefore, the following formula (19) can be obtained.

$$\phi_{sym}(\Delta Y)=2\pi\Delta Y/(p/4n)+\phi_0 \quad (19)$$

From formula (19) above, it can be seen that phase difference $\phi_{sym}$ is not dependent on wavelength λ of the light. And, it can be seen that intensity I of the interference light repeats strong and weak intensities each time displacement ΔY is increased or decreased by a measurement unit (also referred to as a measurement pitch) of p/4n. Therefore, the number of times is measured of the strong and weak intensities of the interference light that accompanies displacement ΔY from a predetermined reference position. And, from counter value (count value) $c_{\Delta Y}$, measurement value $C_{\Delta Y}$ of displacement $\Delta Y$ is obtained as in the following formula (20).

$$C_{\Delta Y}=(p/4n)\times c_{\Delta Y} \quad (20)$$

Furthermore, by splitting a sinusoidal intensity change of the interference light using an interpolation instrument (an interpolator), its phase $\phi'$ ($=\phi_{sym}\% 2\pi$) can be measured. In this case, measurement value $C_{\Delta Y}$ of displacement $\Delta Y$ is computed according to the following formula (21).

$$C_{\Delta Y}=(p/4n)\times\{c_{\Delta Y}+(\phi'-\phi_0)/2\pi\} \quad (21)$$

In this case, constant phase term $\phi_0$ is to be a phase offset (however, $0\leq\phi_0<2\pi$), and phase $\phi_{sym}$ ($\Delta Y=0$) at the reference position of displacement $\Delta Y$ is to be kept.

As it can be seen from the description so far above, by using an interpolation instrument together, displacement $\Delta Y$ can be measured at a measurement resolution whose measurement unit is ($p/4n$) or under. The measurement resolution in this case is decided from a discretization error (also referred to as a quantization error) determined from a split unit of phase $\phi'$, an interpolation error due to a shift of an intensity change $I(\Delta Y)=I(\phi_{sym}(\Delta Y))$ of the interference light from an ideal sinusoidal waveform according to displacement $\Delta Y$, or the like. Incidentally, because the discretization unit of displacement $\Delta Y$ is, for example, one in several thousand of measurement unit ($p/4n$), which is sufficiently small about 0.1 nm, measurement value $C_{\Delta Y}$ of the encoder will be regarded as a continuous quantity unless it is noted otherwise.

Meanwhile, when wafer stage WST moves in a direction different from the Y-axis direction and a relative displacement occurs between Y head 64 and Y scale $39Y_2$ in a direction besides the measurement direction, a measurement error occurs in Y encoder 70C. In the description below, a generation mechanism of a measurement error will be considered, based on the measurement principle of the encoder described above.

Figure 14A:
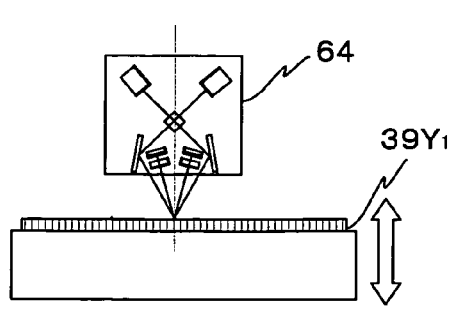
FIG. 14A is a view showing a case when a measurement value does not change even if a relative movement in a direction besides the measurement direction occurs between a head of an encoder and a scale.
Figure 14B:
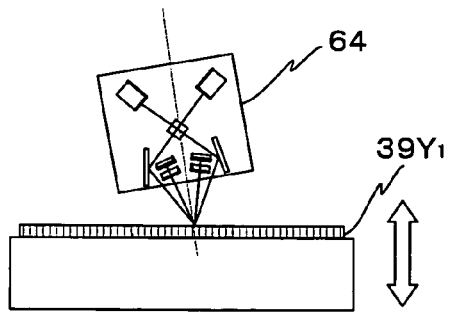
FIG. 14B is a view showing a case when a measurement value changes when a relative movement in a direction besides the measurement direction occurs between a head of an encoder and a scale.

As a simple example, the change of phase difference $\phi$ indicated by formula (16) above in the two cases shown in FIGS. 14A and 14B will be considered. First of all, in the case of FIG. 14A, the optical axis of head 64 coincides with the Z-axis direction (head 64 is not inclined). Assuming that wafer stage WST is displaced in the Z-axis direction ($\Delta Z\neq 0$, $\Delta Y=0$). In this case, because there are no changes in optical path difference $\Delta L$, there are no changes in the first term on the right-hand side of formula (16). The second term becomes zero, according to a supposition $\Delta Y=0$. And, the third term becomes zero because it satisfies the symmetry of formula (18). Accordingly, no change occurs in phase difference $\phi$, and further no intensity change of the interference light occurs. As a consequence, the measurement values of the encoder also do not change.

Meanwhile, in the case of FIG. 14B, the optical axis of head 64 is inclined (head 64 is inclined) with respect to the Z-axis. Assuming that wafer stage WST was displaced in the Z-axis direction from this state ($\Delta Z\neq 0$, $\Delta Y=0$). In this case as well, because there are no changes in optical path difference $\Delta L$, there are no changes in the first term on the right-hand side of formula (16). And, the second term becomes zero, according to supposition $\Delta Y=0$. However, because the head is inclined the symmetry of formula (18) will be lost, and the third term will not become zero and will change in proportion to Z displacement $\Delta Z$. Accordingly, a change occurs in phase difference $\phi$, and as a consequence, the measurement value changes.

Further, although it is omitted in the drawings, in the case wafer stage WST is displaced in a direction perpendicular to the measurement direction (the Y-axis direction) and the optical axis direction (the Z-axis direction), ($\Delta X\neq 0$, $\Delta Y=0$, $\Delta Z=0$), the measurement values do not change as long as the direction in which the grid line of diffraction grating RG faces is orthogonal to the measurement direction, however, in the case the direction is not orthogonal, sensitivity occurs with a gain proportional to the angle.

Next, a case will be considered in which wafer stage WST rotates (the inclination changes), using FIGS. 15A to 15D. First of all, in FIG. 15A, the optical axis of head 64 coincides with the Z-axis direction (head 64 is not inclined). Even if wafer stage WST is displaced in the +Z direction and moves to a condition shown in FIG. 15B from this state, the measurement value of the encoder does not change since the case is the same as in FIG. 14A previously described.

Figure 15A:
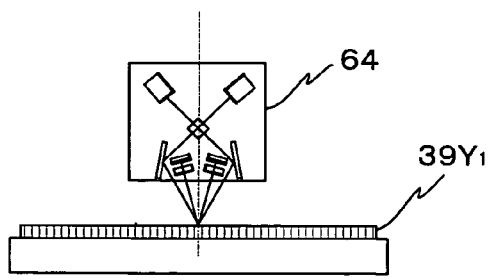
FIGS. 15A to 15D are views used for describing the case when the measurement value of the encoder changes and the case when the measurement value does not change, when a relative movement in a direction besides the measurement direction occurs between the head and the scale.
Figure 15B:
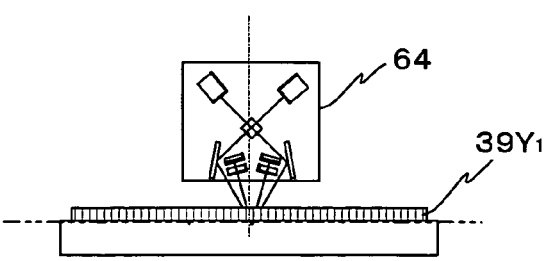
Figure 15C:
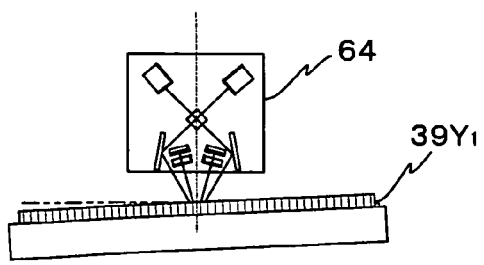

Next, assume that wafer stage WST rotates around the X-axis from the state shown in FIG. 15B and moves into a state shown in FIG. 15C. In this case, even though the head and the scale do not perform relative motion, or more specifically, even though $\Delta Y=\Delta Z=0$, a change occurs in optical path difference $\Delta L$ due to the rotation of wafer stage WST, and therefore the measurement values of the encoder change.

Figure 15D:
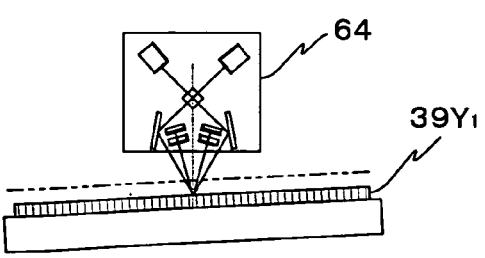

Next, suppose that wafer stage WST moves downward from a state shown in FIG. 15C and moves into a state shown in FIG. 15D. In this case, a change in optical path difference $\Delta L$ does not occur because wafer stage WST does not rotate. However, because the symmetry of formula (18) has been lost, phase difference $\phi$ changes by Z displacement $\Delta Z$ through the third term on the right-hand side of formula (16). Accordingly, the measurement value of the encoder changes.

As other generation factors of measurement errors, temperature fluctuation (air fluctuation) of the atmosphere on the beam optical path can be considered. Phase difference $\phi$ between the two return beams $LB_1$ and $LB_2$ depend on optical path difference $\Delta L$ of the two beams, according to the first term on the right-hand side of formula (16). In this case, assume that wavelength $\lambda$ of the light changes to $\lambda+\Delta\lambda$ by air fluctuation. By minute change $\Delta\lambda$ of this wavelength, the phase difference changes by minute amount $\Delta\phi=2\pi\Delta L\Delta\lambda/\lambda^2$. In this case, when the wavelength of light $\lambda=1$ μm and minute change $\Delta\lambda=1$ nm, then phase change $\Delta\phi=2\pi$ with respect to optical path difference $\Delta L=1$ mm. This phase change is equivalent to 1 when it is converted into a count value of the encoder. Further, when it is converted into displacement, it is equivalent to $p/2$ ($n_b-n_a$). Accordingly, if $n_b=-n_a=1$, in the case of $p=1$ μm, a measurement error of 0.25 μm will occur.

In the actual encoder, because the optical path length of the two beams which are made to interfere is extremely short, wavelength change $\Delta\lambda$ due to the air fluctuation is extremely small. Furthermore, optical path difference $\Delta L$ is designed to be approximately 0, in an ideal state where the optical axis is orthogonal to the reflection surface. Therefore, the measurement errors due to the air fluctuation can be substantially ignored. The fluctuation is remarkably small when compared with the interferometer, and is superior in short-term stability.

As key factors of measurement errors of the encoder, errors which are caused by an uneven scale surface, or mechanical deformation of the diffraction grating and the like can be given. With the passage of use time and also thermal expansion or the like, the surface is deformed in the scale of the encoder, or the pitch of the diffraction grating is changed partially or entirely. Therefore, the encoder has a tendency in which measurement errors grow larger with the passage of use time, and lacks in long-term stability.

Therefore, after having performed pre-processing to correct these main errors beforehand, the encoder is used in position measurement of wafer stage WST which is executed during the actual processing of a lot.

Main controller 20 by all means monitors the measurement values of a total of at least three encoders, which are encoders 70A and 70C, and at least one of encoders 70B and 70D in the effective stroke range of wafer stage WST, and computes the position coordinate of wafer stage WST. Then, by controlling each motor that configures stage drive system 124 according to the position coordinate which has been calculated, wafer stage WST can be driven with high precision.

Now, a method to compute the position coordinate of wafer stage WST from the measurement values of the three encoders which are monitored will be described, using FIGS. 16A and 16B. In this case, for the sake of simplicity, the degrees of freedom of the movement of wafer stage WST will be three (X, Y, θz).

Figure 16A:
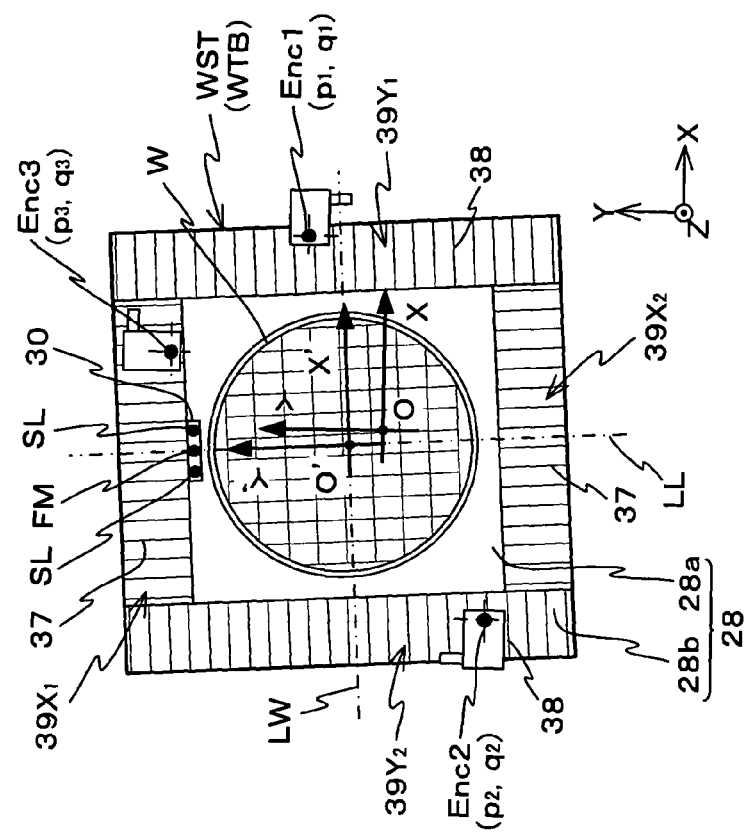
FIGS. 16A and 16B are views for explaining a concrete method to convert a measurement value of the encoder into a position of wafer stage WST.

FIG. 16A shows a reference state where wafer stage WST is at the origin of coordinates (X, Y, θz)=(0, 0, 0). From this reference state, wafer stage WST is driven within a range where encoders (Y heads) Enc1 and Enc2 and encoder (X head) Enc3 do not move away from the scanning areas of their opposing scales $39Y_1$ and $39Y_2$ and $39X_1$. The state where wafer stage WST is moved to position (X, Y, θz) in the manner described above is shown in FIG. 16B. However, the setting position (X, Y) of encoders Enc1, Enc2, and Enc3 on the XY coordinate system are to be $(p_1, q_1)$, $(p_2, q_2)$, and $(p_3, q_3)$, respectively.

The X head and the Y head respectively measure the relative distance from central axes LL and LW of wafer stage WST. Accordingly, measurement values $C_X$ and $C_Y$ of the X head and the Y head can be expressed, respectively, as in the following formulas (22a) and (22b).

$$C_X = r' \cdot ex' \tag{22a}$$

$$C_Y = r' \cdot ey' \tag{22b}$$

In this case, ex' and ey' are X' and Y' unit vectors in a relative coordinate system (X', Y', θz') set on wafer stage WST, and have a relation as in the following formula (23) with X and Y unit vectors ex and ey in the reference coordinate system (X, Y, θz).

$$\begin{pmatrix} ex' \\ ey' \end{pmatrix} = \begin{pmatrix} \cos\theta z & \sin\theta z \\ -\sin\theta z & \cos\theta z \end{pmatrix} \begin{pmatrix} ex \\ ey \end{pmatrix} \tag{23}$$

Further, r' is a position vector of the encoder in the relative coordinate system, and r' is given r'=r−(O'−O), using position vector r=(p, q) in the reference coordinate system. Accordingly, formulas (22a) and (22b) are rewritten as in formulas (24a) and (24b) below.

$$C_X = (p-X)\cos\theta z + (q-Y)\sin\theta z \tag{24a}$$

$$C_Y = -(p-X)\sin\theta z + (q-Y)\cos\theta z \tag{24b}$$

Figure 16B:
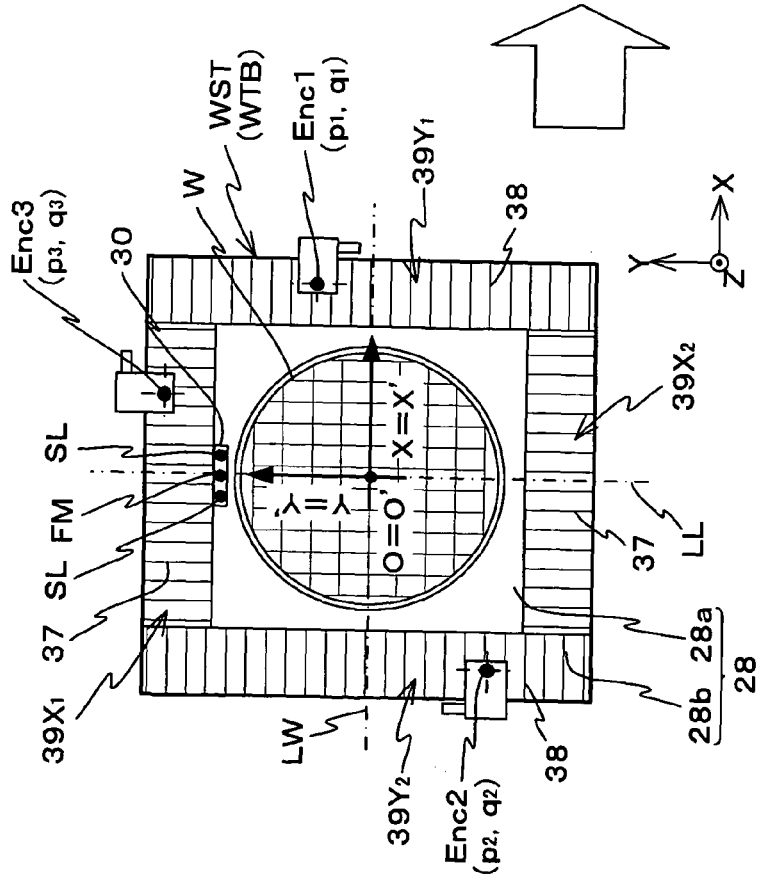

Accordingly, when wafer stage WST is located at the coordinate (X, Y, θz) as shown in FIG. 16B, the measurement values of three encoders can be expressed theoretically as in the next formulas (25a) to (25c).

$$C_1 = -(p_1-X)\sin\theta z + (q_1-Y)\cos\theta z \tag{25a}$$

$$C_2 = -(p_2-X)\sin\theta z + (q_2-Y)\cos\theta z \tag{25b}$$

$$C_3 = (p_3-X)\cos\theta z + (q_3-Y)\sin\theta z \tag{25c}$$

Incidentally, in the reference state shown in FIG. 16A, according to simultaneous equations (25a) to (25c), then $C_1=q_1$, $C_2=q_2$, and $C_3=p_3$. Accordingly, in the reference state, if the measurement values of the three encoders Enc1, Enc2, and Enc3 are initialized to $q_1$, $q_2$, and $p_3$ respectively, then the three encoders will show theoretical values given by formulas (25a) to (25c) with respect to displacement (X, Y, θz) of wafer stage WST from then onward.

In simultaneous equations (25a) to (25c), three formulas are given to the three variables (X, Y, θz). Accordingly, on the contrary, if dependent variables $C_1$, $C_2$, and $C_3$ are given in the simultaneous equations (25a) to (25c), variables X, Y, and θz can be obtained. In this case, when approximation sin θz≈θz is applied, or even if an approximation of a higher order is applied, the equations can be solved easily. Accordingly, the position of wafer stage WST (X, Y, θz) can be computed from measurement values $C_1$, $C_2$, and $C_3$ of the encoder.

Figure 17A:
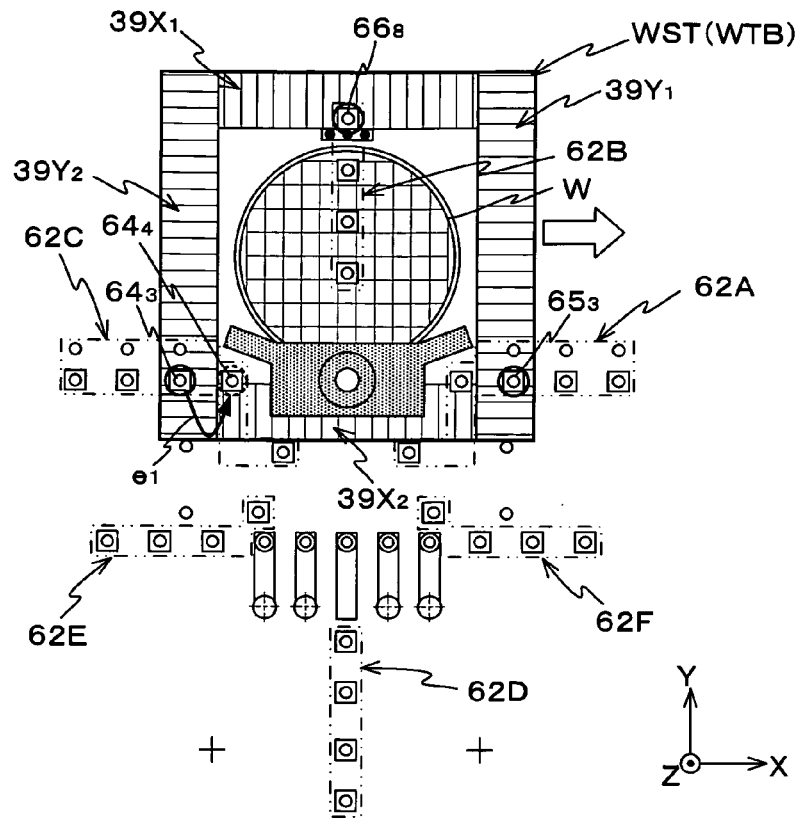
FIGS. 17A and 17B are views for explaining position measurement of a wafer table in an XY plane by an encoder, which is configured of a plurality of heads placed in the shape of an array, and a switching between the heads.
Figure 17B:
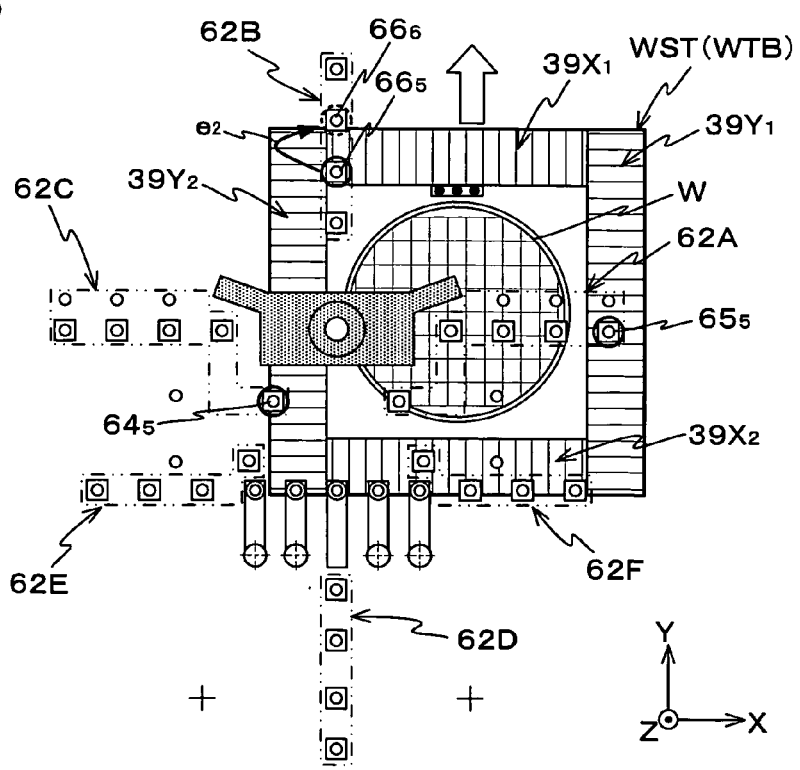

In exposure apparatus 100 of the embodiment, as exemplified in FIGS. 17A and 17B, in the effective stroke range (a range where the stage moves for alignment and exposure operation) of wafer stage WST, Y scales and Y heads are placed so that Y scales $39Y_1$ and $39Y_2$ each have at least one Y head (65, 64, 68 or 67) facing the scales without fail. And, X scales and X heads are placed so that at least one of X scales $39X_1$ and $39X_2$ has at least one X head 66 facing the scale. Accordingly, at least three heads are placed to simultaneously face the corresponding X scales and Y scales. Incidentally, in FIGS. 17A and 17B, the heads which face the corresponding X scales and Y scales are shown surrounded in a circle.

In this case, when main controller 20 drives wafer stage WST in the +X direction as is shown by an outlined arrow in FIG. 17A, main controller 20 switches Y head 64, for example, as shown by an arrow $e_1$ in the drawing, from Y head $64_3$ surrounded in a circle with a solid line to head $64_4$ surrounded in a circle with a dotted line. As is described, Y head 64 is sequentially switched to the next head, with the movement of wafer stage WST in the X-axis direction. Incidentally, because the encoder detects relative displacement, in order to compute absolute displacement (more specifically, the position) a position which will be a reference has to be set. Therefore, on the switching of the heads, the position of an operating head is computed and is initialized as a reference position. The initial setting will be explained later in detail.

Further, in the case main controller 20 drives wafer stage WST in the +Y direction as is shown by an outlined arrow in FIG. 17B, main controller 20 switches X head 66, for example, as shown by an arrow $e_2$ in the drawing, from head $66_5$ surrounded in a circle with a solid line to head $66_6$ surrounded in a circle with a dotted line. As is described, X head 66 is sequentially switched to the next head, with the movement of wafer stage WST in the Y-axis direction. On this head switching, the position of an operating head is computed and is initialized as a reference position.

The switching procedure of the encoder heads will now be described here, based on FIGS. 18A to 18E, with the switching from Y heads $64_3$ to $64_4$ shown by arrow $e_1$ in FIG. 17A serving as an example.

Figure 18A:
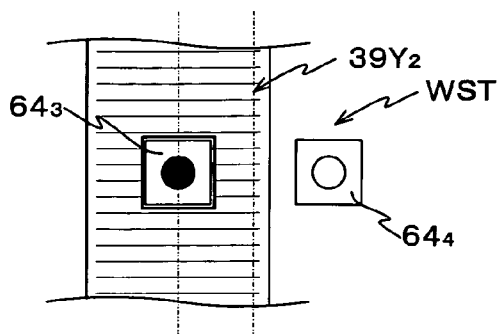
FIGS. 18A to 18E are views for explaining a procedure of an encoder switching.

FIG. 18A shows a state before the switching. In this state, Y head $64_3$ facing the scanning area (the area where the diffraction grating is arranged) on Y scale $39Y_2$ is operating, and Y head $64_4$ which has moved away from the scanning area is suspended. The operating head is indicated here, using a solid black circle, and the suspended head is indicated by an outlined circle. Then, main controller 20 monitors the measurement values of Y head $64_3$ which is operating. The head whose measurement values are monitored, here, is shown in a double rectangular frame.

Figure 18B:
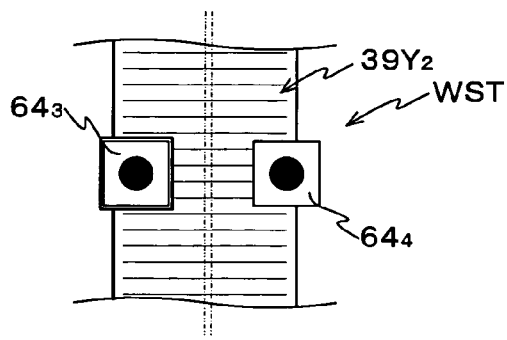

Then, when wafer stage WST moves in the +X direction, Y scale $39Y_2$ is displaced in a direction to the right. In this case, in the embodiment, as is previously described, the distance between the Y heads is set smaller than the effective width (width of the scanning area) of Y scale $39Y_2$ in the X-axis direction. Accordingly, as shown in FIG. 18B, a state occurs where both Y heads $64_3$ and $64_4$ face the scanning area of Y scale $39Y_2$. Therefore, main controller 20 makes sure that Y head $64_4$, which is suspended, has faced the scanning area along with Y head $64_3$ that is operating, and then activates the suspended Y head $64_4$. However, main controller 20 does not yet start monitoring the measurement values at this point.

Figure 18C:
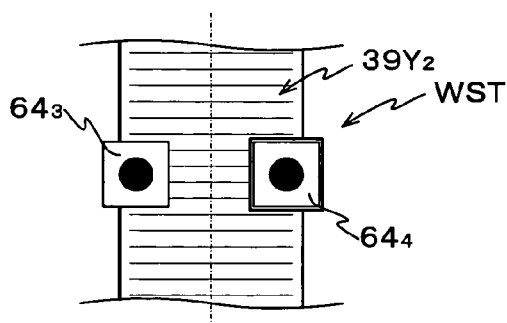

Next, as shown in FIG. 18C, while Y head $64_3$, which will be suspended later, faces the scanning area, main controller 20 computes a reference position of Y head $64_4$, which has been restored, from the measurement values of the active encoder heads including Y head $64_3$. Then, main controller 20 sets up the reference position as an initial value of the measurement values of Y head $64_4$. Incidentally, details on the computation of the reference position and the setting of the initial value will be described later in the description.

Figure 18D:
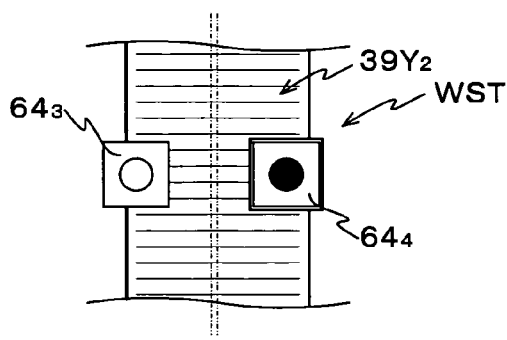
Figure 18E:
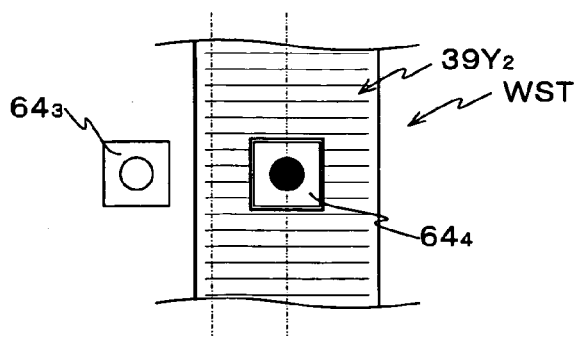

Main controller 20 switches the encoder head whose measurement values are monitored from Y head $64_3$ to Y head $64_4$ simultaneously with the setting of the initial value above. After the switching has been completed, main controller 20 suspends the operation of Y head $64_3$ before it moves off the scanning area as shown in FIG. 18D. By the operation described above, all the operations of switching the encoder heads are completed, and hereinafter, as shown in FIG. 18E, the measurement values of Y head $64_4$ are monitored by main controller 20.

In the embodiment, the distance between adjacent Y heads 65 and the distance between adjacent Y heads 64 that head units 62A and 62C respectively have are, for example, 70 mm (with some exceptions), and are set smaller than the effective width (e.g. 76 mm) of the scanning area of Y scales $39Y_1$ and $39Y_2$ in the X-axis direction. Further, for example, the distance between adjacent X heads 66 that head units 62B and 62D respectively have is, for example, 70 mm (with some exceptions), and is set smaller than the effective width (e.g. 76 mm) of the scanning area of X scales $39X_1$ and $39X_2$ in the Y-axis direction. Accordingly, the switching operation of Y heads 65 or 64 and X heads 66 can be performed smoothly as in the description above.

Incidentally, the range in which both adjacent heads face the scale, or more specifically, the moving distance of wafer stage WST from a state shown in FIG. 18B to a state shown in FIG. 18D, for example, is 6 mm. And at the center, or more specifically, when wafer stage WST is located at the position shown in FIG. 18C, the head that monitors the measurement values is switched. This switching operation is completed by the time the head which is to be suspended moves off the scanning area, or more specifically, while wafer stage WST moves in an area by a distance of 3 mm during the state shown in FIG. 18C until the state shown in FIG. 18D. For example, in the case the movement speed of the stage is 1 m/sec, then the switching operation of the head is to be completed within 3 msec.

Next, the linkage process when the encoder head is switched, or more specifically, the initial setting of the measurement values will be described, focusing mainly on the operation of main controller 20.

In the embodiment, as is previously described, in the effective stroke range of wafer stage WST, three encoders (the X heads and the Y heads) constantly observe the movement of the stage so as to detect positional information of wafer stage WST within the XY plane. Accordingly, when the switching process of the encoder is performed, wafer stage WST will be observed in four encoder Enc1 to Enc4 which added the fourth encoder (a Y head) Enc4 as shown in FIG. 19.

Figure 19:
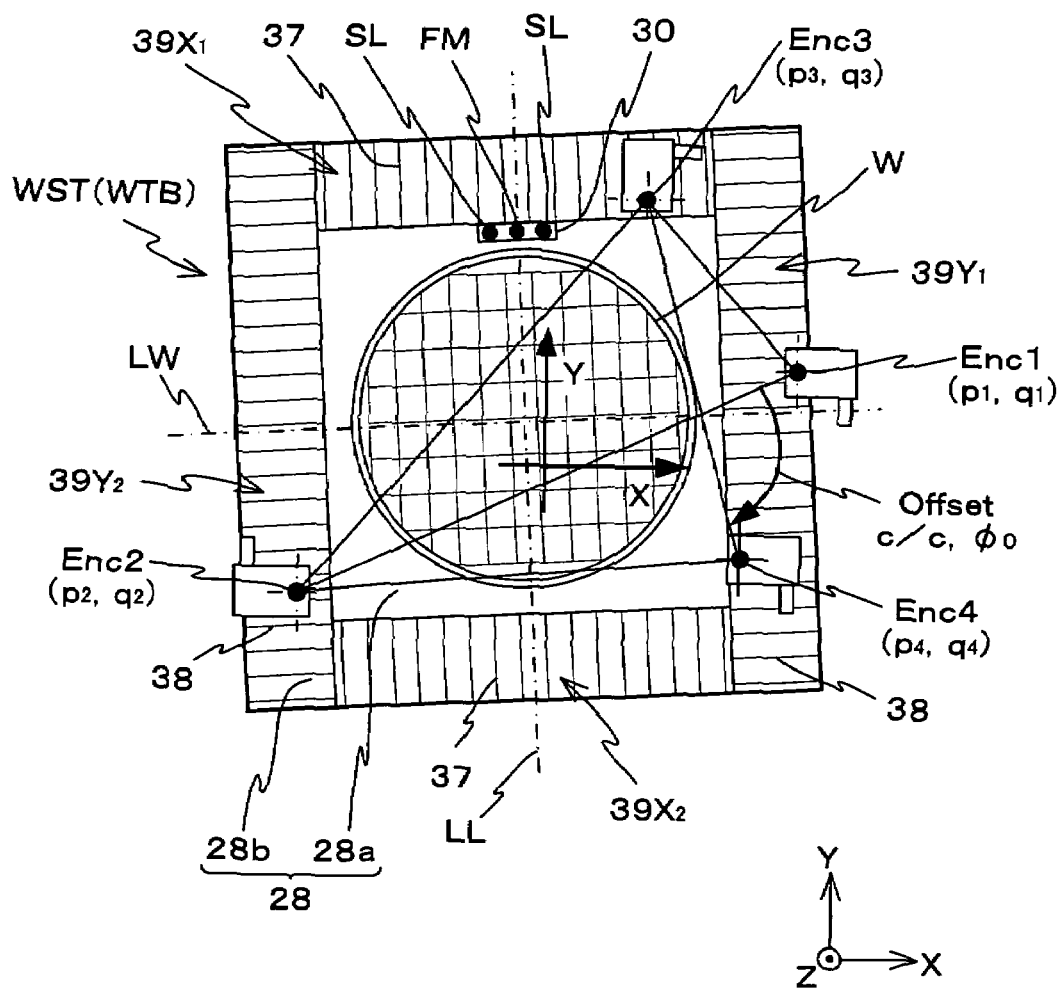
FIG. 19 is a view for explaining the switching process of the encoder used in position control of the wafer stage in the XY plane.

In the switching state of the encoder shown in FIG. 19, encoders Enc1, Enc2, Enc3 and Enc4 are located above scales $39Y_1$, $39Y_2$, $39X_1$, and $39Y_1$, respectively. When having a look, it looks as though the encoder is going to be switched from encoder Enc1 to encoder Enc4. However, as is obvious from the fact that the position in the Y-axis direction, which is the measurement direction, is different in encoder Enc1 and encoder Enc4, it does not have any meaning even if the measurement values of encoder Enc1 are set without any changes as the initial value of the measurement values of encoder Enc4 at the timing when the switching is performed.

Therefore, in the embodiment, main controller 20 is made to switch from position measurement of wafer stage WST by the three encoders Enc1, Enc2 and Enc3 to position measurement by the three encoders Enc2, Enc3 and Enc4, as shown in FIG. 19. In this switching method, the switching is performed not from switching from one head to another head, but from switching from a combination of three heads (encoders) to a combination of another three heads (encoders).

On the switching, first of all, main controller 20 solves the simultaneous equations (25a) to (25c) using measurement values $C_1$, $C_2$, and $C_3$ of encoders Enc1, Enc2, and Enc3, and computes the position coordinate (X, Y, θz) of wafer stage WST within the XY plane. Next, by using the position coordinate calculated here, main controller 20 obtains theoretical value $C_4$ from the following theoretical formula (25d) which the measurement value of encoder (a Y head) Enc4 follows.

$$C_4 = -(p_4 - X)\sin \theta z + (q_4 - Y)\cos \theta z \qquad (25d)$$

In this case, $p_4$ and $q_4$ are the X and Y setting positions of encoder Enc4. Then, theoretical value $C_4$ is set as an initial value of encoder Enc4. However, as is had been explained with formula (19), because the measurement values of the encoder are discretized, theoretical value $C_4$ is converted into a discrete value by a unit of measurement unit $\delta(=p/4n)$, or more specifically, into count value $c_4 = \text{int}(C_4/\delta)$, and is set as the initial value of encoder Enc4. However, int(x/y)=[x−x % y]/y. The handling of remainder $C_4 \% \delta$ will be described later on.

By the linkage process described above, the switching operation of the encoder is completed while having maintained the results (X, Y, θz) of position measurement of wafer stage WST. From then onward, the following simultaneous equations (25b) to (25d) are solved, using the measurement values $C_2$, $C_3$, and $C_4$ of encoders Enc2, Enc3, and Enc4 which are used after the switching, and a position coordinate (X, Y, θz) of wafer stage WST is computed.

$$C_2 = -(p_2 - X)\sin \theta z + (q_2 - Y)\cos \theta z \qquad (25b)$$

$$C_3 = (p_3 - X)\cos \theta z + (q_3 - Y)\sin \theta z \qquad (25c)$$

$$C_4 = -(p_4 - X)\sin \theta z + (q_4 - Y)\cos \theta z \qquad (25d)$$

Incidentally, in the case the fourth encoder is an X head, instead of using theoretical formula (25d), a simultaneous equation (25b) (25c) (25e), which uses the following theoretical formula (25e) can be used.

$$C_4 = (p_4 - X)\cos \theta z + (q_4 - Y)\sin \theta z \qquad (25e)$$

However, various measurement errors are included in the actual measurement values (raw measurement values) of the encoders. Therefore, main controller 20 shows the value whose error has been corrected as measurement value $C_4$. Accordingly, in the linkage process described above, main controller 20 uses stage position induced error correction information and/or correction information on the grating pitch of the scale (and correction information on the grating deformation) and the like, and performs an inverse correction of theoretical value $C_4$ obtained from formula (25d) or formula (25e) and computes raw value $C_4'$ before correction, and then sets raw value $C_4'$ as the initial value of the measured value of encoder Enc4.

In the linkage process of the encoder, or more specifically, on computing and setting initial value $C_4$ of the fourth encoder, an error can occur. When exposure of all the shot areas on the wafer is actually performed, the switching of the encoder will be performed, for example, around 100 times. Accordingly, even if the error which occurs in one linkage process is small enough to ignore, the errors may be accumulated by repeating the switching many times, and may come to exceed a permissible level. Incidentally, assuming that the errors occur at random, the cumulative error which occurs by performing the switching 100 times is around 10 times the error which occurs when the switching is performed once. Accordingly, the precision of the linkage process must be improved as much as possible.

Therefore, the following two linkage methods, or more specifically, the coordinate linkage method and the phase linkage method will be introduced.

In the coordinate linkage method, first of all, from measurement values $C_1$, $C_2$, and $C_3$ of the three encoders Enc1, Enc2 and Enc3 before the switching, the position coordinate $(X, Y, \theta z)$ of wafer stage WST is computed via simultaneous equation (25a) to (25c). From the position coordinates, measurement value $C_4$ of the fourth encoder Enc4 is predicted via formula (25d) (or formula (25e)). And this initial value $C_4$ is converted into a discrete value of measurement unit $\delta$, or more specifically, into $\delta Xc_4$ (in this case, $C_4$ is a count value). Then, the position coordinate is calculated back, by substituting sum $\delta xc_4 + dC_4$ of the discrete value and minute amount $dC_4$ into $C_4$ on the left-hand side of formula (25d) (or formula (25e)) and solving the simultaneous equations (25b) to (25d) (or, simultaneous equations (25b) (25c) (25e)). However, measurement values $C_2$ and $C_3$ are in common with the preceding ones. Minute amount $dC_4$ is decided so that position coordinates $(X', Y', \theta z')$ obtained here coincide with position coordinates $(X, Y, \theta z)$ which have been obtained earlier. Then, discrete value $\delta xc_4$ (count value $c_4$) is set in the fourth encoder Enc4 as the initial value. At the same time, a phase offset is set to $\phi_0 = \phi' - 2\pi dC_4/\delta$ so as to correct phase $\phi'$ to phase $2\pi dC_4/\delta$, which corresponds to minute amount $dC_4$. In this case, minute amount $dC_4$ can be different from remainder $C_4 \% \delta$ due to computation errors or the like of the position coordinate of wafer stage WST using the simultaneous equations (25b) to (25d) (or, simultaneous equations (25b) (25c) (25e)).

In the coordinate linkage method, according to its principle, the position coordinate of wafer stage WST that has been computed is stored without fail before and after the switching of the encoder. However, it makes no difference in the error being accumulated each time the linkage process is repeated.

As was explained in detail based on FIGS. 18A to 18E, when the switching process is performed between two adjacent encoders in the same head unit, the switching process is executed while the two encoders simultaneously face the same scale. In this case, from the state where Y head $64_4$, which is the new head to be used, faces Y scale $39Y_2$ as shown in FIG. 18B until the state where Y head $64_3$, which is the head to be suspended later, moves off of Y scale $39Y_2$ as shown in FIG. 18D, there is a section of around 6 mm where the adjacent two heads face the same scale. In this case, the maximum movement speed of wafer stage WST is, for example, 1 m/sec, therefore, the time while the two adjacent heads face the same scale is around 6 msec or more. Therefore, performing the linkage process will be considered while using the switching time to secure sufficient linkage accuracy even if it is as short as around 6 msec, rather than performing the linkage process as soon as the preparations have been completed as is described in the example above.

The procedure will be explained, referring to examples shown in FIGS. 18A to 18E. However, Y head $64_3$ in the drawing corresponds to the first head (the first encoder) Enc1 which will be suspended later on, and Y head $64_4$ corresponds to the fourth head (the fourth encoder) Enc4 which will be newly used. As shown in FIG. 18B, when the fourth encoder Enc4 ($64_4$) faces the scale ($39Y_2$), main controller 20 immediately restores the fourth encoder Enc4 ($64_4$). Then, according to the procedure described above, main controller 20 predicts measurement value $C_4$ of the fourth encoder Enc4 ($64_4$), and provisionally sets an initial value ($C_4$ and $\phi_0$) determined by predicted value $C_4$ in the state shown in FIG. 18C, or more specifically, at a timing when the center of the adjacent two encoders ($64_3$ and $64_4$) is positioned at the center of the scale ($39Y_2$).

Now, in the example previously described, the encoders whose measurement values were monitored to compute the position coordinate of wafer stage WST were immediately switched after setting the initial value (performing the linkage process) from a first combination of Enc1, Enc2, and Enc3 to a second combination of Enc2, Enc3, Enc4. However, in this case, the switching is not yet performed, and prediction of measurement value $C_4$ of the fourth encoder Enc4 is still being performed. Then, main controller 20 obtains a difference $\Delta C_4$, which is a difference of the predicted value and the actual measurement value of the fourth encoder Enc4 in the provisional setting state, and the difference is time-averaged until the initial value of the fourth encoder Enc4 is actually set. Incidentally, as it will be described later on, because the measurement results of the encoder system are monitored at every predetermined time interval in the embodiment, moving average is applied to monitoring results of the predetermined number.

Difference $\Delta C_4$ of the predicted value of measurement value $C_4$ of the fourth encoder Enc4 and the actual measurement value in the provisional setting state ideally takes a zero value, however, it actually becomes nonzero due to various causes of error. Furthermore, because most causes of error occur randomly with respect to time, the value of difference $\Delta C_4$ fluctuates randomly as well with respect to the passage of time. In this case, by taking a time average of difference $\Delta C_4$, an error component is averaged and the random fluctuation becomes smaller. Therefore, main controller 20 takes 6 msec or more of the switching time, and applies time average to difference $\Delta C_4$. Then, after confirming that the fluctuation becomes small enough to be within a permissible level, main controller 20 adds difference $\Delta C_4$ to the provisional predicted value $C_4$ described earlier, and sets the initial values ($C_4$ and $\phi_0$) determined from predicted value $C_4 + \Delta C_4$ as the measurement values of the fourth encoder Enc4. After this main setting is completed, main controller 20 switches the encoders used to compute the position coordinate of wafer stage WST to the second combination Enc2, Enc3, and Enc4. Then, main controller 20 suspends the first encoder Enc1 when it moves off away from the corresponding scale. This completes the switching process.

In the case of the other method, or the phase linkage method, the basics procedure is the same as the coordinate linkage method described earlier, however, the handling of the phase offset is different. In the coordinate linkage method, the phase offset to the fourth encoder was set again so that the position coordinate of wafer stage WST matches completely before and after the switching of the encoder. In the phase linkage method, the phase offset will not be reset, and the phase offset which is already set will be continuously used. More specifically, in the phase linkage method, only the count value will be reset. In this case, the position coordinate of wafer stage WST which is computed before and after the switching of the encoder may be discontinuous. However, when the phase offset is set precisely, errors do not occur unless a setting error of the count value occurs. Accordingly, accumulation of errors by the repetition of the linkage process also does not occur. Incidentally, as long as the setting procedure of the count value previously described is followed, the possibility of the setting error occurring is extremely low.

However, even if the phase offset is set precisely once, it may lose its accuracy due to a shift of the setting position of the encoder head and the like occurring. Therefore, after the start-up of exposure apparatus 100, the coordinate linkage method is applied at the time of the first linkage process so as to set the phase offset, and then at the time of the linkage process that follows, the phase linkage method is applied. Then, during an idle state of exposure apparatus 100 or at the beginning of a lot or the like, it is preferable to update the phase offset to the latest value by appropriately performing the coordinate linkage method.

Studies of the inventor(s) and the like have recently revealed that when wafer stage WST is driven in an accelerating manner, the scale is distorted, which causes a measurement error in the encoder. More specifically, when the coordinate linkage method is applied and a phase offset is set during the movement of wafer stage WST in an accelerating manner, a linkage error occurs, which reduces the accuracy of the phase offset. Accordingly, it is not preferable to apply the coordinate linkage method and to set the phase offset at the time of linkage process which occurs during the movement of wafer stage WST in an accelerating manner. Therefore, for example, at the time of start up, during an idle state of exposure apparatus 100, or at the beginning of a lot or the like, a sequence is to be performed to update the phase offset for of all or a part of the encoders (heads). However, in this sequence, the coordinate linkage method is to be performed by driving wafer stage WST at a constant speed or having positioned wafer stage WST at the linkage position without fail, so that an accurate phase offset is set. Then, by switching the encoders by applying the phase linkage method at the time of exposure and at the time of alignment measurement, it becomes possible to constantly secure position measurement of wafer stage WST with high precision.

Now, in the embodiment, the position coordinate of wafer stage WST is controlled by main controller 20 at a time interval of, for example, 96 μsec. At each control sampling interval, a position servo control system (a part of main controller 20) updates the current position of wafer stage WST, computes thrust command values and the like to position the stage to a target position, and outputs the values. As previously described, the current position of wafer stage WST is computed from the measurement values of the interferometers or the encoders.

Now, as is previously described, intensity of the interference light is measured with the interferometer and the encoder. The measurement values are forwarded to main controller 20. Main controller 20 counts the number of times of intensity change of the interference light (more specifically, the number of fringes of the interference light). And from the counter value (count value), the position of wafer stage WST is computed. Accordingly, main controller 20 monitors the measurement values of the interferometer and the encoder at a time interval (measurement sampling interval) much shorter than the control sampling interval so as not to lose track of the fringes.

Therefore, in the embodiment, main controller 20 constantly continues to receive the measurement values by a discharge from all the encoders (not always three) that face the scanning area of the scales, while wafer stage WST is within the effective stroke range. And, main controller 20 performs the switching operation of the encoders described above (a linkage operation between a plurality of encoders) in synchronization with position control of wafer stage WST which is performed at each control sampling interval. In such an arrangement, an electrically high-speed switching operation of the encoder will not be required, which also means that costly hardware to realize such a high-speed switching operation does not necessarily have to be arranged.

Figure 20:
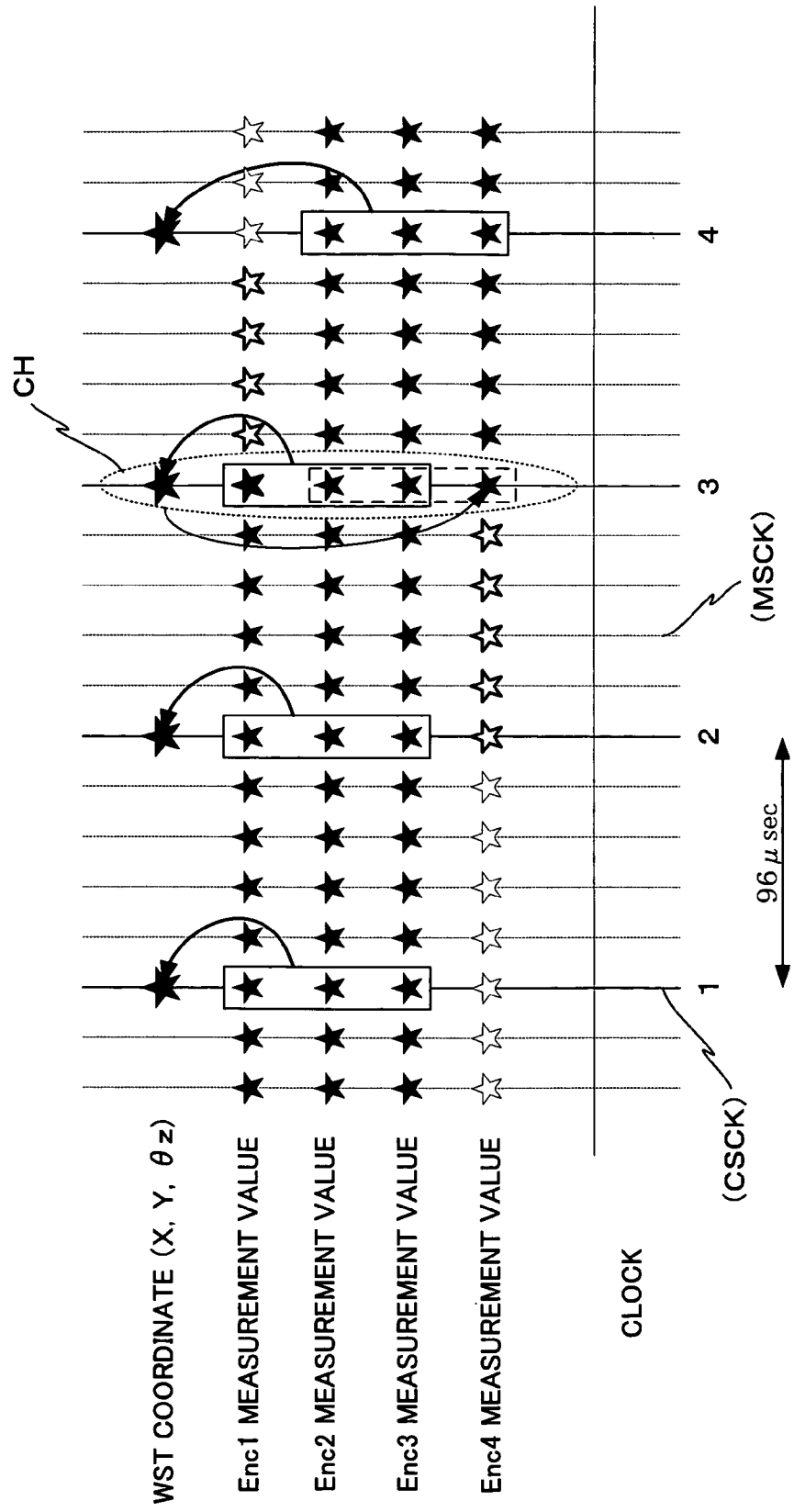
FIG. 20 is a view conceptually showing position control of the wafer stage, intake of the measurement value of the encoder, and an encoder switching timing.

FIG. 20 conceptually shows the timing of position control of wafer stage WST, the uptake of the measurement values of the encoder, and the switching of the encoder in the embodiment. Reference code CSCK in the drawing indicates the generation timing of a sampling clock (a control clock) of the position control of wafer stage WST, and reference code MSCK indicates a generation timing of a sampling clock (a measurement clock) of the measurement of the encoder (and interferometer). Further, reference code CH typically shows the switching (linkage) process of the encoder described in detail in FIGS. 18A to 18E.

Main controller 20 executes the switching of the encoder (head) by dividing the operation into two stages; the restoration and the linkage process of the encoder. When describing the switching according to an example shown in FIG. 20, first of all, the encoders which are operating at the time of the first control clock are the three encoders of the first combination, Enc1, Enc2 and Enc3. Main controller 20 monitors the measurement value of these encoders, and computes the position coordinate (X, Y, θz) of wafer stage WST. Next, according to the position coordinate of wafer stage WST, main controller 20 confirms all the encoders which are on the scanning area of the X scales and the Y scales. And, from the encoders, main controller 20 specifies encoder Enc4 which needs restoration, and restores the encoder at the time of the second control clock. At this point in the process, the number of operating encoders becomes four. And, from the operating encoders, main controller 20 specifies the encoder whose measurement values are to be monitored to compute the position coordinate of wafer stage WST at the time of the next control clock, according to the position coordinate of wafer stage WST. Assume that the second combination Enc2, Enc3 and Enc4 are specified here. Main controller 20 confirms whether this specified combination matches the combination that was used to compute the position coordinate of wafer stage WST at the time of the previous control clock. In this example, encoder Enc1 in the first combination and encoder Enc4 in the second combination are different. Therefore, a linkage process CH to the second combination is performed at the time of the third control clock. Hereinafter, main controller 20 monitors the measurement values of the second combination Enc2, Enc3 and Enc4, and computes the position coordinate (X, Y, θz) of wafer stage WST. As a matter of course, linkage process CH is not performed if there is no change in the combination. Encoder Enc1 which is removed from the monitoring subject, is suspended at the time of the fourth control clock when encoder Enc1 moves off from the scanning area on the scale.

Main controller 20 performs scheduling of the encoder switching process for each shot map (exposure map), and stores the results in memory 34. Accordingly, if there is no retry (redoing), then the contents of the schedule in every shot map becomes constant. However, in actual practice, because a retry must be considered, it is preferable for main controller 20 to constantly update the schedule slightly ahead while performing the exposure operation.

Incidentally, so far, in order to describe the principle of the switching method of the encoder to be used in position control of wafer stage WST in the embodiment, four encoders (heads) Enc1, Enc2, Enc3 and Enc4 were taken up, however, encoders Enc1 and Enc2 representatively show any of Y heads 65 and 64 of head units 62A and 62C and Y heads 67 and 68 of head units 62E and 62F, encoder Enc3 representatively shows X head 66 of head units 62B and 62D, and encoder Enc4 representatively show any of Y heads 65,64,67, and 68 or X head 66.

Incidentally, in the description so far, in order to simplify the description, while main controller 20 performed the control of each part of the exposure apparatus including the control of the stage, and the switching (linkage) of the interferometer system, the encoder system, and the heads and the like, as a matter of course, at least a part of the control of main controller 20 described above can be performed, shared by a plurality of controllers. For example, a stage controller which performs the control of the stage, the switching (linkage) of the interferometer system, the encoder system and the heads and the like can be arranged to operate under main controller 20.

As discussed in detail above, according to exposure apparatus 100 related to the embodiment, the position (including the θz rotation) of wafer stage WST within the XY plane (movement plane) is measured by three encoders (heads), which at least include one each of an X encoder and a Y encoder of the encoder system. And, by main controller 20, the encoders (heads) used for position measurement of wafer stage WST is switched from the first combination consisting of the three encoders to the second combination consisting of three encoders that has at least one encoder replaced to a different encoder from the previous three encoders according to the movement of wafer stage WST. And, on this switching, by applying the coordinate linkage method and/or the phase linkage method, main controller 20 initially sets the measurement values of the encoder (head) which is to be newly used (initial values of the measurement values are set). Accordingly, when viewing from a level where errors equal to or less than the measurement unit on the setting of the initial values are not taken into consideration, the position coordinates of wafer stage WST computed from the measurement values of the encoder system are stored before and after the switching of the encoders (heads). Although the encoders (heads) used for position measurement of wafer stage WST are constantly switched with the movement of wafer stage WST in this manner, an accurate linkage of the position coordinates of wafer stage WST becomes possible before and after the switching. Accordingly, it becomes possible to move wafer stage WST two-dimensionally accurately, while switching the plurality of encoders.

Especially in the case when main controller 20 sets the initial value of the measurement values of the encoders (heads) to be newly used, using the coordinate linkage method, the position coordinates of the wafer stage can be saved before and after the switching (linkage) of the encoders.

Meanwhile, in the case when main controller 20 sets the initial value of the measurement values of the encoders (heads) to be newly used, using the phase linkage method, accumulation of errors can be prevented even if the linkage process is repeated. Therefore, at the time of start up, during an idle state of exposure apparatus 100, or at the beginning of a lot or the like, a sequence is performed to update the phase offset for of all or a part of the encoders (heads). However, in this sequence, the coordinate linkage method is to be performed by driving wafer stage WST at a constant speed or having positioned wafer stage WST at the linkage position without fail, so that an accurate phase offset is set. Then, by switching the encoders by applying the phase linkage method at the time of exposure and at the time of alignment measurement, it becomes possible to constantly secure position measurement of wafer stage WST with high precision.

Further, according to exposure apparatus 100 of the embodiment, because the pattern of reticle R is transferred and formed on each of a plurality of shot areas on wafer W mounted on wafer stage WST which is driven with good precision by the method described above while switching between the plurality of encoders, it becomes possible to form a pattern with good precision on each shot area on wafer W. Especially, in the embodiment, because of the relative movement between illumination light IL, which is irradiated on wafer W via reticle R and projection optical system PL, and wafer W, wafer stage WST is driven with good precision by the method described above while switching between the plurality of encoders. Accordingly, it becomes possible to form a pattern on wafer W with good precision by scanning exposure.

Incidentally, the configuration of each measurement device such as the encoder system described in the embodiment above is only an example, and it is a matter of course that the present invention is not limited to this. For example, in the embodiment above, an example has been described where an encoder system is employed that has a configuration where a grid section (a Y scale and an X scale) is arranged on a wafer table (a wafer stage), and an X head and a Y head facing the grid section is placed external to the wafer stage, however, the present invention is not limited to this, and as is disclosed in, for example, the U.S. Patent Application Publication No. 2006/0227309, an encoder system which is configured having an encoder head arranged on the wafer stage and has a grid section (for example, a two-dimensional grid, or a linear grid section having a two-dimensional placement) facing the encoder heads placed external to the wafer stage can also be adopted. In this case, a Z head can also be arranged on the wafer stage, and the surface of the grid section can be a reflection surface on which the measurement beam of the Z head is irradiated.

Further, in the embodiment above, while the case has been described, for example, where the encoder head and the Z head were arranged separately inside head units 62A and 62C, a single head that has the function of an encoder head and a Z head can be used instead of a set of the encoder head and the Z head.

Incidentally, in the embodiment above, an example was given where an optical encoder by the diffraction interference method is used as the encoder, however, it is a matter of course that the movable body drive method and the movable body drive system related to the present invention can also be applied to a case where an encoder besides the method described above is used. For example, a magnetic encoder can also be used.

Further, in the embodiment above, while the case has been described where position measurement of wafer stage WST is performed by an interferometer system and an encoder system, in the case reticle stage RST moves two-dimensionally as well as the measurement stage, an encoder system having a configuration similar to the encoder system previously described can be arranged furthermore to measure the positional information of reticle stage RST, and the switching of the heads and the linkage can be performed in a procedure similar to the procedure previously described, using the coordinate linkage and/or phase linkage and the like as needed.

Incidentally, in the embodiment above, while the lower surface of nozzle unit 32 and the lower end surface of the tip optical element of projection optical system PL were substantially flush, as well as this, for example, the lower surface of nozzle unit 32 can be placed nearer to the image plane (more specifically, to the wafer) of projection optical system PL than the outgoing surface of the tip optical element. That is, the configuration of local liquid immersion device 8 is not limited to the configuration described above, and the configurations can be used, which are described in, for example, EP Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), the pamphlet of International Publication No. 2004/086468 (the corresponding U.S. Patent Application Publication No. 2005/0280791), Kokai (Japanese Unexamined Patent Application Publication) No. 2004-289126 (the corresponding U.S. Pat. No. 6,952,253), and the like. Further, as disclosed in the pamphlet of International Publication No. 2004/019128 (the corresponding U.S. Patent Application Publication No. 2005/0248856), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as H+, Cs+, K+, Cl−, SO42−, or PO42− to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a sensitive agent (or a protection film (top coat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery device, a recovery pipe or the like.

Incidentally, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

Further, in the embodiment above, the case has been described where the present invention is applied to a scanning exposure apparatus by a step-and-scan method or the like. However, the present invention is not limited to this, but may also be applied to a static exposure apparatus such as a stepper. Even with the stepper or the like, by measuring the position of a stage on which an object subject to exposure is mounted by encoders, generation of position measurement error caused by air fluctuations can substantially be nulled likewise. In this case, it becomes possible to set the position of the stage with high precision based on correction information used to correct short-term fluctuation of the measurement values of the encoders using the measurement values of the interferometers and based on the measurement values of the encoders, and as a consequence, highly accurate transfer of a reticle pattern onto the object can be performed. Further, the present invention can also be applied to a reduction projection exposure apparatus by a step-and-stitch method that synthesizes a shot area and a shot area, an exposure apparatus by a proximity method, a mirror projection aligner, or the like. Furthermore, the present invention can also be applied to a multi-stage type exposure apparatus equipped with a plurality of wafer stages, as is disclosed in, for example, Kokai (Japanese Unexamined Patent Application Publication) No. 10-163099 and No. 10-214783 (the corresponding U.S. Pat. No. 6,590,634), Kohyo (published Japanese translation of International Publication for Patent Application) No. 2000-505958 (the corresponding U.S. Pat. No. 5,969,441), the U.S. Pat. No. 6,208,407, and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, exposure area IA may also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, and can also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the sources above, as is disclosed in, for example, the pamphlet of International Publication No. 99/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, as is disclosed in, for example, the pamphlet of International Publication No. 01/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns on a wafer via a projection optical system and almost simultaneously performs double exposure of one shot area by one scanning exposure, as is disclosed in, for example, Kohyo (published Japanese translation of International Publication for Patent Application) No. 2004-519850 (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body drive method and the movable body drive system of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus of a sample or a wire bonding apparatus in other precision machines.

Incidentally, the disclosures of the various publications, the pamphlets of the International Publications, and the U.S. Patent Application Publication descriptions and the U.S. patent descriptions that are cited in the embodiment above and related to exposure apparatuses and the like are each incorporated herein by reference.

Semiconductor devices are manufactured through the following steps: a step where the function/performance design of the wafer is performed, a step where a wafer is made using silicon materials, a lithography step where the pattern formed on the reticle (mask) by the exposure apparatus (pattern formation apparatus) in the embodiment previously described is transferred onto a wafer, a development step where the wafer that has been exposed is developed, an etching step where an exposed member of an area other than the area where the resist remains is removed by etching, a resist removing step where the resist that is no longer necessary when etching has been completed is removed, a device assembly step (including processes such as a dicing process, a bonding process, and a packaging process), inspection steps and the like.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body drive method in which a movable body is driven along a predetermined plane including a first axis and a second axis orthogonal to each other, the method comprising:
a first process in which a position coordinate of the movable body is obtained, based on measurement values of three encoder heads among a plurality of first encoder heads whose position in a direction parallel to the second axis is different and a plurality of second encoder heads whose position in a direction parallel to the first axis is different, with the three encoder heads respectively facing three gratings among a pair of first gratings whose periodic direction is in a direction parallel to the first axis and a pair of second gratings whose periodic direction is in a direction parallel to the second axis that are arranged on a surface parallel to the predetermined plane of the movable body, the first gratings and the second gratings being positioned on a top surface of the movable body; and
a second process in which a measurement value of an encoder head to be newly used is set so that the position coordinate is maintained before and after the switching of the encoder head.

2. The movable body drive method according to claim 1 wherein
in the second process, on switching a set of three encoder heads used in position control of the movable body to a different set of three encoder heads including at least one encoder head which is different from the set of three encoder heads, a measurement value of an encoder head to be newly used is to be set.

3. A pattern formation method, comprising:
a process in which an object is mounted on a movable body that can move in a movement plane; and
a process in which the movable body is driven by the movable body drive method according to claim 1, to form a pattern on the object.

4. A device manufacturing method including a pattern formation process, wherein
in the pattern formation process, a pattern is formed on an object using the pattern formation method according to claim 3.

5. An exposure method in which a pattern is formed on an object by an irradiation of an energy beam wherein
for relative movement of the energy beam and the object, a movable body on which the object is mounted is driven, using the movable body drive method according to claim 1.

6. The movable body drive method according to claim 1, wherein the plurality of encoder heads are positioned above the movable body.

7. A movable body drive method in which a movable body is driven along a predetermined plane including a first axis and a second axis orthogonal to each other, the method comprising:
a first process in which a position coordinate of the movable body is obtained, based on measurement values of three encoder heads among a plurality of encoder heads which are placed at an outside of the movable body and whose positions in a plane parallel to the predetermined plane are different, with the three encoder heads respectively facing three scales among four scales, which are placed parallel to the predetermined plane at the movable body, each scale having a grating placed on a top surface of the movable body; and
a second process in which a measurement value of an encoder head to be newly used is set so that the position coordinate is maintained before and after the switching of the encoder head.

8. The movable body drive method according to claim 7, wherein
in at least one of the first process and the second process, measurement values of the three encoder heads among the four encoder heads that respectively face the four scales are used in position control of the movable body.

9. The movable body drive method according to claim 7, wherein
in at least one of the first process and the second process, only the three encoder heads used in position control of the movable body among the four encoder heads individually face the three scales of the four scales.

10. The movable body drive method according to claim 7, wherein
in the second process, on switching a set of three encoder heads used in position control of the movable body to a different set of three encoder heads including at least one encoder head which is different from the set of three encoder heads, a measurement value of an encoder head to be newly used is to be set.

11. A pattern formation method, comprising:
a process in which an object is mounted on a movable body that can move in a movement plane; and
a process in which the movable body is driven by the movable body drive method according to claim 7, to form a pattern on the object.

12. A device manufacturing method including a pattern formation process, wherein
in the pattern formation process, a pattern is formed on an object using the pattern formation method according to claim 11.

13. An exposure method in which a pattern is formed on an object by an irradiation of an energy beam, wherein
for relative movement of the energy beam and the object, a movable body on which the object is mounted is driven, using the movable body drive method according to claim 7.

14. The movable body drive method according to claim 7, wherein the plurality of encoder heads are positioned above the movable body.

* * * * *